(12) United States Patent
Huang et al.

(10) Patent No.: US 10,707,333 B2
(45) Date of Patent: Jul. 7, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Yao-Sheng Huang, Kaohsiung (TW); Hung-Chang Sun, Kaohsiung (TW); I-Ming Chang, Hsinchu (TW); Zi-Wei Fang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/191,244

(22) Filed: Nov. 14, 2018

(65) Prior Publication Data
US 2020/0035811 A1 Jan. 30, 2020

Related U.S. Application Data

(60) Provisional application No. 62/711,636, filed on Jul. 30, 2018.

(51) Int. Cl.
*H01L 29/66* (2006.01)
*H01L 21/02* (2006.01)
*H01L 29/78* (2006.01)
*H01L 29/08* (2006.01)
*H01L 21/311* (2006.01)
*H01L 21/306* (2006.01)

(52) U.S. Cl.
CPC .... *H01L 29/66795* (2013.01); *H01L 21/0262* (2013.01); *H01L 21/02488* (2013.01); *H01L 21/02513* (2013.01); *H01L 21/02532* (2013.01); *H01L 21/02592* (2013.01); *H01L 21/02598* (2013.01); *H01L 21/02639* (2013.01); *H01L 21/02661* (2013.01); *H01L 21/02675* (2013.01); *H01L 21/31116* (2013.01); *H01L 29/0847* (2013.01); *H01L 29/66545* (2013.01); *H01L 29/785* (2013.01); *H01L 21/02576* (2013.01); *H01L 21/02579* (2013.01); *H01L 21/30604* (2013.01)

(58) Field of Classification Search
CPC ......... H01L 29/66795; H01L 29/66545; H01L 29/785; H01L 29/78642; H01L 29/7926; H01L 27/0886; H01L 27/0924; H01L 21/823431; H01L 21/823487; H01L 21/823821; H01L 21/823885
See application file for complete search history.

(56) References Cited

U.S. PATENT DOCUMENTS 8,962,400 B2 2/2015 Tsai et al.
9,093,514 B2 7/2015 Tsai et al.
(Continued)

*Primary Examiner* — Hsien Ming Lee
(74) *Attorney, Agent, or Firm* — Maschoff Brennan

(57) ABSTRACT

A method includes following steps. A dummy gate structure is formed across a first portion of a semiconductor fin. A doped semiconductor layer is formed across a second portion of the semiconductor fin. A dielectric layer is formed across the doped semiconductor layer. An interface between the dielectric layer and the doped semiconductor layer substantially conforms to a profile of a combination of a top surface and sidewalls of the semiconductor fin. The dummy gate structure is replaced with a metal gate structure.

20 Claims, 60 Drawing Sheets

(56) References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 9,960,273 B2 * | 5/2018 | Ching | H01L 29/0649 |
| 2015/0228654 A1 * | 8/2015 | Khakifirooz | H01L 21/845 |
| | | | 257/369 |
| 2015/0332964 A1 * | 11/2015 | Cheng | H01L 29/785 |
| | | | 257/288 |
| 2016/0104706 A1 * | 4/2016 | Xu | H01L 29/66795 |
| | | | 257/192 |

\* cited by examiner

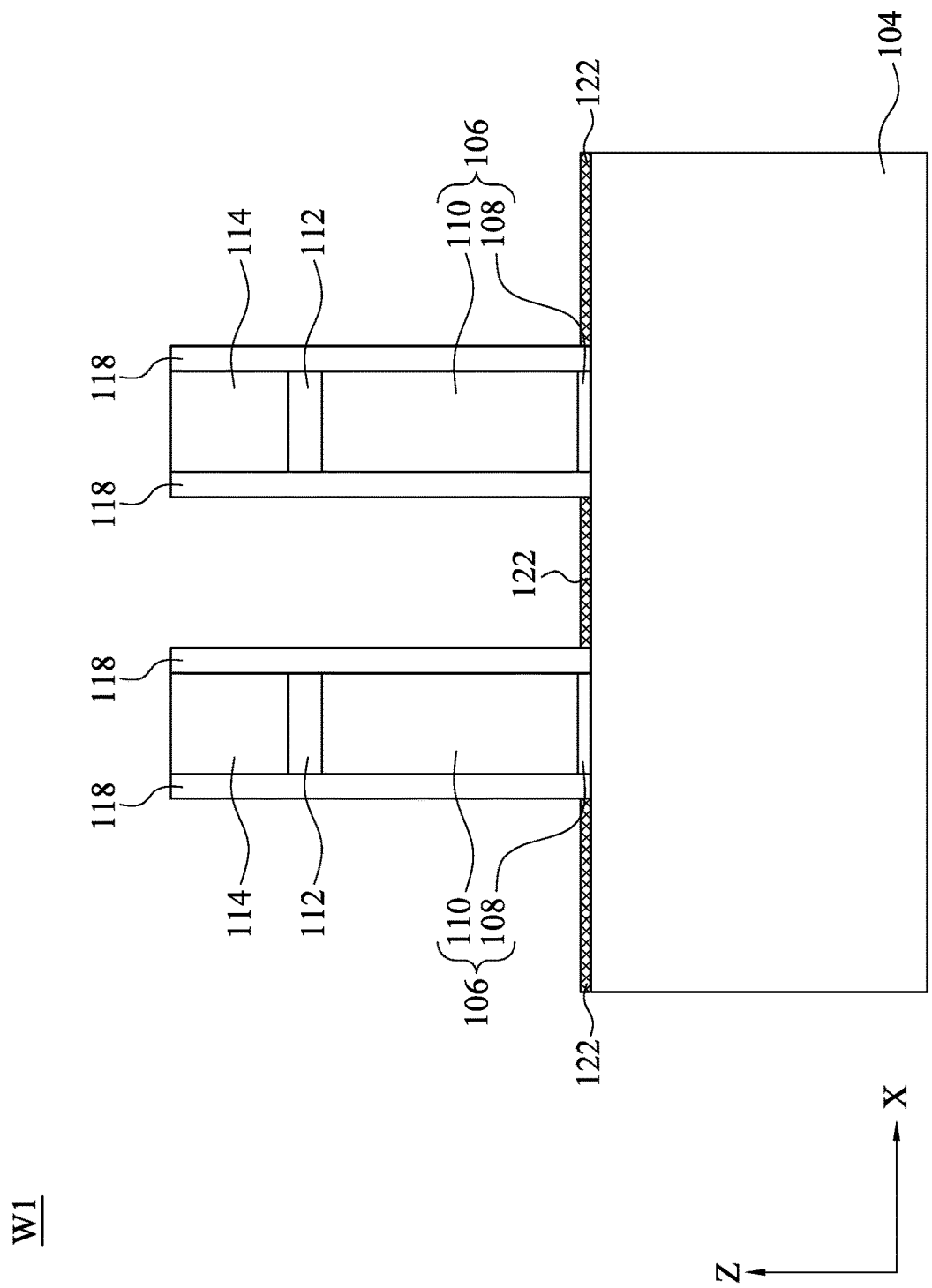

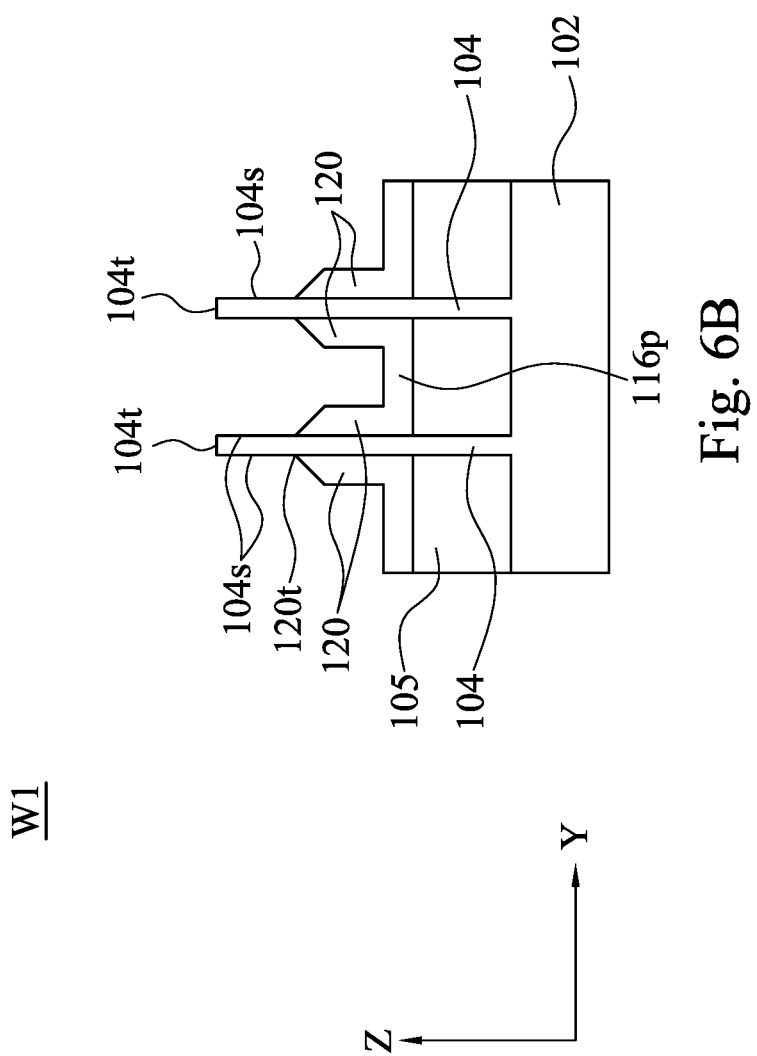

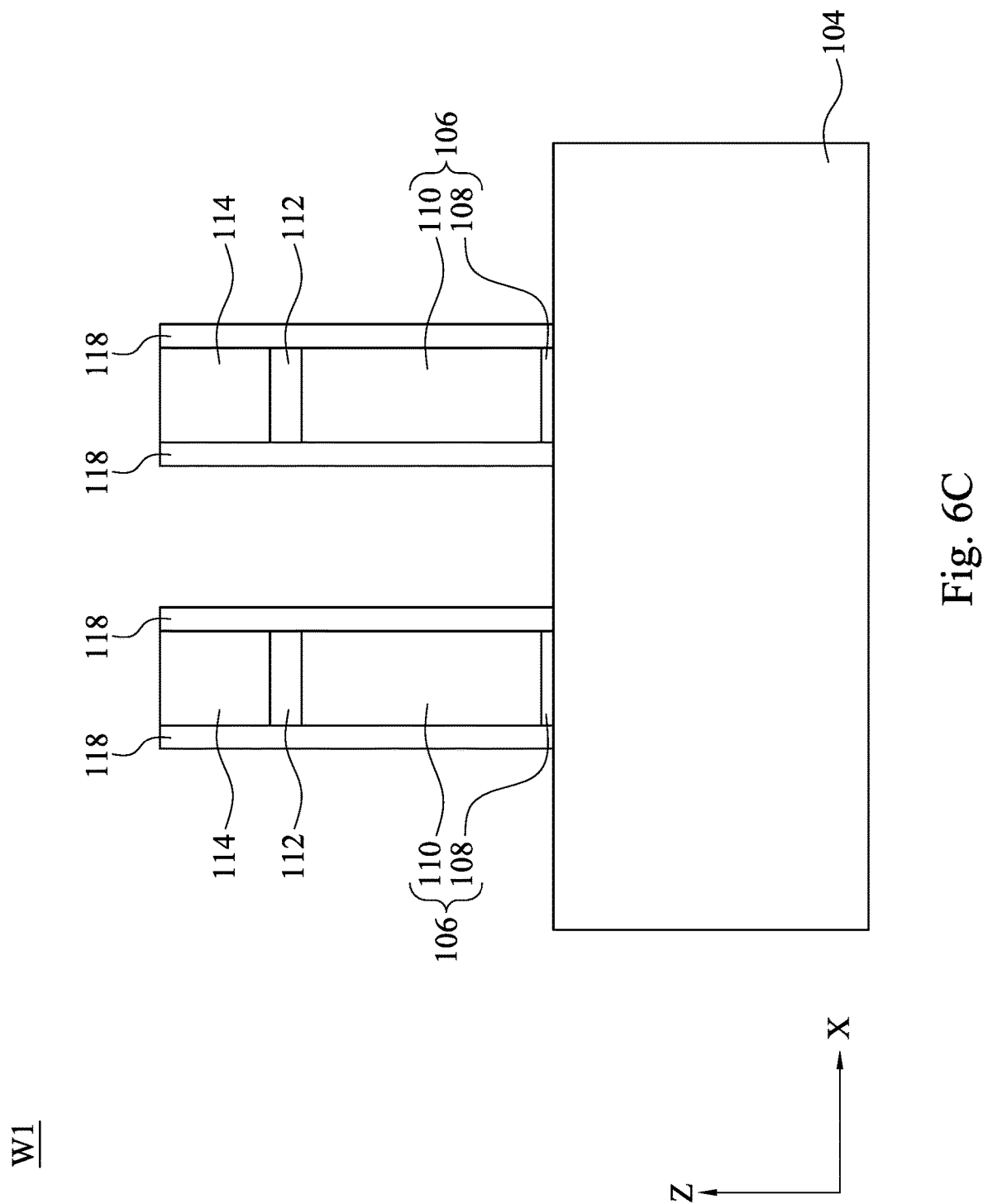

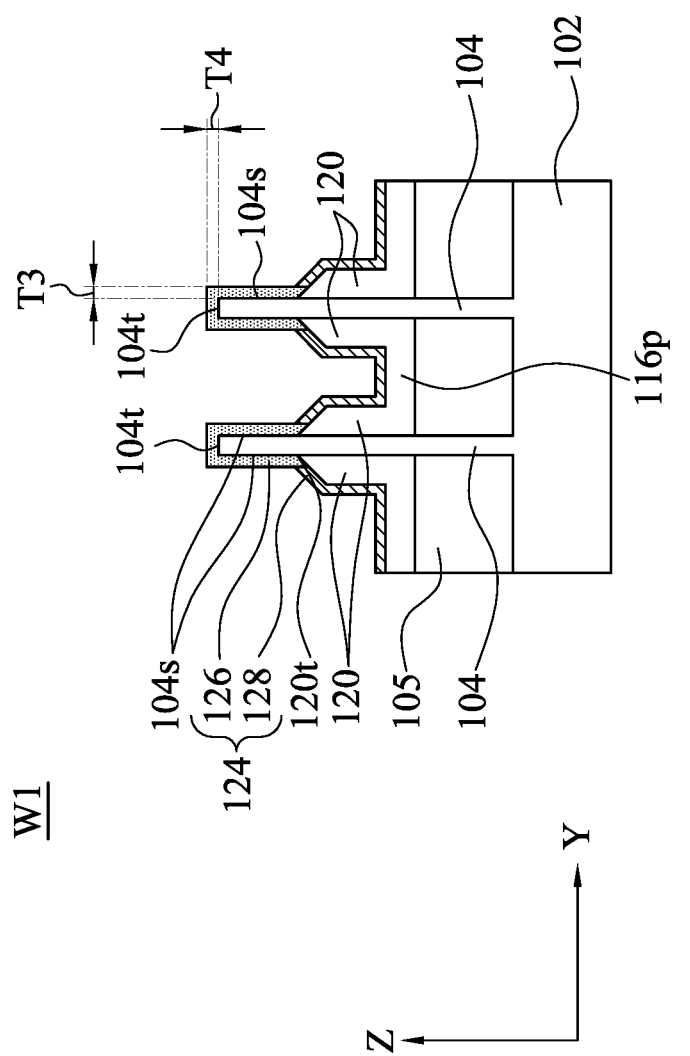

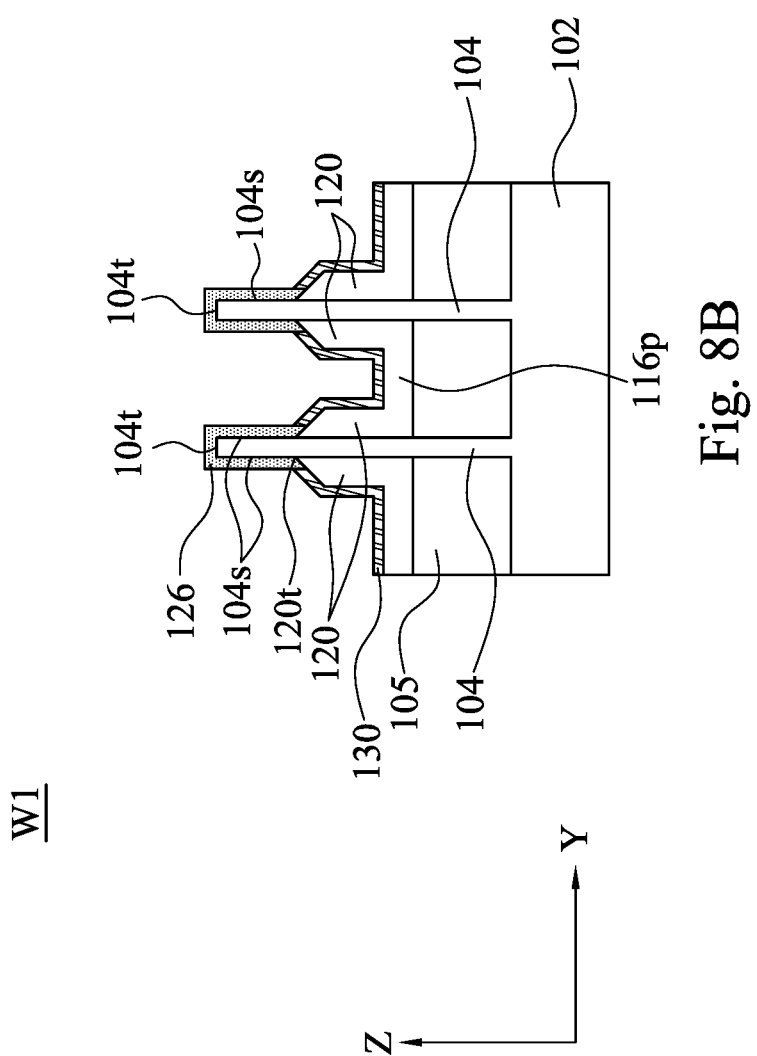

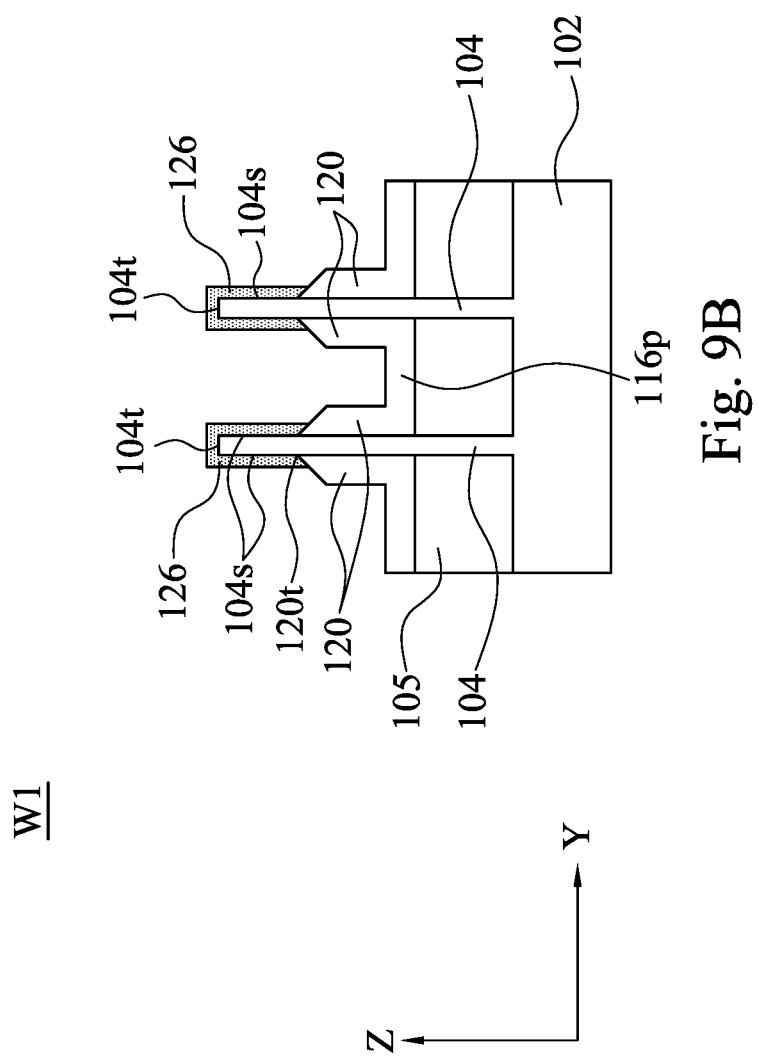

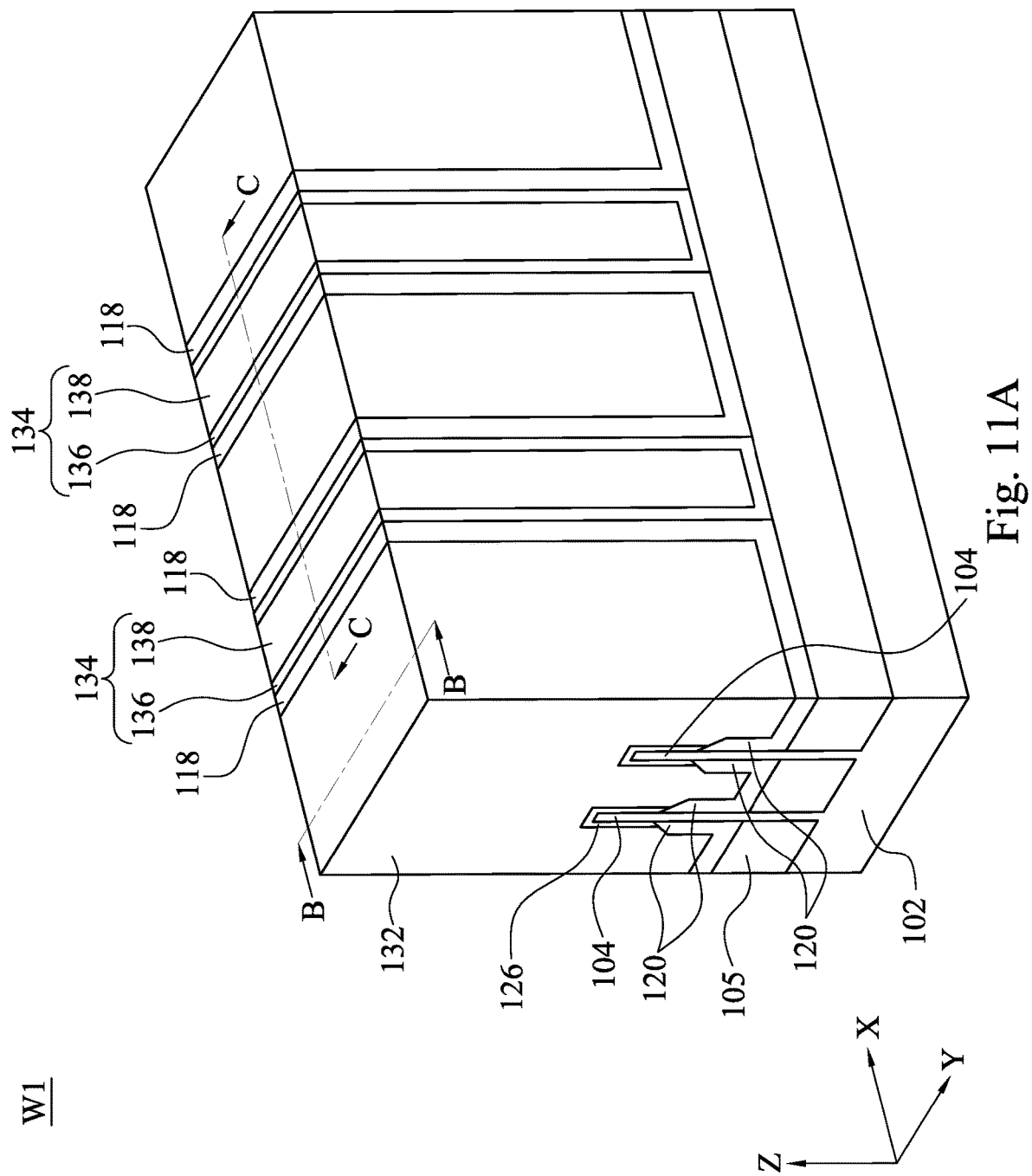

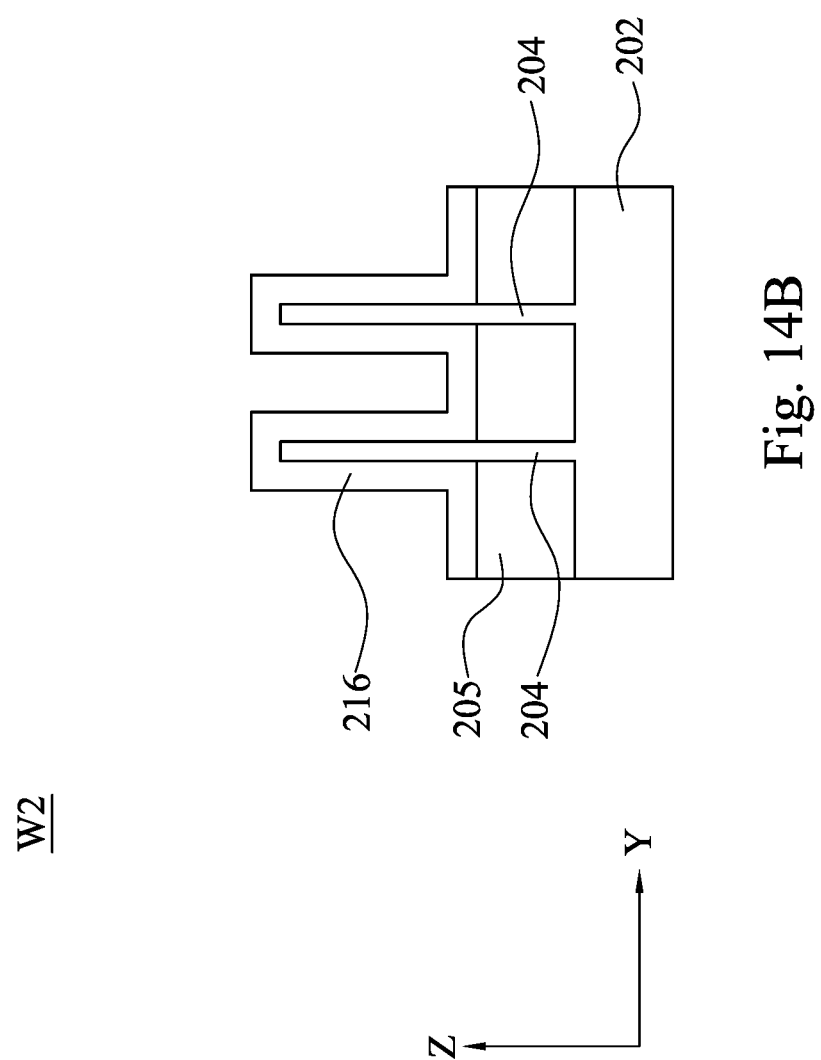

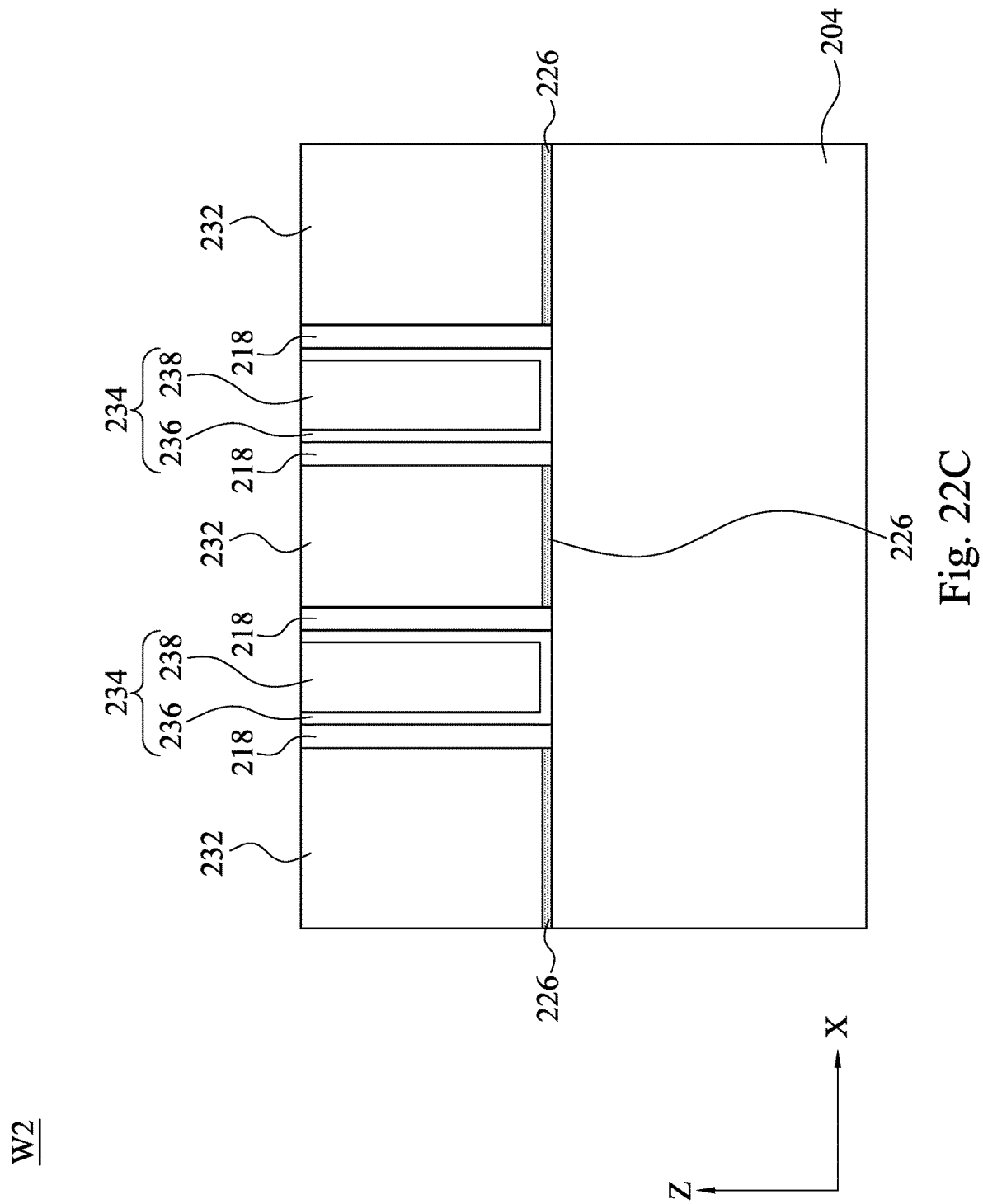

SEMICONDUCTOR DEVICE AND MANUFACTURING METHOD THEREOF

PRIORITY CLAIM AND CROSS-REFERENCE

This application claims priority to U.S. Provisional Application Ser. No. 62/711,636, filed Jul. 30, 2018, which is herein incorporated by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 3A, 4A, 5A, 6A, 7A, 8A, 9A, 10A, and 11A illustrate a perspective view of a semiconductor device at various stages of the method of FIG. 1 in accordance with some embodiments of the present disclosure.

FIGS. 2B, 3B, 4B, 5B, 6B, 7B, 8B, 9B, 10B, and 11B illustrate a cross-sectional view of a semiconductor device at various stages of the method of FIG. 1 in accordance with some embodiments of the present disclosure.

FIGS. 2C, 3C, 4C, 5C, 6C, 7C, 8C, 9C, 10C, and 11C illustrate another cross-sectional view of a semiconductor device at various stages of the method of FIG. 1 in accordance with some embodiments of the present disclosure.

FIGS. 14B, 15B, 16B, 17B, 18B, 19B, 20B, 21B, and 22B illustrate a cross-sectional view of a semiconductor device at various stages of the method of FIG. 13 in accordance with some embodiments of the present disclosure.

FIGS. 14C, 15C, 16C, 17C, 18C, 19C, 20C, 21C, and 22C illustrate a cross-sectional view of a semiconductor device at various stages of the method of FIG. 13 in accordance with some embodiments of the present disclosure.

DETAILED DESCRIPTION

Figure 1:
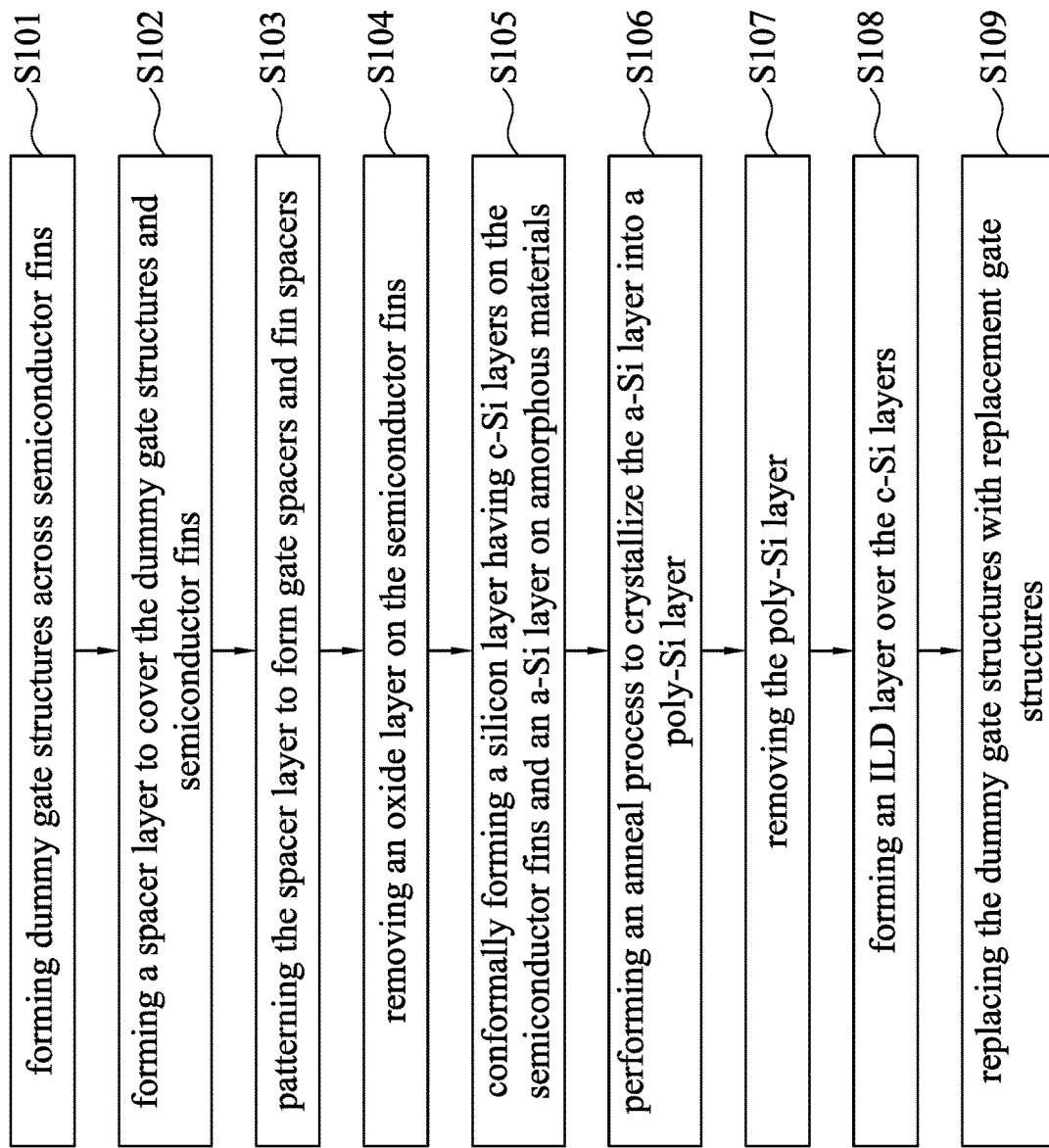
FIG. 1 is a flow chart of a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed embodiments relate to methods and structures of forming source/drain structures conformal to an underlying semiconductor substrate for fin field-effect transistors (FinFETs). The embodiments such as those disclosed herein are generally applicable not only to FinFETs but also to a double-gate, surround-gate, omega-gate or gate-all-around transistor, a 2-dimensional FET and/or a nanowire transistor, or any suitable device having source/drain regions.

Fins of the FinFETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Illustrated in FIG. 1 is a method of forming a semiconductor device in accordance with some embodiments of the present disclosure. FIGS. 2A-11C illustrate various processes at various stages of the method of FIG. 1 in accordance with some embodiments of the present disclosure. Throughout the various views and illustrative embodiments, like reference numbers are used to designate like elements. In FIGS. 2A-11C, the "A" figures (e.g., FIGS. 2A, 3A, etc.) illustrate a perspective view, the "B" figures (e.g., FIGS. 2B, 3B, etc.) illustrates a cross-sectional view along Y direction corresponding to lines B-B illustrated the "A" figures, and the "C" figures (e.g., FIG. 2C, 3C, etc.) illustrate a cross-sectional view along the X direction corresponding to lines C-C illustrated in in the "A" figures. It is understood that additional operations can be provided before, during, and after the processes shown by FIGS. 2A-11C, and some of the operations described below can be replaced or eliminated, for additional embodiments of the method. The order of the operations/processes may be interchangeable.

Figure 2A:
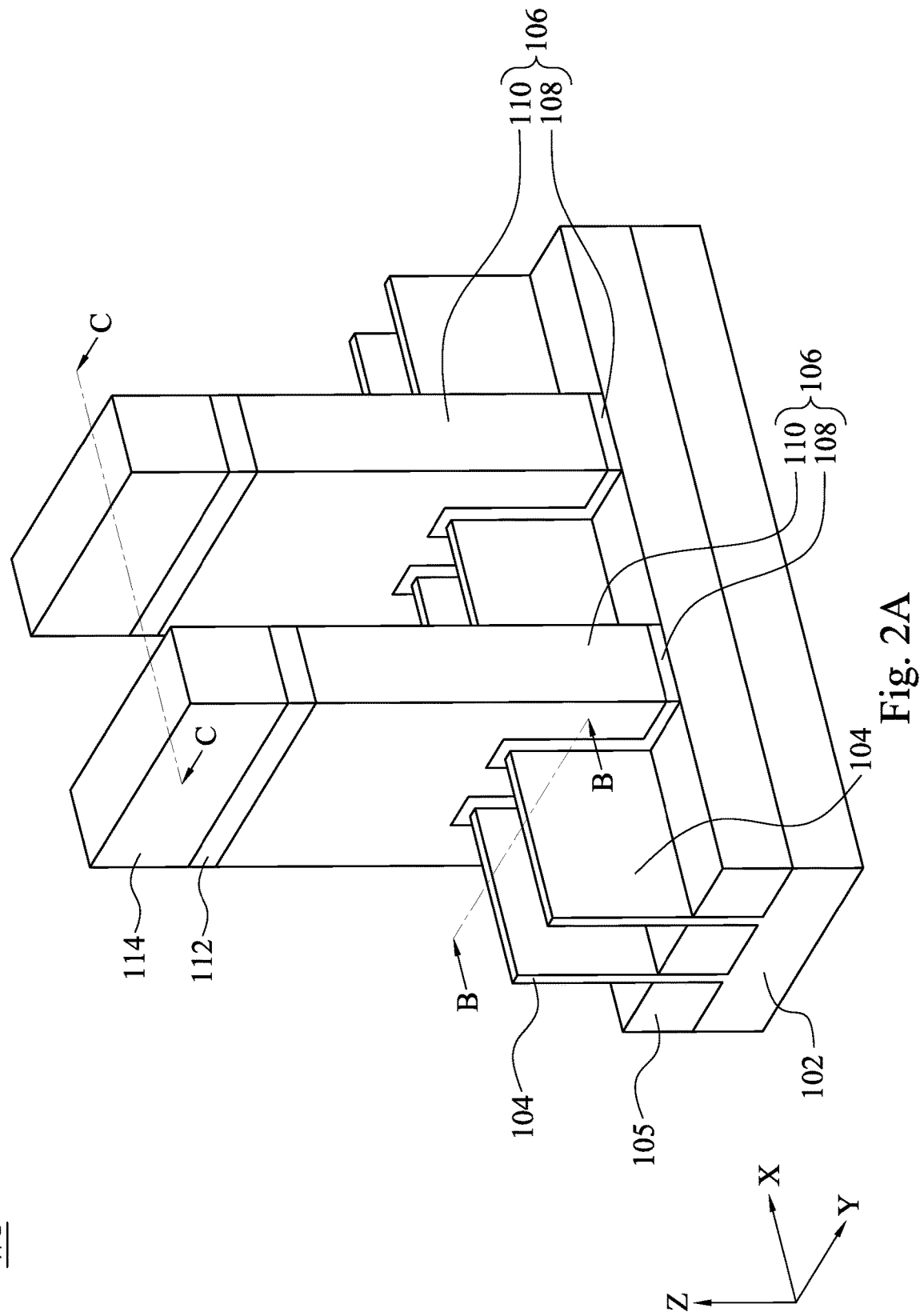
Figure 2B:
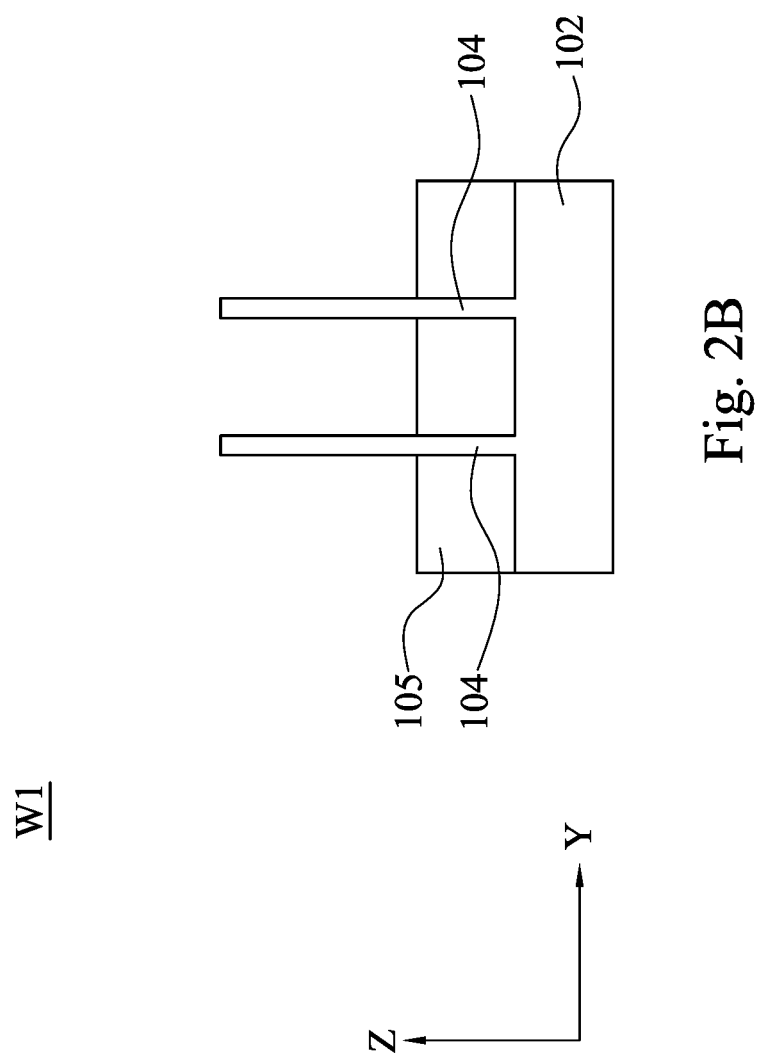
Figure 2C:
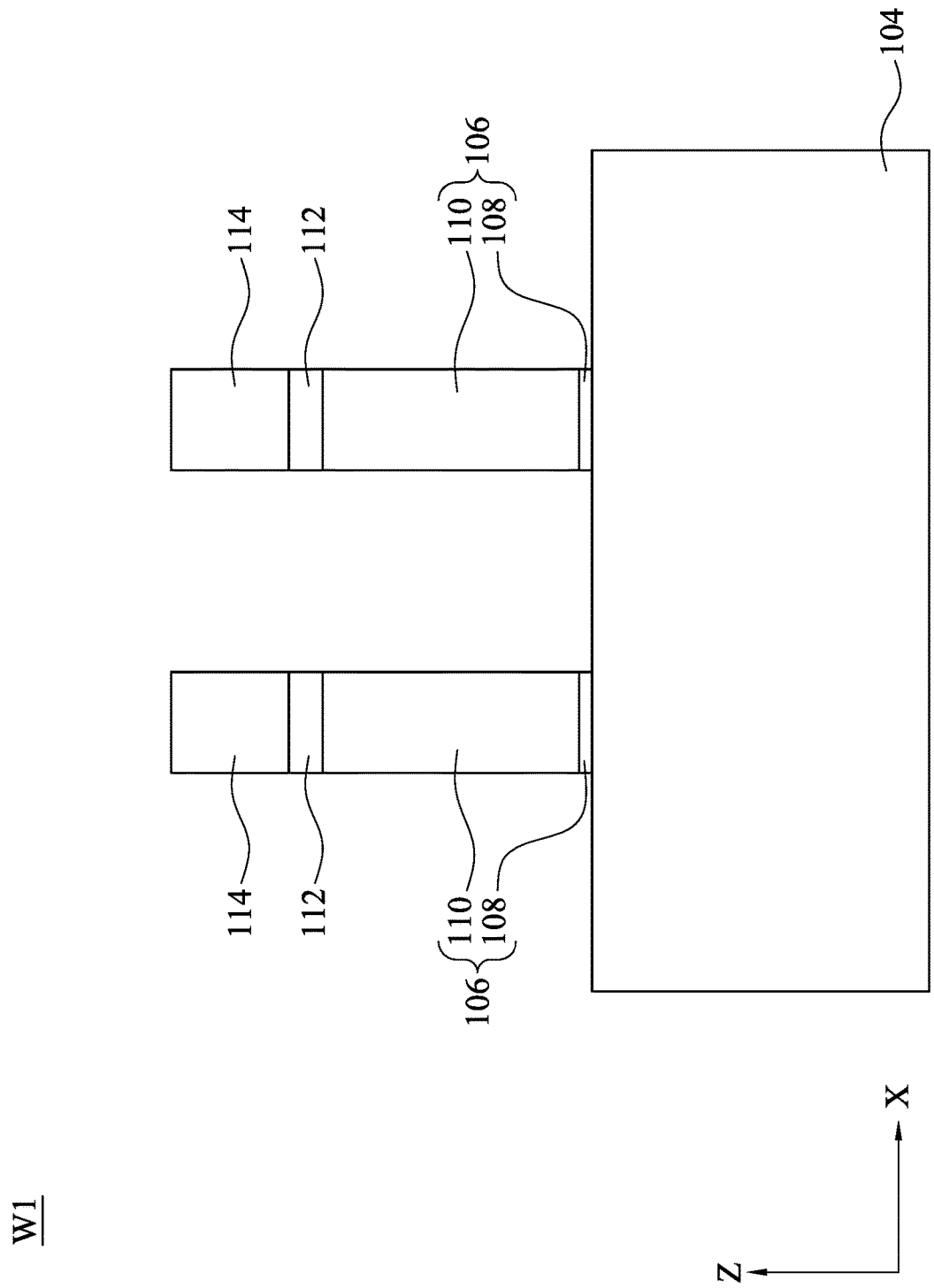

In operation S101 of FIG. 1, dummy gate structures are formed across semiconductor fins, as shown in FIGS. 2A-2C. For example, there is shown a semiconductor wafer W1 having a substrate 102 formed with one or more semiconductor fins 104. It is understood that two semiconductor fins are illustrated for purposes of illustration, but other embodiments may include any number of semiconductor fins. In some embodiments, one or more dummy semiconductor fins are formed adjacent to the semiconductor fin for an active FinFET. The semiconductor fins 104 extend in the X direction and protrude from the substrate in the Z direction, while the dummy gate structures 106 extend in the Y direction.

The substrate 102 may comprise various doped regions. In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 102 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 102 may include an epitaxial layer (epi-layer), which may be strained for performance enhancement, and/or may include a silicon-on-insulator (SOI) structure.

The semiconductor fins 104 may be formed using, for example, a patterning process to form trenches such that a trench is formed between adjacent semiconductor fins 104. As discussed in greater detail below, the semiconductor fins 104 will be used to form FinFETs.

Isolation regions, such as shallow trench isolations (STI) 105, are disposed in the trenches over the substrate 102. The isolation region can be equivalently referred to as an isolation insulating layer in some embodiments. The isolation insulating layer 105 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 105 is formed through a process such as CVD, flowable CVD (FCVD), or a spin-on-glass process, although any acceptable process may be utilized. Subsequently, portions of the isolation insulating layer 105 extending over the top surfaces of the semiconductor fins 104, are removed using, for example, an etch back process, chemical mechanical polishing (CMP), or the like.

In some embodiments, the isolation insulating layer 105 is recessed to expose an upper portion of the semiconductor fin 104 as illustrated in FIGS. 2A-2C. In some embodiments, the isolation insulating layer 105 is recessed using a single etch processes, or multiple etch processes. In some embodiments in which the isolation insulating layer 105 is made of silicon oxide, the etch process may be, for example, a dry etch, a chemical etch, or a wet cleaning process. For example, the chemical etch may employ fluorine-containing chemical such as dilute hydrofluoric (dHF) acid.

After the semiconductor fins 104 are formed, dummy gate structures 106 each including a gate dielectric layer 108 and a dummy gate electrode 110 are formed over the exposed semiconductor fins 104. In some embodiments, the gate dielectric layer 108 and the dummy gate electrode 110 are formed by depositing and patterning a gate dielectric layer formed over the exposed semiconductor fins 104 and a dummy gate electrode layer over the gate dielectric layer. The gate dielectric layer may be formed by thermal oxidation, CVD, sputtering, or other suitable techniques. In some embodiments, the gate dielectric layer 108 may be made of one or more suitable dielectric materials such as silicon oxide, silicon nitride, SiCN, SiON, and SiN, the like, or a combination thereof.

In some embodiments, the dummy gate electrode 110 is a conductive material and may be selected from a group comprising amorphous silicon, poly silicon, amorphous germanium, poly germanium, amorphous silicon-germanium, poly silicon-germanium, metallic nitrides, metallic silicides, metallic oxides, and metals. The dummy gate electrode 110 may be deposited by PVD, CVD, sputter deposition, or the like. Other materials, conductive and non-conductive, may be used. In certain embodiments, poly-Si is used.

A mask pattern may be formed over the dummy gate electrode layer to aid in the patterning. In some embodiments, a hard mask pattern including a first mask layer 112 and a second mask layer 114 is formed over a blanket layer of polysilicon. The hard mask pattern is made of one or more layers of $SiO_2$, SiCN, SiON, $Al_2O_3$, SiN, or other suitable materials. In certain embodiments, the first mask layer 112 includes silicon nitride (SiN) and the second mask layer 114 includes silicon oxide. By using the mask pattern as an etching mask, the dummy electrode layer is patterned into the dummy gate electrodes 110. In some embodiments, the dummy dielectric layer is also patterned to define the gate dielectric layers 108.

Figure 3A:
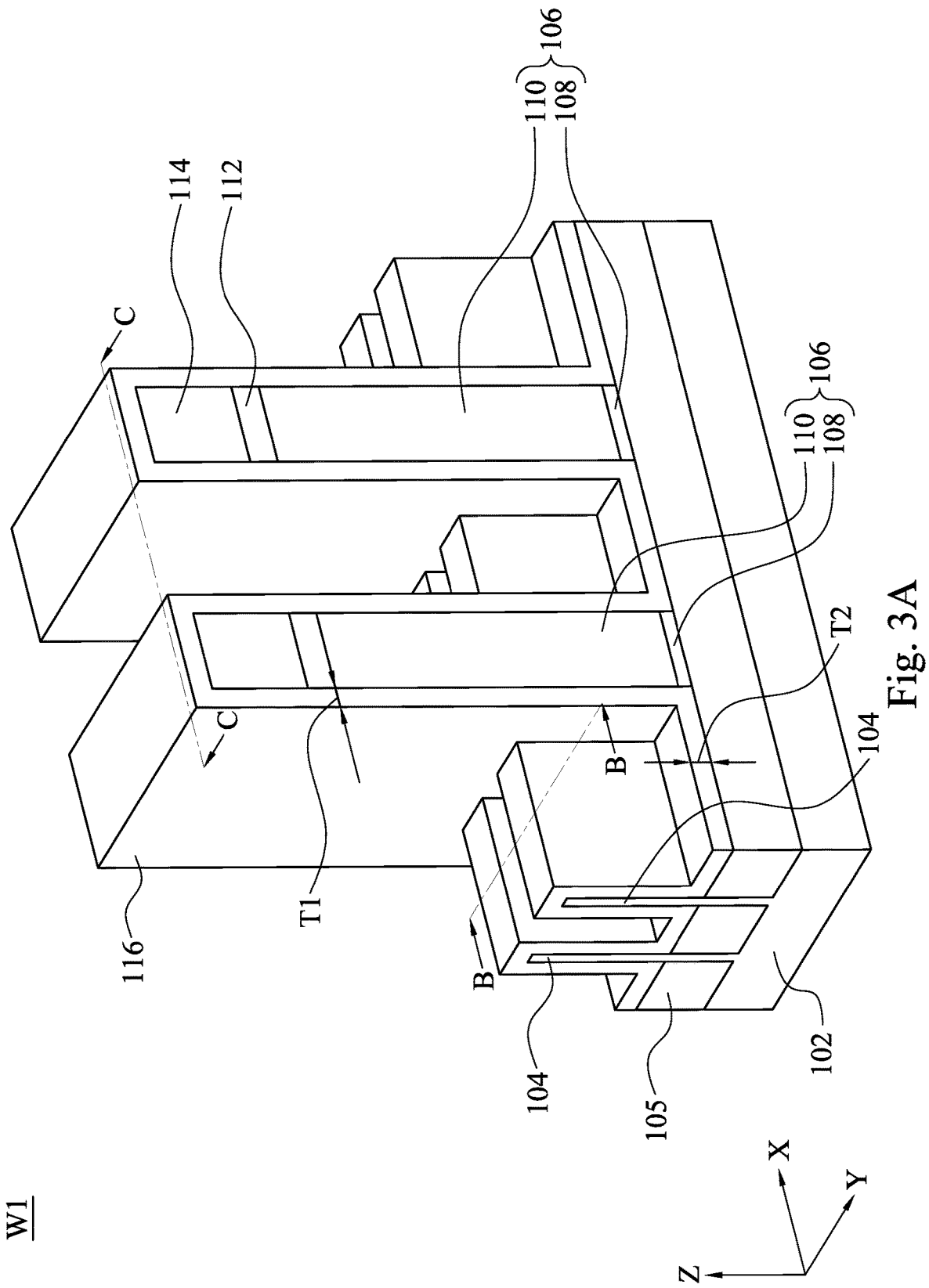
Figure 3B:
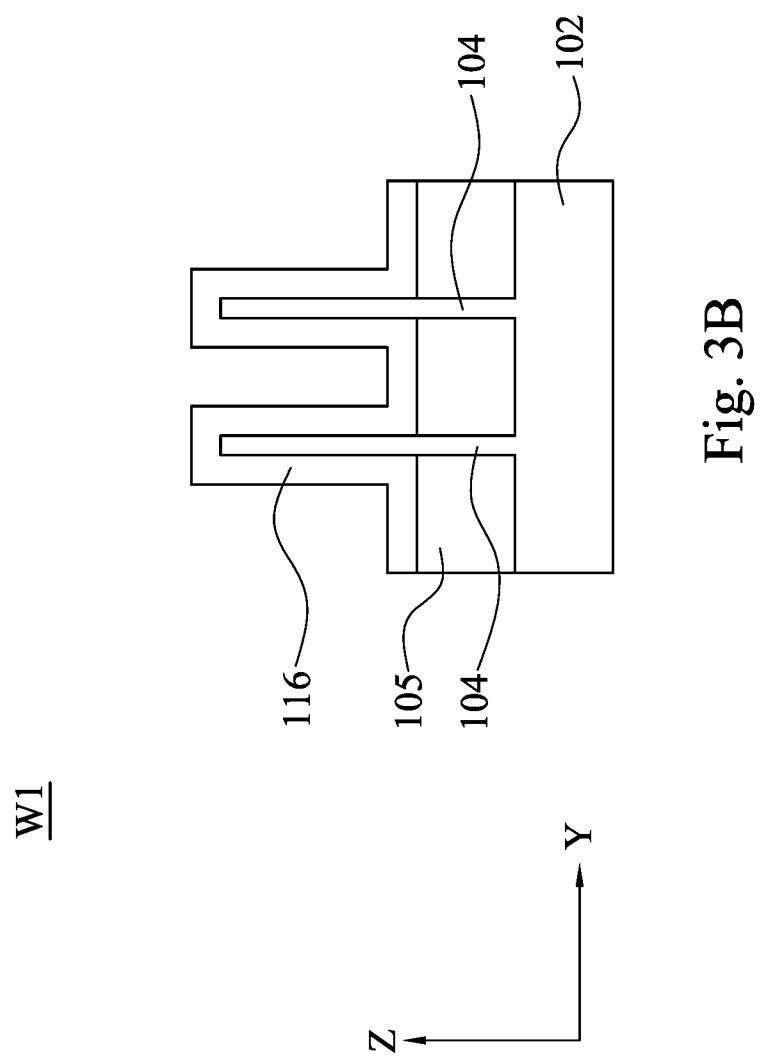
Figure 3C:
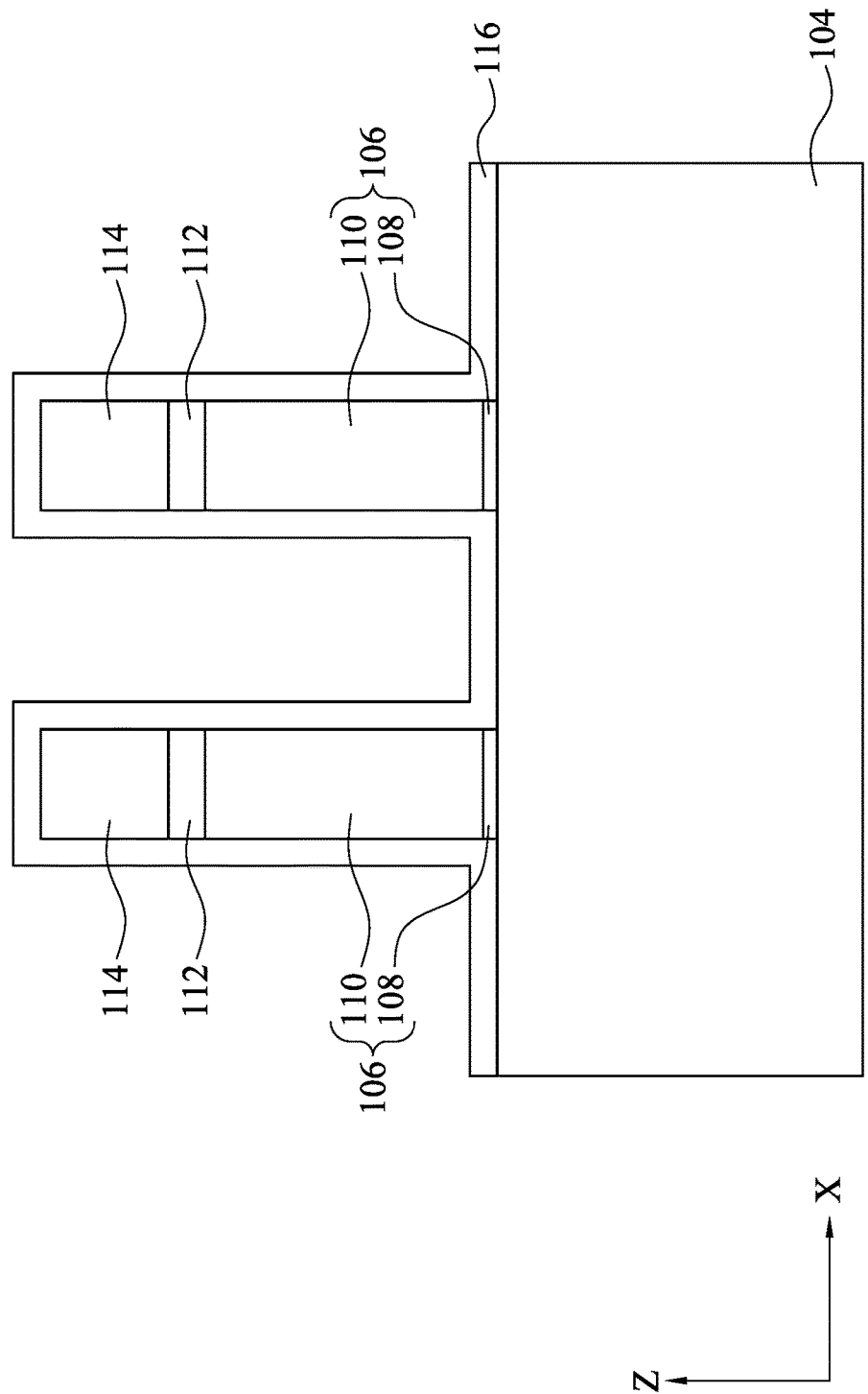

In operation S102 of FIG. 1, a spacer layer 116 is formed as a blanket layer to cover the structure shown in FIGS. 2A-2C. The resulting structure is illustrated in FIGS. 3A-3C. In some embodiments, the spacer layer 116 is formed of silicon nitride, and may have a single-layer structure. In alternative embodiments, the spacer layer 116 is a composite layer including a plurality of layers. For example, the spacer layer 116 may include a silicon oxide layer, and a silicon nitride layer over the silicon oxide layer. The spacer layer 116 may be formed as a substantially conformal layer, and hence a thickness T1 of the vertical portions of the spacer layer 116 on sidewalls of the semiconductor fins 104 and the dummy gate structure 106 is close to a thickness T2 of the horizontal portion of the spacer layer 116. For example, thicknesses T1 and T2 may have a difference smaller than about 20 percent of thickness T2.

Figure 4A:
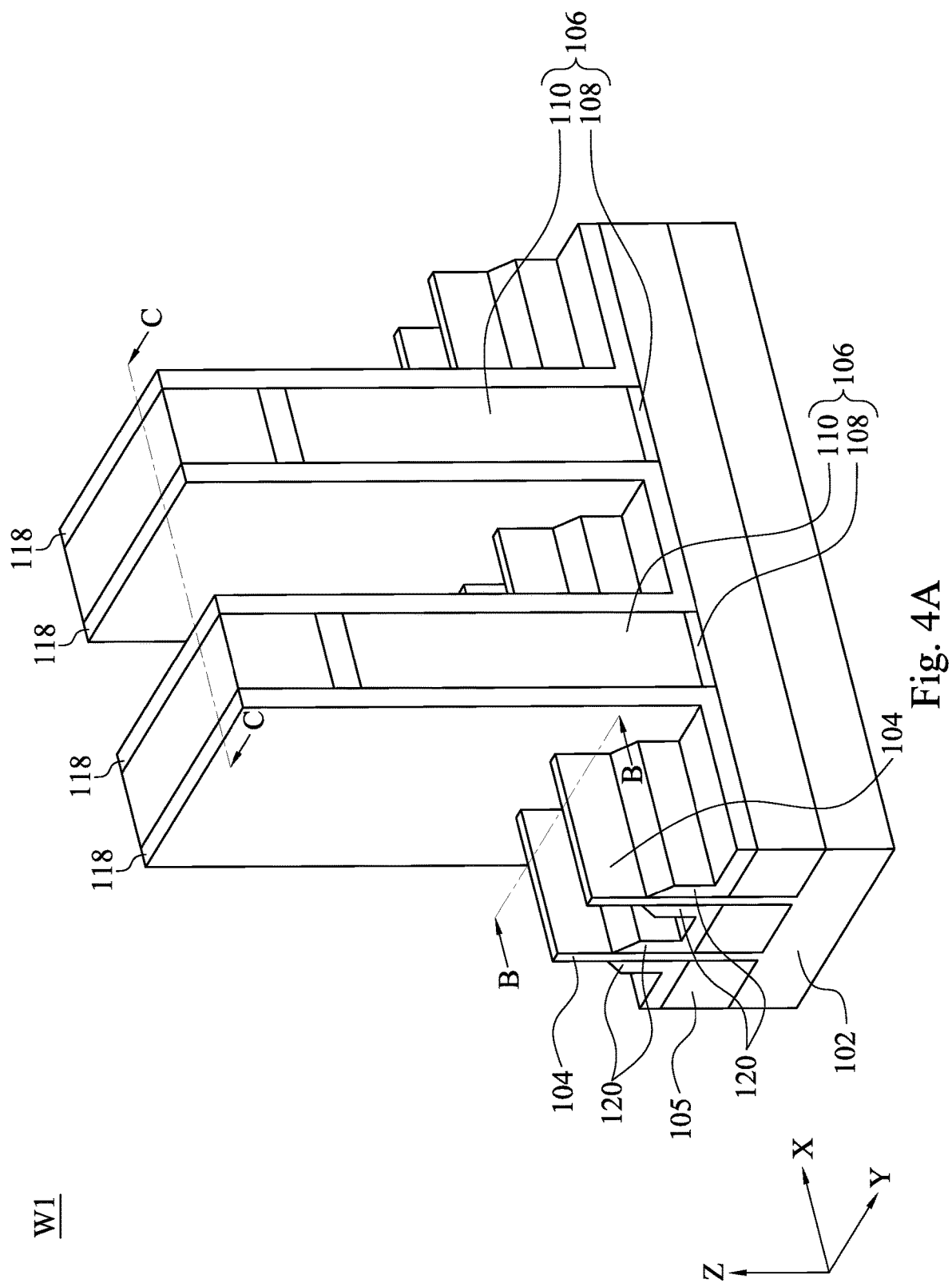
Figure 4B:
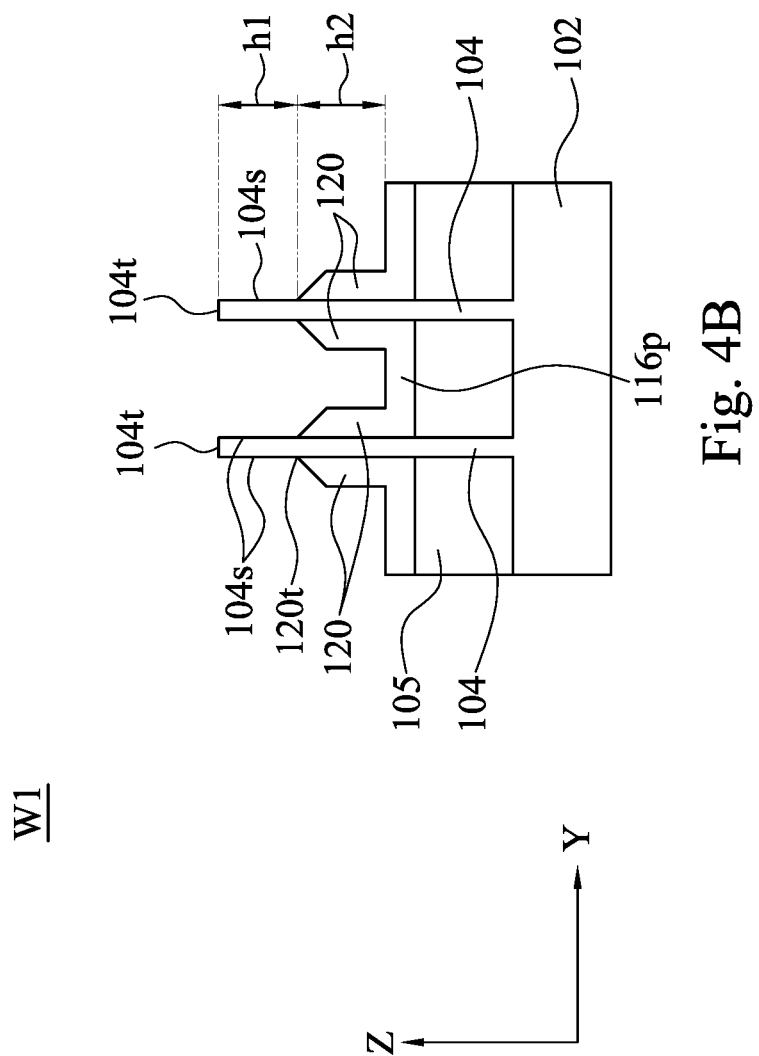
Figure 4C:
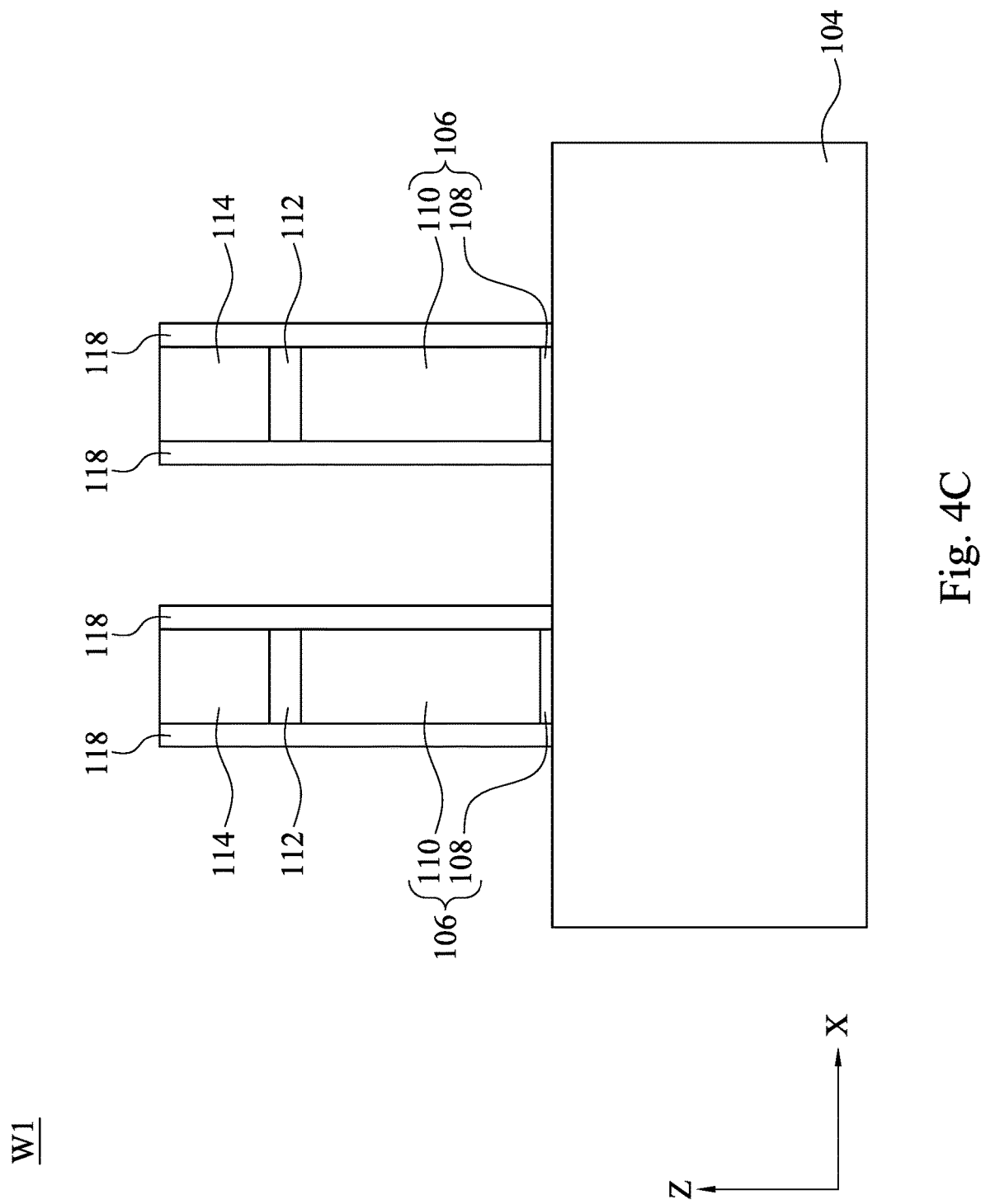

Next, in operation S103 of FIG. 1, the spacer layer 116 is patterned, forming gate spacers 118 and fin spacers 120, as shown in FIGS. 4A-4C. In some embodiments in which the spacer layer 116 (FIGS. 3A-3C) includes silicon nitride, the patterning of the silicon nitride layer includes a dry etching using $CH_2F_2$ as an etchant. In other embodiments in which the spacer layer 116 (FIGS. 3A-3C) includes a silicon oxide layer and a silicon nitride layer, the patterning of the spacer layer 116 includes a dry etching using $CH_2F_2$ as an etchant to pattern silicon nitride, followed by a dry etching using $CF_4$ as an etchant to pattern the silicon oxide layer. The patterning includes an anisotropic effect, so that the horizontal portions of the spacer layer 116 are removed, while the vertical portions on the sidewalls of the dummy gate structures 106 remain to form gate spacers 118. The vertical portions of the spacer layer 116 on the sidewalls of semiconductor fins 104 remain to form fin spacers 120.

The process conditions for patterning the spacer layer 116 are controlled, so that top ends 120*t* of the fin spacers 120 are lower than top surfaces 104*t* of semiconductor fins 104. In this way, the top surfaces 104*t* and upper portions of sidewalls 104*s* of the semiconductor fins 104 are exposed. In some embodiments, a height h1 of the exposed sidewall 104*s* is in a range from about 10 nm to about 60 nm. If the height h1 of the exposed sidewall 104*s* is greater than about 60 nm, the fins 104 might suffer from unwanted damages due to the pattering process of the spacer layer 116. If the height h1 of the exposed sidewall 104*s* is less than about 10 nm, a size of subsequently formed source/drain region might be unsatisfactory. In some embodiments, a height h2 of the resulting fin spacer 120 is in a range from about 10 nm to about 60 nm. If the height h2 of the fin spacer 120 is greater than about 60 nm, a size of subsequently formed source/drain region might be unsatisfactory. If the height h2 of the fin spacer 120 is less than about 10 nm, the fins 104 might suffer from unwanted damages due to the pattering process of the spacer layer 116. A portion 116*p* of the spacer layer 116 may remain on the isolation insulating layer 105 and connects neighboring fin spacers 120. The resulting fin spacers 120 and remaining portion 116*p* of the spacer layer 116 between two neighboring semiconductor fins 104 may resemble a U-shape or a dishing-shape in the cross-sectional view as illustrated in FIG. 4B.

Figure 5A:
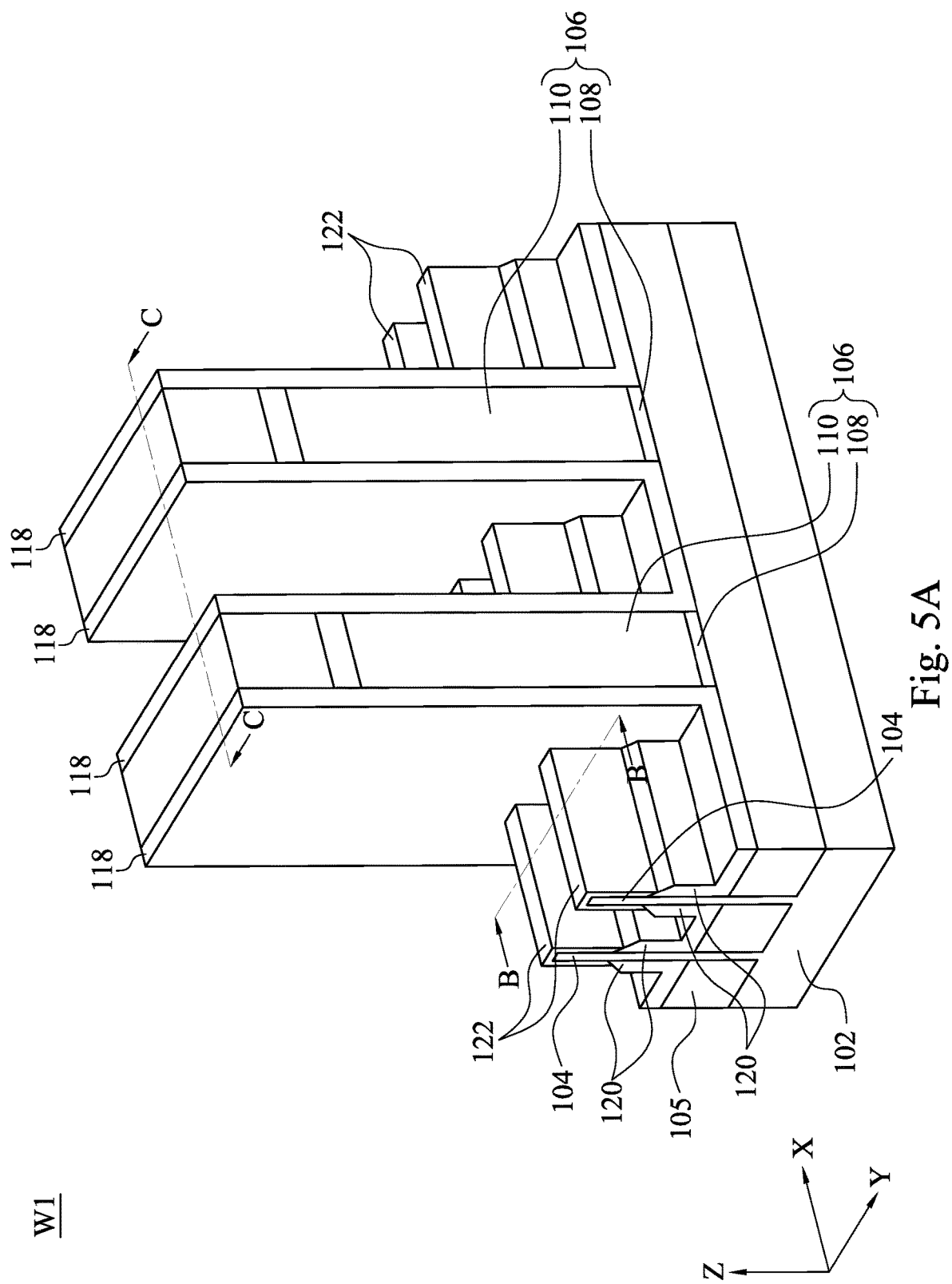
Figure 5B:
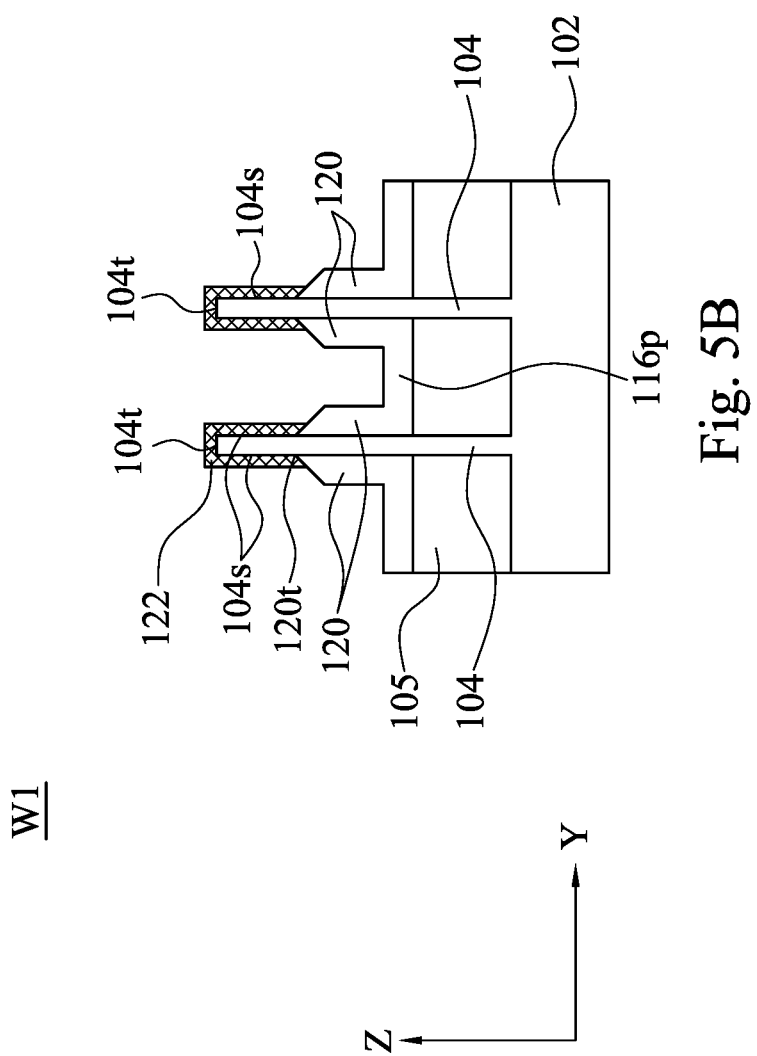

Patterning the spacer layer 116 is performed in a process chamber that may be substantially free of air. However, air, particularly, oxygen, may still exist in the process chamber. Due to the active nature of semiconductor materials (e.g., the semiconductor fins 104), an oxide layer 122 may be naturally formed on the exposed top surfaces 104*t* and sidewalls 104*s* of the semiconductor fins 104, as illustrated in FIGS. 5A-5C. The naturally formed oxide layer 122 may be equivalently referred to as a native oxide layer. The oxide layer 122 is an amorphous structure, which might frustrate formation of crystalline source/drain layers.

Figure 6A:
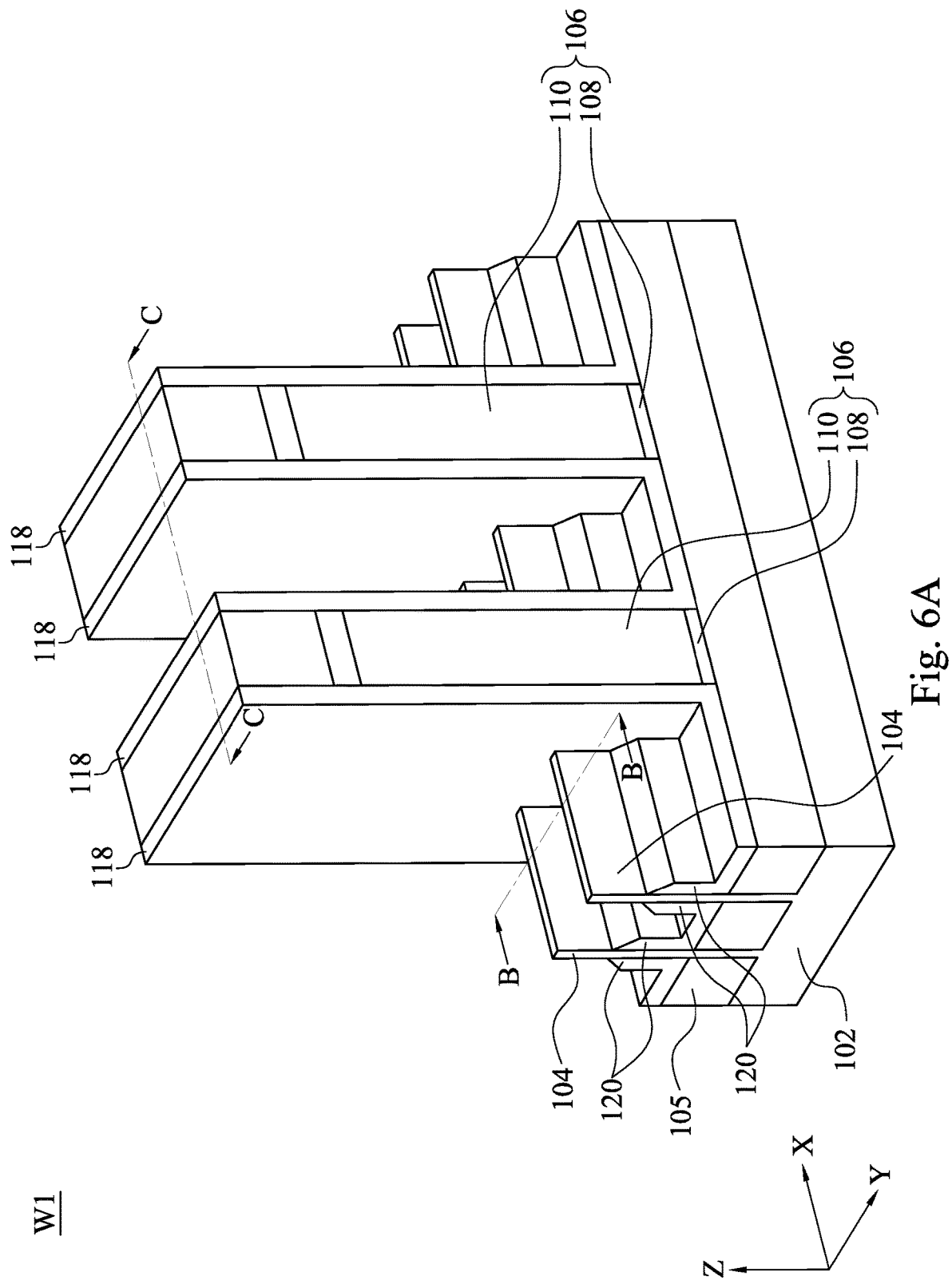
Figure 7A:
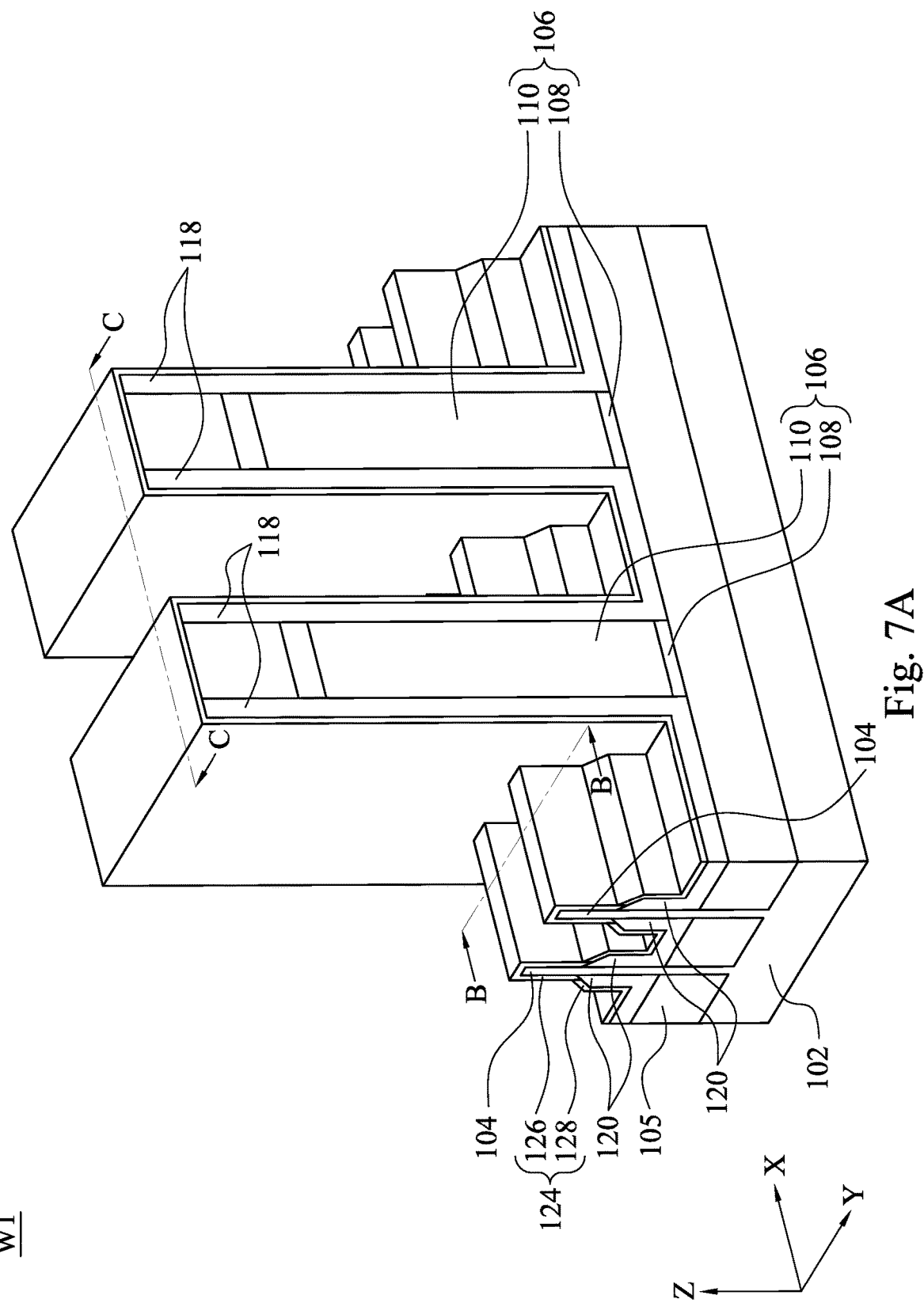
Figure 7C:
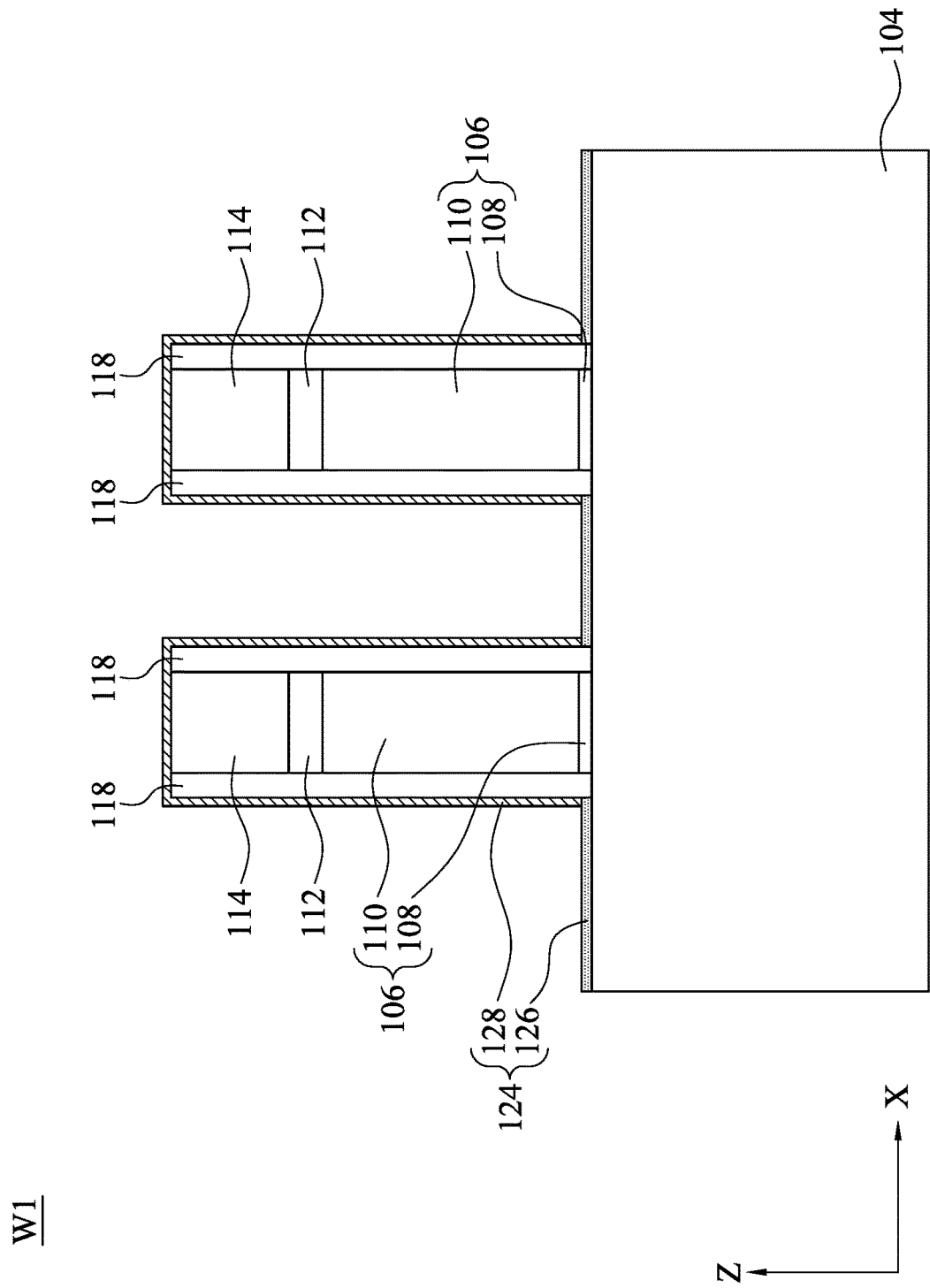

In operation S104 of FIG. 1, the oxide layer 122 is removed from the semiconductor fins 104, as illustrated in FIGS. 6A-6C. The removal of the oxide layer 122 is advantageous for subsequent formation of crystalline source/drain layers on the crystalline semiconductor fins 104. The oxide layer 122 may be removed using a suitable etching process, such as a selective etching process that is selective to the material of the oxide layer 122. For example, a chemical oxide removal (COR) using a Tokyo Electron CERTAS, an Applied Material SICONI tool and/or the like may be used. In some embodiments, the pressure of the COR process is in a range from about 200 millitorr to about 600 millitorr. If the pressure of the COR process is less than about 200 millitorr, the etching duration time might be unwantedly lengthy. If the pressure of the COR process is greater than about 600 millitorr, semiconductor fins 104 might suffer from unwanted damages. The etch gas includes $NH_3$ gas, HF gas, fluorine gas, the like, or combinations thereof. In some alternative embodiments, suitable wet etching processes such as dilute hydrofluoric (dHF) acid may be used.

In certain embodiments, the COR process is performed in a furnace that is used to deposit source/drain layers on the semiconductor fins 104 at a following step. In this way, the COR process and the following deposition of source/drain layers can be in-situ performed. Herein, the term "in-situ" means that the source/drain layers are deposited in the furnace where the oxide layer 122 is removed, without breaking vacuum. Moreover, the furnace offers an advantage of improved throughput, as several semiconductor wafers W1 may be processed substantially simultaneous, as discussed in further detail below.

Figure 12:
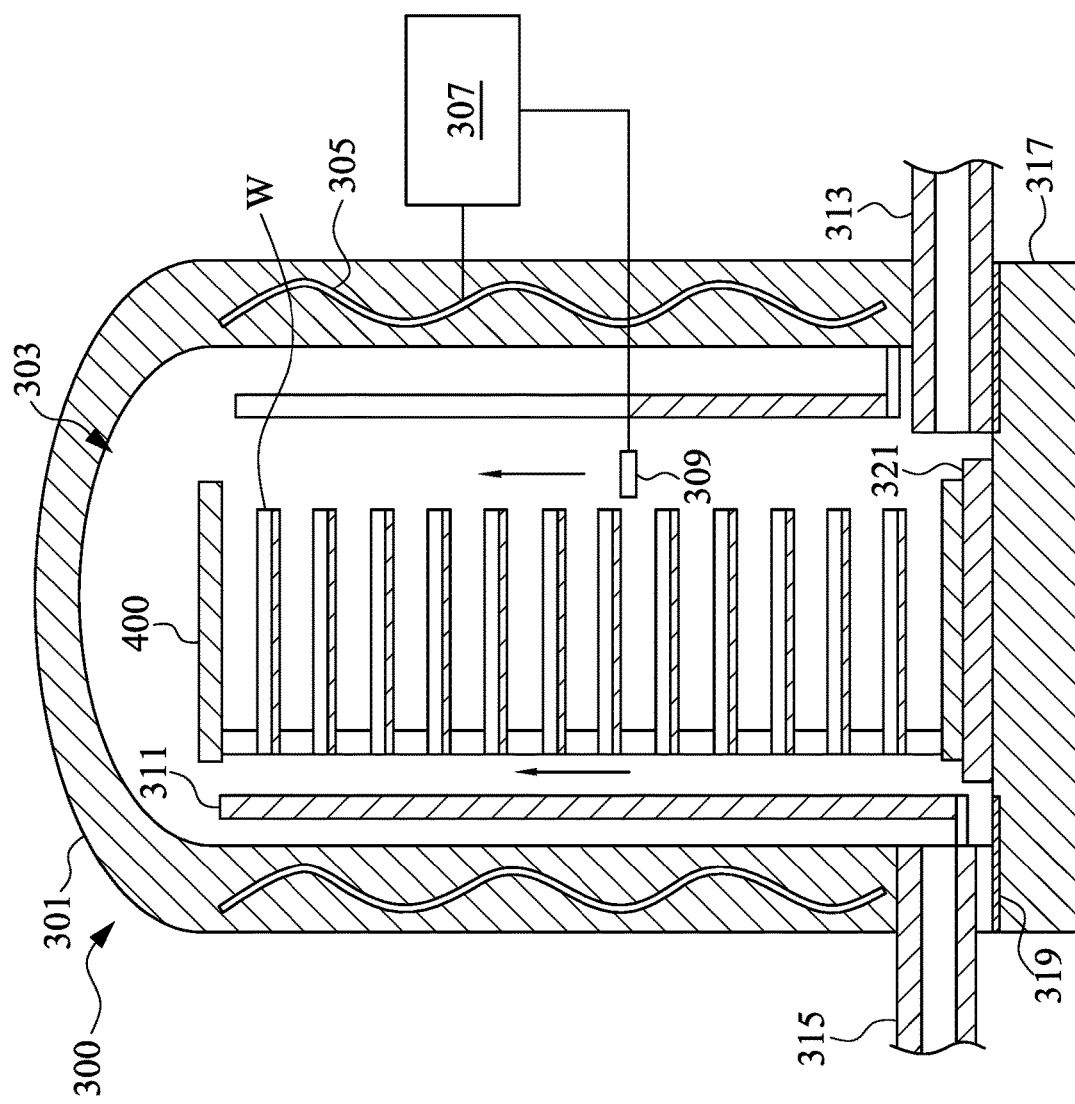
FIG. 12 illustrates a furnace in accordance with some embodiments of the present disclosure.

FIG. 12 illustrates an exemplary furnace 300 that may be utilized to in-situ perform the COR process and deposition of source/drain layers. The furnace 300 may comprise an external body 301 that encloses a central cavity 303. The external body 301 may be shaped as a cylinder with a closed upper end and an open lower end to allow for the introduction and removal of a wafer boat 400 into and out of the furnace 300. The external body 301 of the furnace 300 may be formed from a heat-resistant material such as quartz, silicon-carbide, mullite, combinations of these, or the like in order to retain and redirect thermal energy towards the central cavity 303.

Within the external body 301 a series of heaters 305 controlled by a controller 307 are located. The series of heaters 305 may be utilized to control the temperature within the central cavity 303 and to heat semiconductor wafers W (e.g., the semiconductor wafer W1 as illustrated in FIGS. 2A-11C) within the wafer boat 400 as they reside within the central cavity 303. In some embodiments, the heaters 305 may be resistive heaters, although any suitable type of heater, such as radiative heaters using steam, radiative heaters using a burning hydrocarbon, or any other suitable element for transferring heat, may alternatively be utilized.

The controller 307 may be, e.g., a computer with a processor, memory, and input/output ports utilized to run a control program to control the heat within the furnace 300. Additionally, the controller 307 may have one or more temperature sensors 309 in order to provide heating information to the controller 307. The temperature sensors 309 may be, e.g., a thermocouple installed within the central cavity 303 to monitor the temperature of the central cavity 303 and adjust the series of heaters 305 accordingly to obtain and maintain the desired annealing temperature. However, any suitable type of sensor may alternatively be utilized to measure the temperature of the central cavity 303 and transmit that measurement to the controller 307.

An inner tube 311 may be placed within the external body 301 and encircling the central cavity 303. The inner tube 311 may a material such as, e.g., quartz, silicon carbide, or mullite. The inner tube 311 may be cylindrical in shape and spaced apart from the external body 301 in order to provide a passage between the inner tube 311 and the external body 301 for process gases to flow.

An inlet 313 and an exit 315 may extend through the external body 301 to provide entrance and exit points for process gases to pass into and out of the central cavity 303. The inlet 313 may extend into a bottom region of the central cavity 303 in order to provide process gases into the central cavity 303. The exit 315 may extend through the external body 301, such that the exit 315 opens into the spacing between the external body 301 and the inner tube 311. By placing the inlet 313 and the exit 315 at these locations, the desired process gases may be introduced at the bottom of the central cavity 303, flow upwards through the central cavity 303 within the inner tube 311, flow over the ends of the inner tube 311, down through the spacing between the inner tube 311 and the external body 301, and out through the exit 315. Optionally, a vacuum pump may be attached to the exit 315 in order to facilitate the removal of the ambient gases from the central cavity 303.

In some embodiments, to seal the central cavity 303 from the ambient atmosphere, a base plate 317 may be attached to the external body 301 along the bottom of the external body

301. The base plate 317 may be made from a similar material as the external body 301 (e.g., quartz, silicon carbide, mullite, combinations of these, or the like) and covers the opening at the bottom of the external body 301. A seal ring 319 may be utilized to hermetically seal the central cavity 303 between the external body 301 and the base plate 317.

Attached to the base plate 317 may be a wafer boat connection platform 321. The wafer boat connection platform 321 allows for the placement and connection of the wafer boat 400 to the base plate 317. Once attached to the base plate 317, the wafer boat 400 may be placed into the central cavity 303 and be ready for processing. After the wafer boat 400 has been placed on the wafer boat connection platform 321 of the base plate 317, the base plate 317 may be mated with the external body 301 such that the wafer boat 400 and the semiconductor wafers W are located within the central cavity 303 of the furnace 300. Once the central cavity 303 is hermetically sealed between the external body 301 and the base plate 317, the controller 307 may engage the heaters 305 to begin heating the central cavity 303 to a predetermined temperature of the COR process, while the COR process gases such as NH$_3$, HF, a combination thereof, or the like, may be funneled into the central cavity 303 through the inlet 313, over the wafer boat 400 and the semiconductor wafers W, and out through the exit 315. In this way, the COR process can be performed in the furnace 300 to remove the oxide layer 122.

In operation S105 of FIG. 1, a silicon layer (also referred to as a silicon-containing layer in this context) 124 is formed as a blanket layer to conformally cover the structure shown in FIGS. 6A-6C. The resulting structure is illustrated in FIG. FIGS. 7A-7C. The dielectric materials (e.g., materials of spacer layer 116, isolation insulating layer 105, and hard mask layer 114) are amorphous in nature, while the semiconductor materials of the fins 104 are crystalline in nature (e.g., having a single crystalline structure). The different sub-types of solids result in the silicon layer 124 formed with crystalline portions 126 (i.e., having a single crystalline structure) and an amorphous portion 128. In greater detail, portions 126 of the silicon layer 124 formed on the top surfaces 104*t* and sidewalls 104*s* of the semiconductor fins 104 are crystalline in nature, because the crystalline portions 126 are deposited upon the crystalline top surfaces 104*t* and crystalline sidewalls 104*s*. On the contrary, the portion 128 of the silicon layer 124 formed on the remaining spacer layer (i.e., gate spacers 118, fin spacers 120, and remaining spacer layer 116*p*) and the hard mask layer 114 is amorphous in nature, because it forms interfaces with amorphous materials of the remaining spacer layer and the hard mask layer 114. Therefore, the portions 126 of the silicon layer 124 can be equivalently referred to as crystalline silicon (c-Si) layers or portions wrapping around the respective semiconductor fins 104, and the portion 128 of the silicon layer 124 can be equivalently referred to as an amorphous silicon (a-Si) layer or portion.

Formation of the silicon layer 124 includes CVD, atomic layer deposition (ALD), the like, or other suitable processes. Process conditions of forming the silicon layer 124 are controlled in such a way that crystalline silicon, rather than amorphous silicon, is formed on the semiconductor fins 104. Moreover, process conditions of forming the silicon layer 124 are controlled to result in a conformal silicon layer, and hence a thickness T3 of vertical portions of the c-Si layer 126 on sidewalls 104*s* of the semiconductor fins 104 is close to a thickness T4 of a horizontal portion of the c-Si layer 126. For example, thicknesses T3 and T4 may have a difference smaller than about 20 percent of thickness T4. In some embodiments, the thicknesses T3 and T4 are in a range from about 5 nm to about 10 nm. If the thicknesses T3 and T4 are greater than about 10 nm, it might adversely affect subsequent deposition processes (e.g., interlayer dielectric (ILD) deposition). If the thicknesses T3 and T4 are less than about 5 nm, the c-Si layers 126 might be too thin to serve as source/drain regions of a transistor. In some embodiments, the c-Si layers 126 on the respective semiconductor fins 104 are separated by a distance in a range from about 10 nm to about 60 nm. If the distance between the neighboring c-Si layers 126 is greater than about 60 nm, the device performance of transistor might be unsatisfactory because of reduced thickness of the c-Si layers 126. If the distance between the neighboring c-Si layers 126 is less than about 10 m, it might adversely affect subsequent deposition processes (e.g., ILD deposition). In certain embodiments, the silicon layer 124 may be formed by using a furnace (e.g., the furnace 300 as shown in FIG. 12) provided with a silicon-containing precursor gas, such as SiH$_4$, Si$_2$H$_6$, Si$_3$H$_8$, the like, or combinations thereof. In some embodiments, the flow rate of the silicon-containing precursor gas is in the range of about 1000 standard cubic centimeters per minute (sccm) to about 2000 sccm. A temperature for the formation of the silicon layer 124 is in a rage from about 380 degrees Centigrade to about 620 degrees Centigrade, for example. A pressure range for the formation of the silicon layer 124 is from about 400 mTorr to about 1 Torr, for example. The process conditions of the deposition process performed in the furnace may result in the conformal silicon layer 124 with c-Si portions 126 and a-Si portion 128 conformal to their underlying structures. In some embodiments where silicon-containing precursor gas is SiH$_4$, SiH$_4$ may be provided at a flow rate in a range of about 1000 sccm to about 2000 sccm and at a temperature in a range of about 550 degrees Centigrade to about 620 degrees Centigrade. In some embodiments where silicon-containing precursor gas is Si$_2$H$_6$, Si$_2$H$_6$, may be provided at a flow rate in a range of about 200 sccm to about 600 sccm and at a temperature in a range of about 400 degrees Centigrade to about 420 degrees Centigrade. If the process conditions are out of the above selected range, the c-Si portion 126 might be not conformally formed on semiconductor fins 104.

The silicon layer 124 is doped, such as in-situ doped. Herein, the term "in-situ" means that the precursor gases of the silicon layer 124 and the dopant gases are introduced into the same process chamber (e.g., the furnace 300 as shown in FIG. 12), without breaking vacuum. The doping species may include p-type dopants, such as boron from boron-containing gas (e.g., BF$_3$, B$_2$H$_6$, BCl$_3$); n-type dopants, such as phosphorus from phosphorus-containing gas (e.g., PH$_3$, PF$_3$, PF$_5$); and/or other suitable dopants (e.g., GeF$_3$). The p-doped c-Si layers 126 can thus serve as source/drain layers or regions for a p-type FinFET. On the contrary, the n-doped c-Si layers 126 can thus serve as source/drain layers or regions for an n-type FinFET. If the source/drain regions resemble diamond-like structures, the diamond-like structures would inevitably merge together when they are epitaxially grown on closely arranged semiconductor fins. Embodiments of the present disclosure, however, form source/drain regions conformal to semiconductor fins, rather than diamond-like structures. Therefore, unwanted merged source/drain regions can be prevented.

Figure 8A:
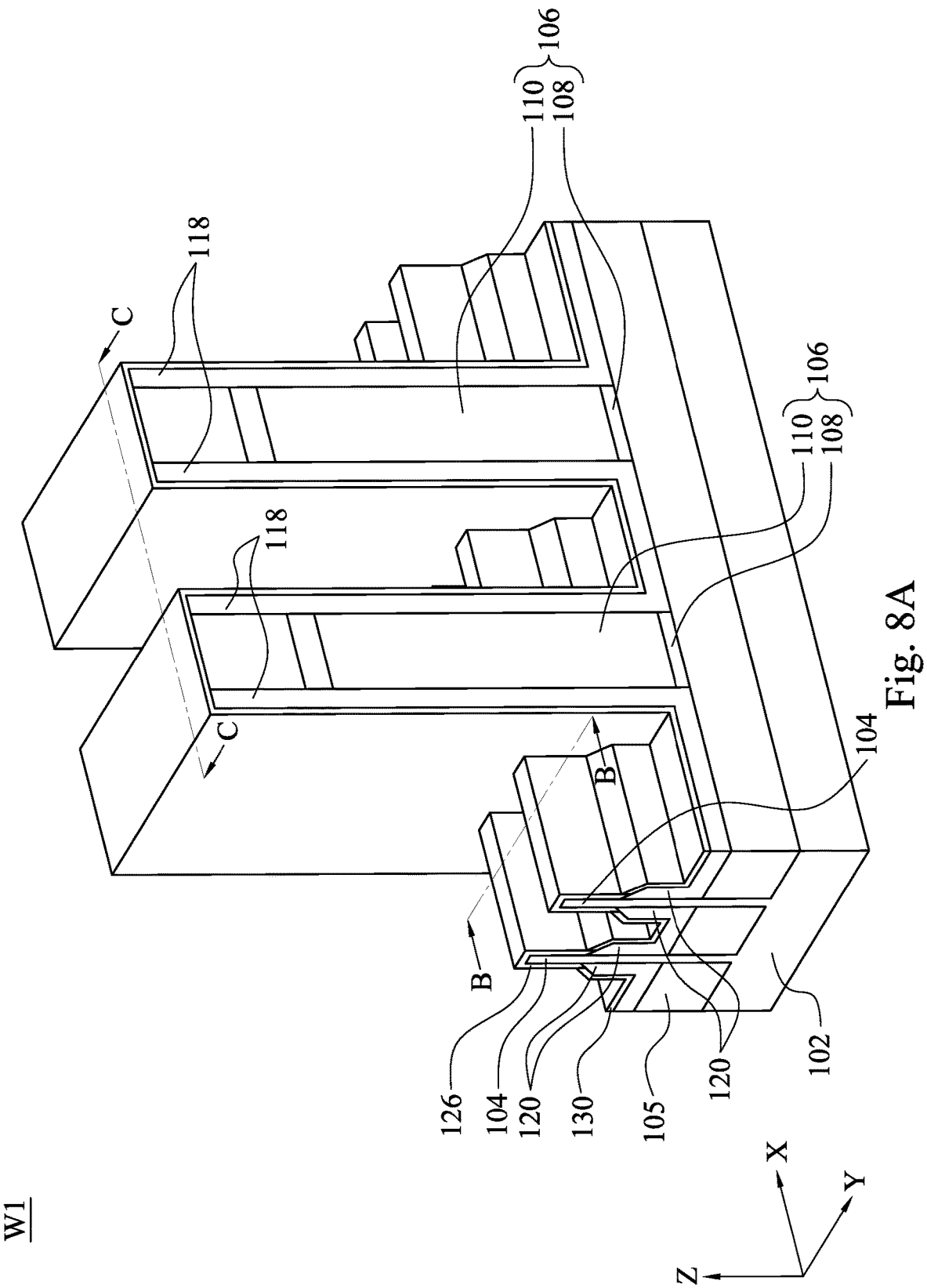
Figure 8C:
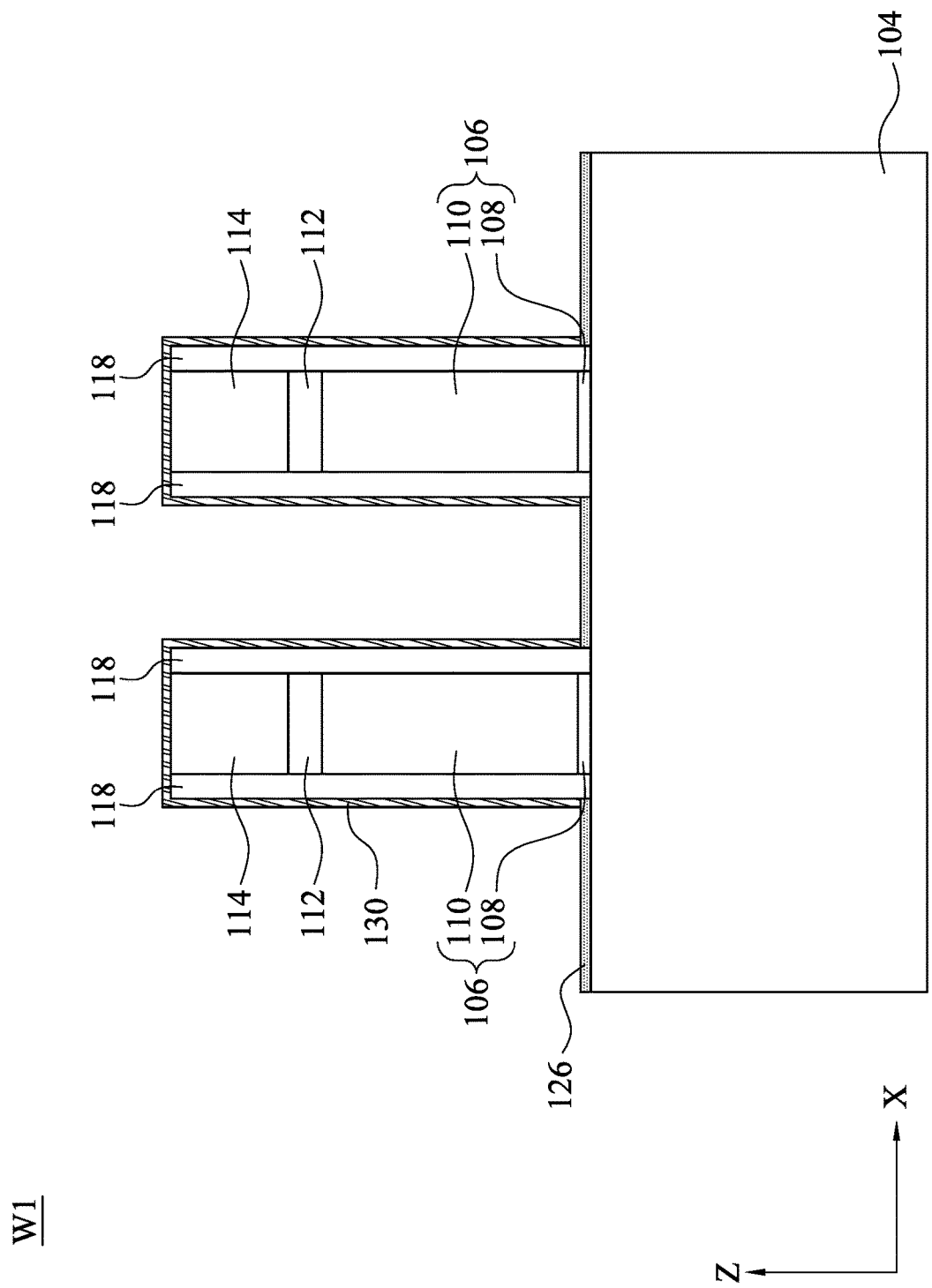

In operation S106 of FIG. 1, an anneal process is performed to crystallize the a-Si layer 128 into a polycrystalline silicon (poly-Si) layer 130, as illustrated in FIGS. 8A-8C. In some embodiments, crystallization of the a-Si layer 128 includes a solid phase epitaxial regrowth (SPER) anneal, a rapid thermal anneal (RTA), a laser anneal, a millisecond anneal (mSA), the like or combinations thereof. The anneal process may heat the a-Si layer 128 with a temperature which exceeds a crystallization threshold of the a-Si layer 128 (e.g., greater than 600 degrees Centigrade), so as to convert the a-Si layer 128 into the poly-Si layer 130. The anneal process not only results in crystallization of the a-Si layer 128, but also activate the doped c-Si layer 126. In some embodiments, the anneal process may be in-situ performed after depositing the silicon layer 124. Herein, the term "in-situ" means that depositing and annealing the silicon layer 124 are performed in the same process chamber (e.g., the furnace 300 as shown in FIG. 12), without breaking vacuum. A temperature of the anneal process performed in the furnace 300 is in a rage from about 500 degrees Centigrade to about 700 degrees Centigrade, for example. If the temperature of the anneal process is out of this range, quality of the doped c-Si layer 126 might be unsatisfactory for serving as source/drain regions. In some other embodiments, the anneal process is a RTA process performed at a temperature in a range from about 700 degrees Centigrade to about 1100 degrees Centigrade, for example.

As discussed above, in some embodiments, operations S104-S106 can be in-situ performed, for example, in the same furnace 300 as shown in FIG. 12. These in-situ processes result in reduced contamination on the semiconductor wafers W1. Moreover, multiple semiconductor wafers W1 can be processed substantially simultaneously in the furnace 300, which in turn will be advantageous for improvement of throughput and hence the reduction of fabrication cost. For example, in some embodiments of operation S104, native oxide layers 122 on the respective wafers W1 can be removed substantially simultaneously in the furnace 300, by introducing etch gas (e.g., $NH_3$ gas and/or HF gas) into the central cavity 303 of the furnace 300. In some embodiments of operation S105, silicon-containing precursor gas (e.g., $SiH_4$, $Si_2H_6$, and/or $Si_3H_8$) is introduced into the central cavity 303 of the furnace 300, so that silicon layers 124 are respectively formed on the semiconductor wafers W1. In some embodiments of S106, the furnace 300 performs an anneal process to crystallize the a-Si layers 128 on the respective wafers W1 into the poly-Si layers 130, and to activate c-Si layers 126 on semiconductor fins 104 on the respective wafers W1.

Figure 9A:
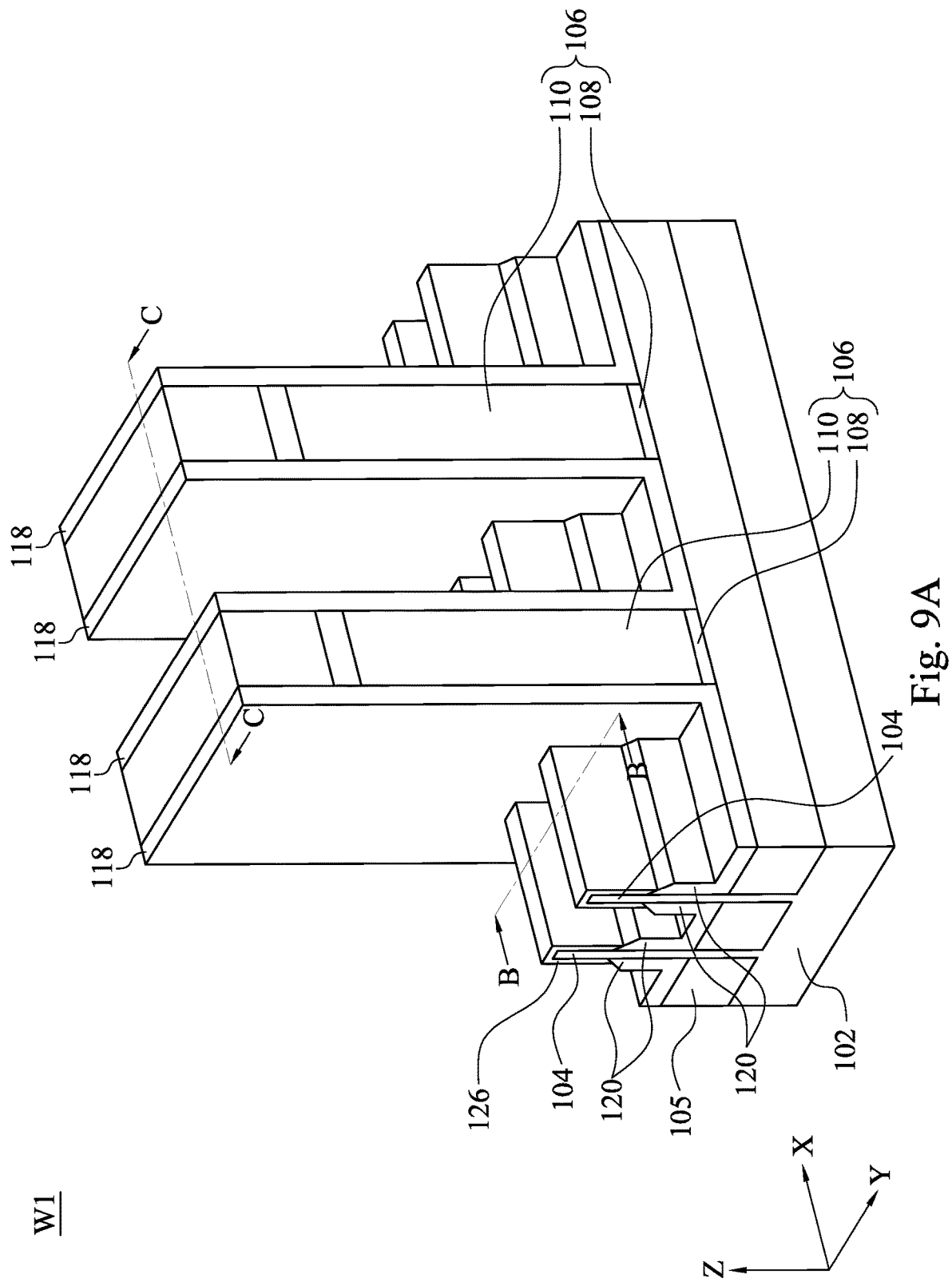
Figure 9C:
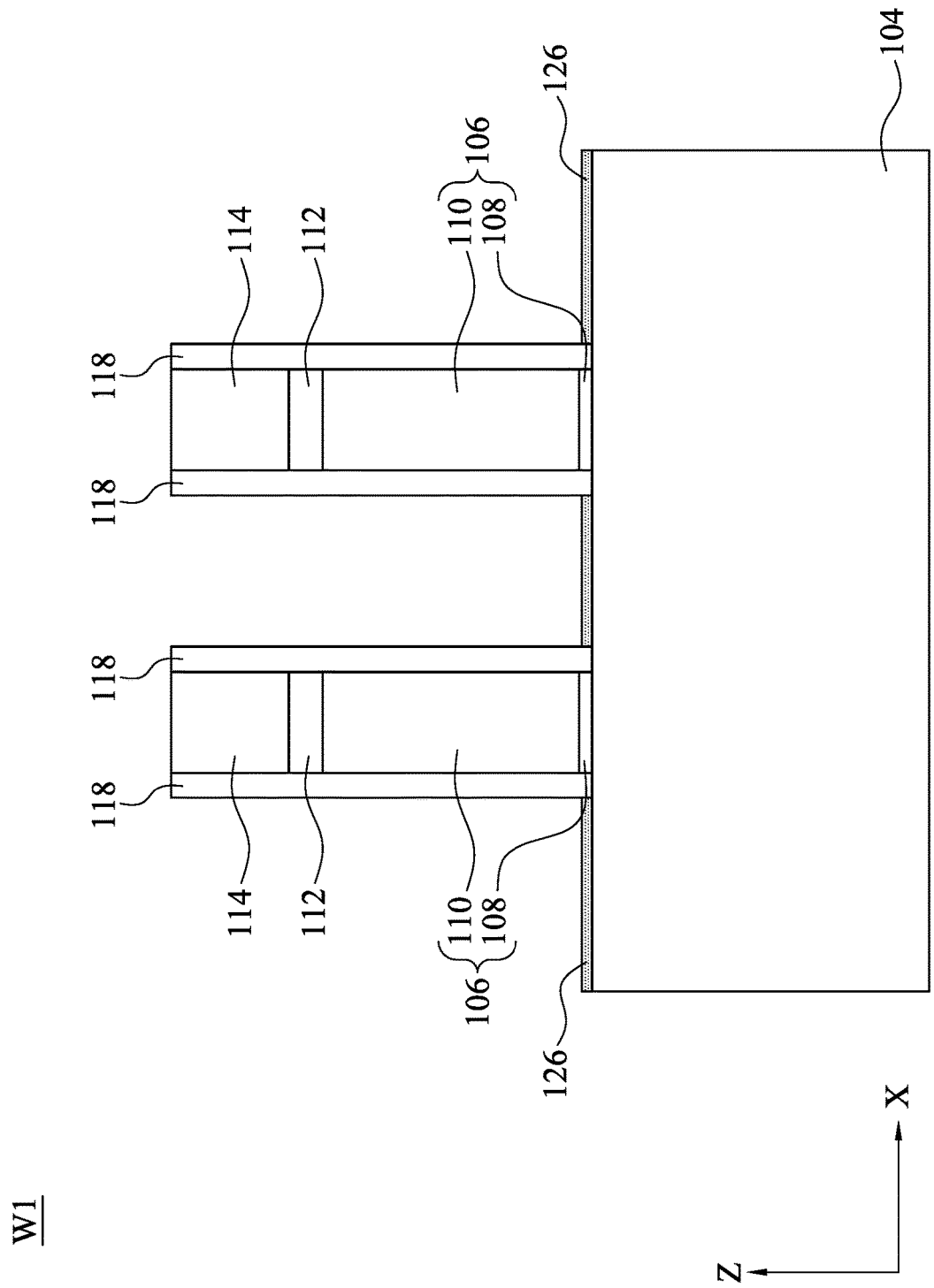

In operation S107, the poly-Si layer 130 is removed, while remaining the c-Si layers 126 on the semiconductor fins 104. The resulting structure is illustrated in FIGS. 9A-9C. In some embodiments, removal of the poly-Si layer 130 includes a selective etching process which etches polycrystalline silicon at a faster rate than it etches single crystalline silicon. Stated another way, the c-Si layers 126 have higher etch resistance to the etchant used in the etching process than that of the poly-Si layer 130. In this way, the selective etching process can remove the poly-Si layer 130, while remaining the c-Si layers 126 on the semiconductor fins 104. The selective etching process may be dry etching, wet etching, or combinations thereof.

Figure 10A:
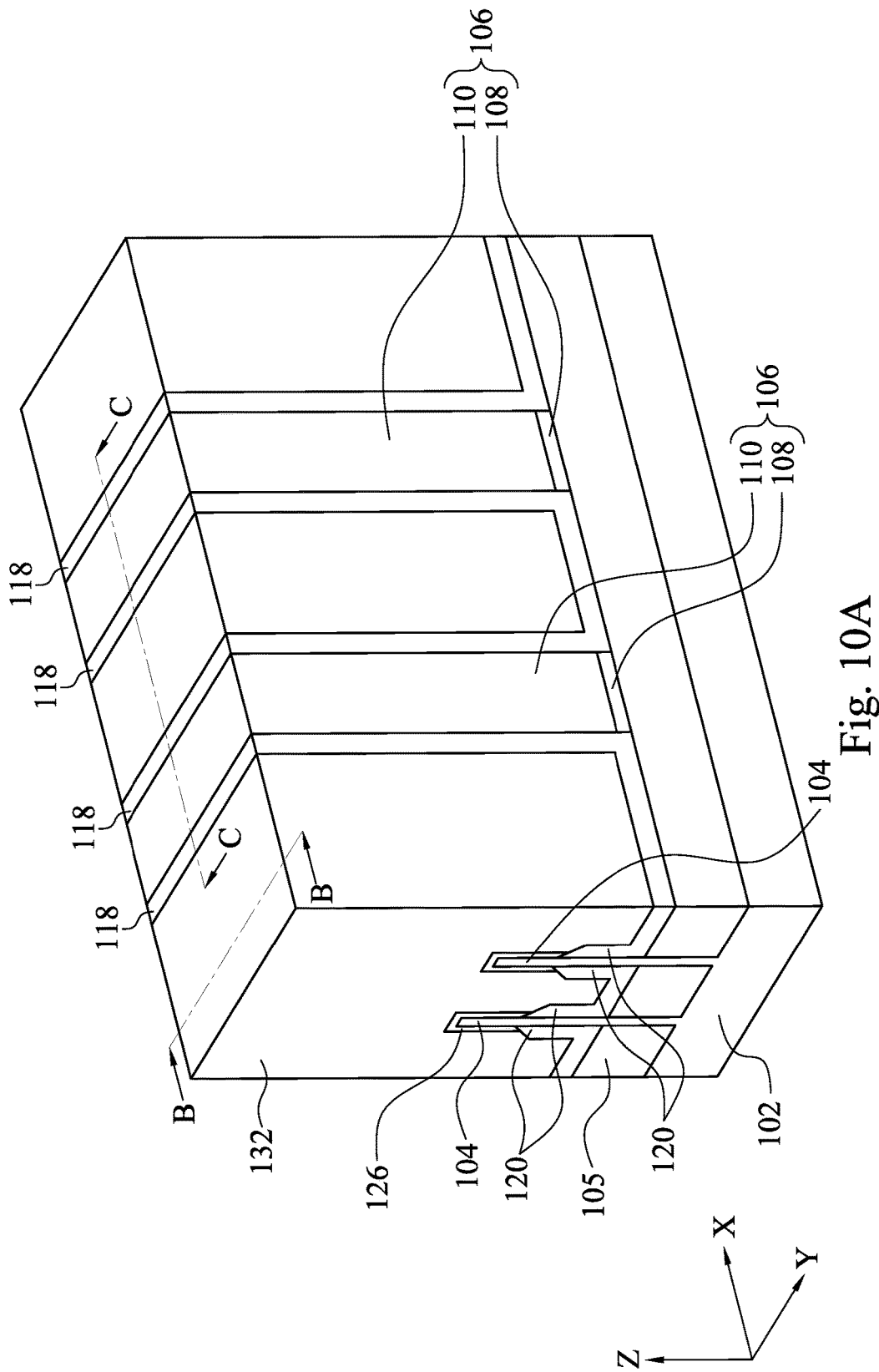
Figure 10B:
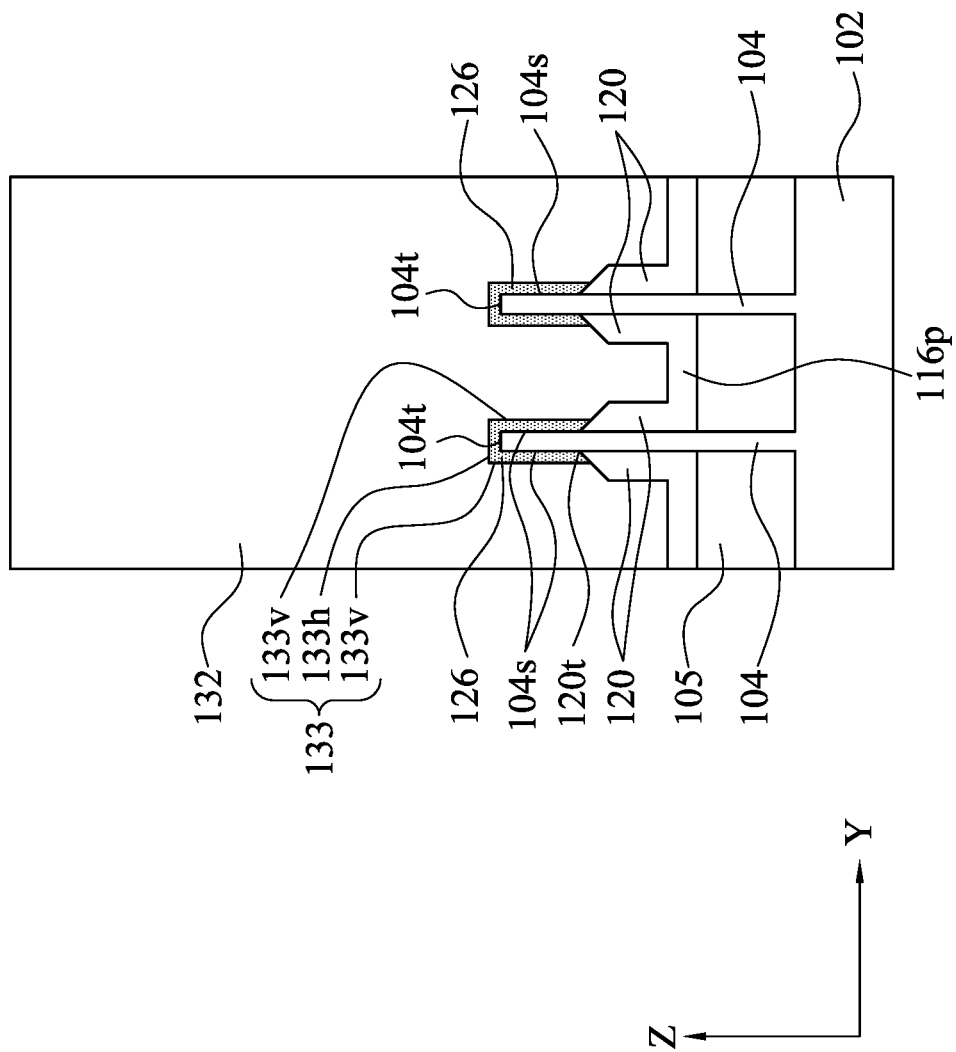
Figure 10C:
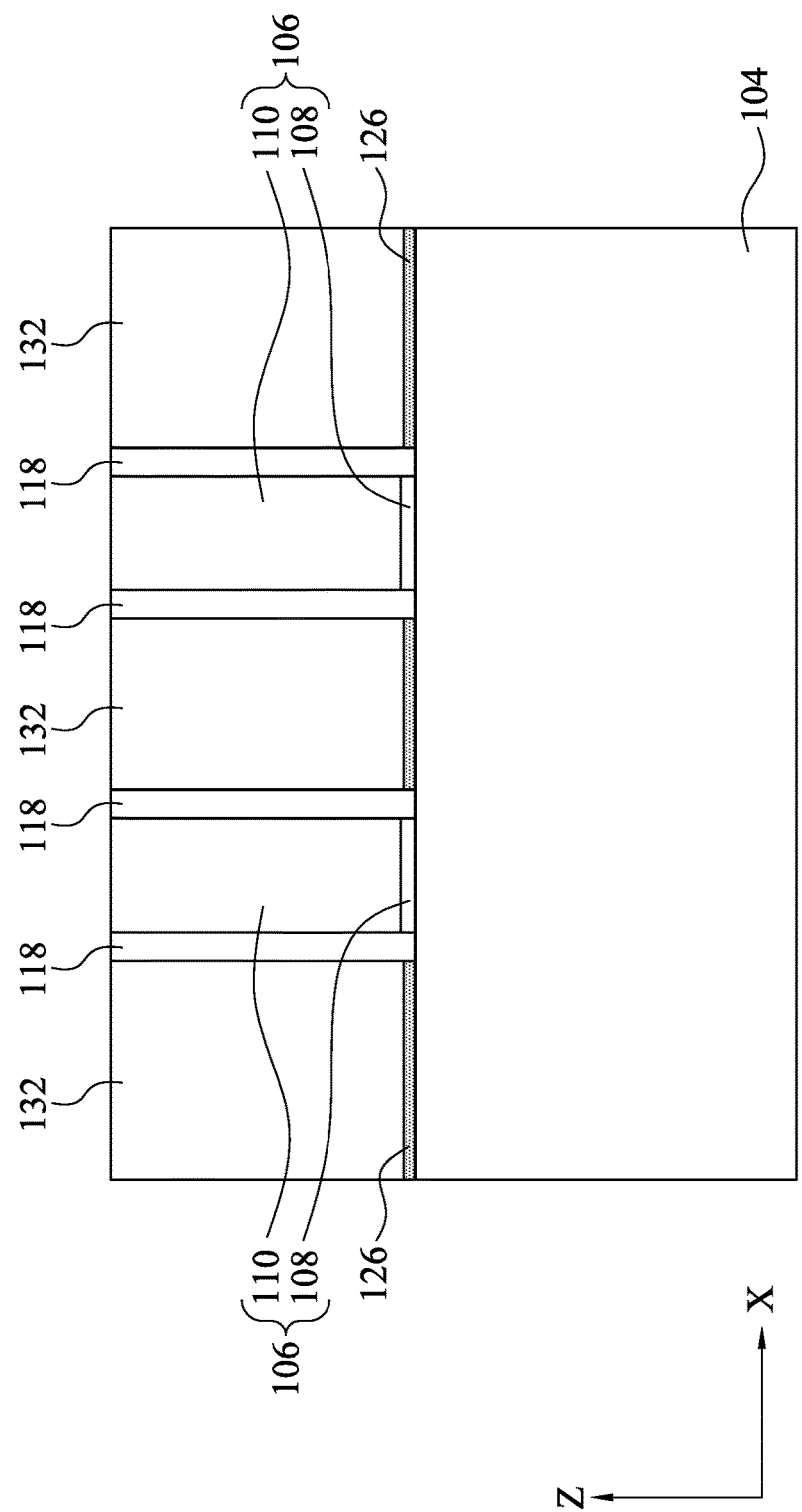

In operation S108, a dielectric layer 132 is formed over the c-Si layers 126, as illustrated in FIGS. 10A-10C. In some embodiments, the dielectric layer 132 is formed over the c-Si layers 126, the second mask layer 114, the gate spacers 118 and the fin spacers 120, followed by removing an excessive material of the dielectric layer 132 to expose the dummy gate structures 106 by using, for example, a CMP process. The CMP process may planarize a top surface of the dielectric layer 132 with top surfaces of the dummy gate structures 106 and gate spacers 118. In some embodiments, the dielectric layer 132 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The dielectric layer 132 may be formed using, for example, CVD, ALD, spin-on-glass (SOG) or other suitable techniques. In some embodiments, the dielectric layer 132 is a multi-layered structure including a contact etch stop layer (CESL) and an interlayer dielectric (ILD) over the CESL, wherein the ILD has a different etch selectivity than the CESL.

As illustrated in FIG. 10B, the dielectric layer 132 and the c-Si layer 126 form an interface 133 conformal to the semiconductor fin 104, because the c-Si layer 126 is a conformal layer having a substantially uniform thickness. Stated differently, an outer profile of the c-Si layer 126 is substantially the same as an inner profile of the c-Si layer 126. Specifically, the interface 133 between the dielectric layer 132 and the c-Si layer 126 has substantially vertical portions 133$v$ and a substantially horizontal portion 133$h$ connecting the substantially vertical portions 133$v$. The substantially horizontal portion 133$h$ is in parallel with the top surface 104$t$ of the semiconductor fin 104, and the substantially vertical portions 133$v$ are in parallel with the sidewalls 104$s$ of the semiconductor fin 104. As a result, the interface 133 between the dielectric layer 132 and the c-Si layer 126 substantially conforms to a profile of a combination of the top surface 104$t$ and the sidewalls 104$s$ of the semiconductor fin 104.

Figure 11B:
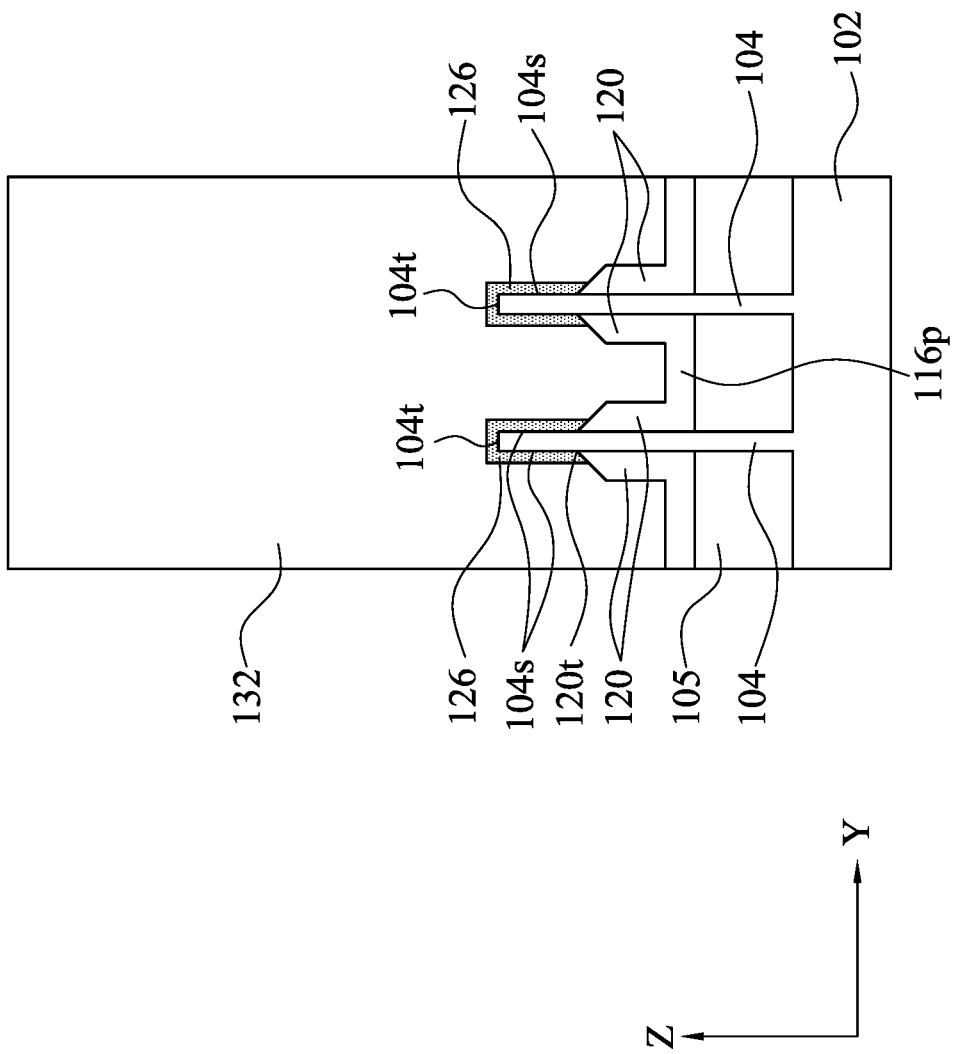
Figure 11C:
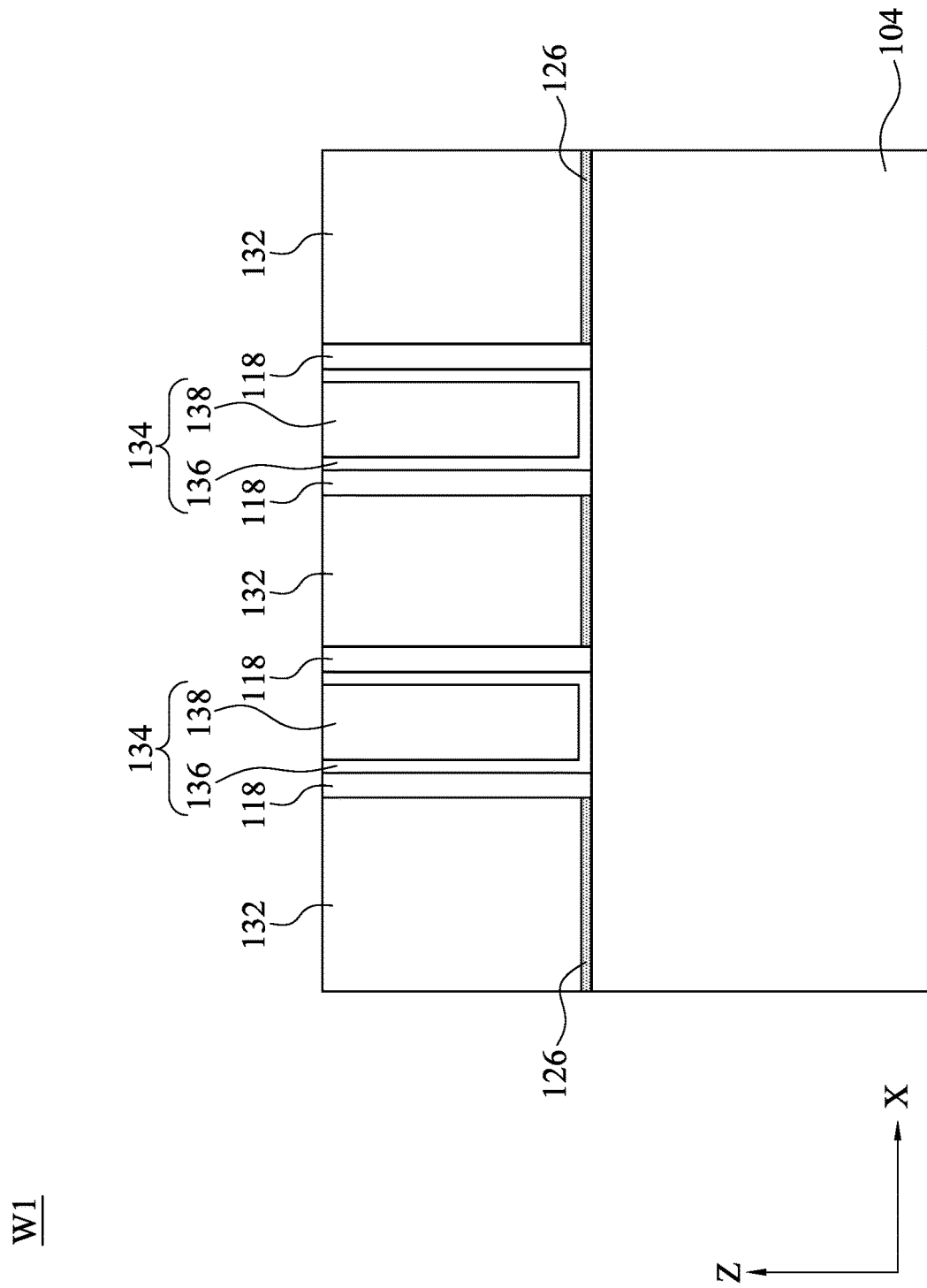

In operation S109, the dummy gate structures 106 are removed and replaced with replacement gate structures (also referred to as metal gate structures) 134, as illustrated in FIGS. 11A-11C. In some embodiments, the dummy gate structures 106 (e.g., the dummy gate electrodes 110 and gate dielectric layers 108) are removed by performing a first etching process and performing a second etching process after the first etching process. In some embodiments, the dummy gate electrodes 110 (as shown in FIGS. 10A-10C) are mainly removed by the first etching process, and the gate dielectric layers 108 (as shown in FIGS. 10A-10C) are mainly removed by the second etching process that employs a different etchant than that used in the first etching process. In some embodiments, the dummy gate electrodes 110 are removed, while the gate dielectric layers 108 remain on the semiconductor fins 104.

An exemplary method of forming the replacement gate structures 134 includes blanket forming a gate dielectric layer over the wafer W1, forming one or more work function metal layers over the blanket gate dielectric layer, forming a fill metal layer over the one or more work function metal layers, and performing a CMP process to remove excessive materials of the fill metal layer, the one or more work function metal layers and the gate dielectric layer over the dielectric layer 132. The resulting replacement gate structures 134 each include a gate dielectric layer 136 and a metal structure 138 (e.g., a combination of the one or more work function metals and the fill metal) wrapped around by the gate dielectric layer 136.

In some embodiments, the gate dielectric layers 136 includes, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layers 136 include hafnium oxide (HfO₂), hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide (Ta₂O₅), yttrium oxide (Y₂O₃), strontium titanium oxide (SrTiO₃, STO), barium titanium oxide (BaTiO₃, BTO), barium zirconium oxide (BaZrO), hafnium lanthanum oxide (HfLaO), lanthanum silicon oxide (LaSiO), aluminum silicon oxide (AlSiO), aluminum oxide (Al₂O₃), silicon nitride (Si₃N₄), oxynitrides (SiON), and combinations thereof. In alternative embodiments, the gate dielectric layers 136 may have a multilayer structure such as one layer of silicon oxide (e.g., interfacial layer) and another layer of high-k material. In some embodiments, the gate dielectric layers 136 are made of the same material because they are formed from the same dielectric layer blanket deposited over the semiconductor wafer W1.

Work function metals of the metal structures 138 are used to provide suitable work functions for the respective gate structures 134. In some embodiments, the work function metals may include one or more n-type work function metals (N-metal) suitable for forming the n-type FinFET. The n-type work function metal has work function lower than the mid-gap work function (about 4.5 eV) that is in the middle of the valance band and the conduction band of silicon. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function metals may include one or more p-type work function metals (P-metal) suitable for forming a p-type FinFET. The p-type work function metal has work function higher than the mid-gap work function that is in the middle of the valance band and the conduction band of silicon. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

Fill metals of the metal structures 138 are wrapped around by the work function metals, and may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 13:
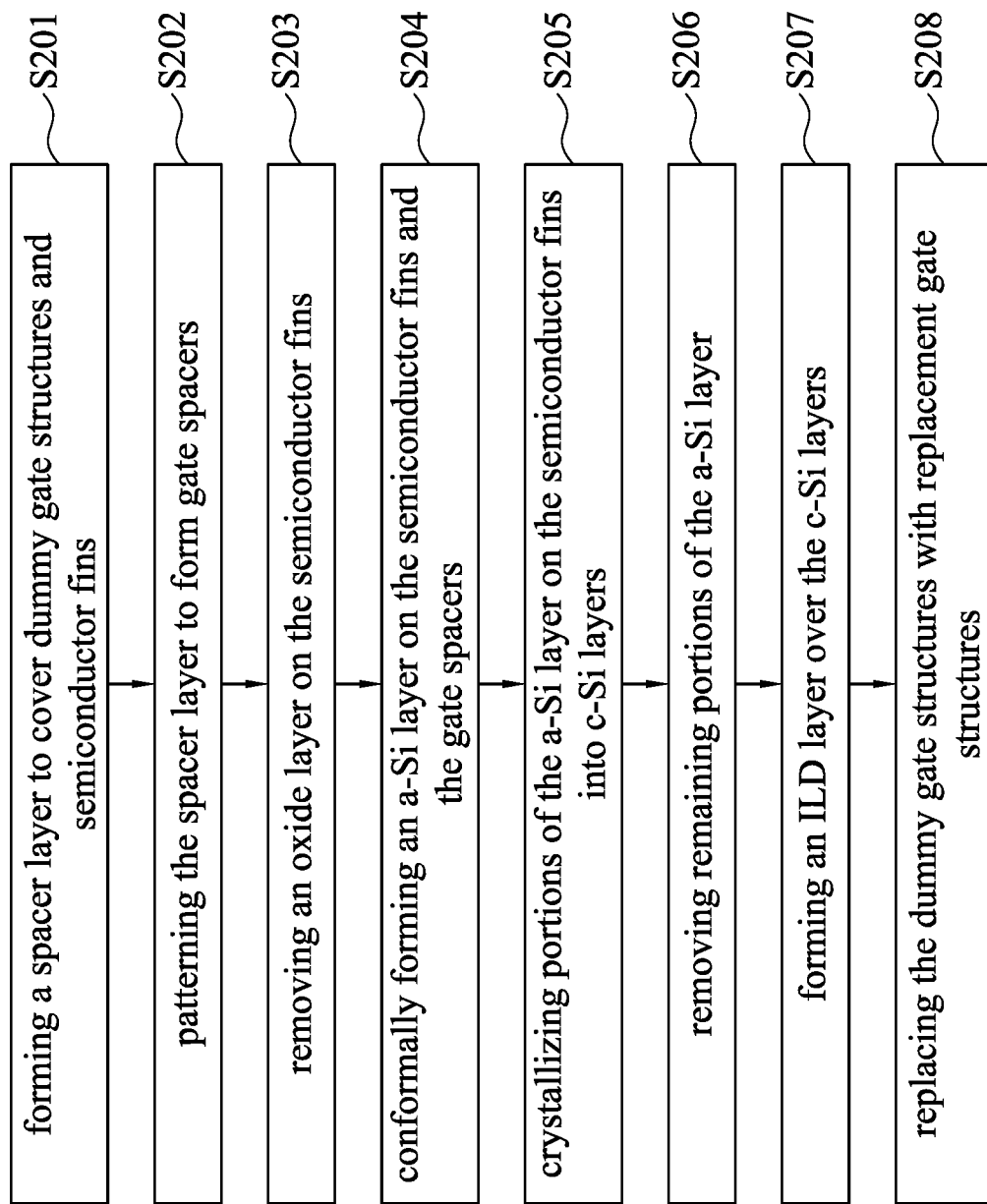
FIG. 13 is a flow chart of a method of forming a semiconductor device in accordance with some embodiments of the present disclosure.

Illustrated in FIG. 13 is a method of forming a semiconductor device in accordance with some embodiments of the present disclosure. FIG. 14A-22C illustrate various processes at various stages of the method of FIG. 13 in accordance with some embodiments of the present disclosure. Throughout the various views and illustrative embodiments, like reference numbers are used to designate like elements. In FIGS. 14A-22C, the "A" figures (e.g., FIGS. 14A, 15A, etc.) illustrate a perspective view, the "B" figures (e.g., FIGS. 14B, 15B, etc.) illustrates a cross-sectional view along Y direction corresponding to lines B-B illustrated the "A" figures, and the "C" figures (e.g., FIG. 14C, 15C, etc.) illustrate a cross-sectional view along the X direction corresponding to lines C-C illustrated in in the "A" figures. It is understood that additional operations can be provided before, during, and after the processes shown by FIGS. 14A-22C, and some of the operations described below can be replaced or eliminated, for additional embodiments of the method. The order of the operations/processes may be interchangeable.

Figure 14A:
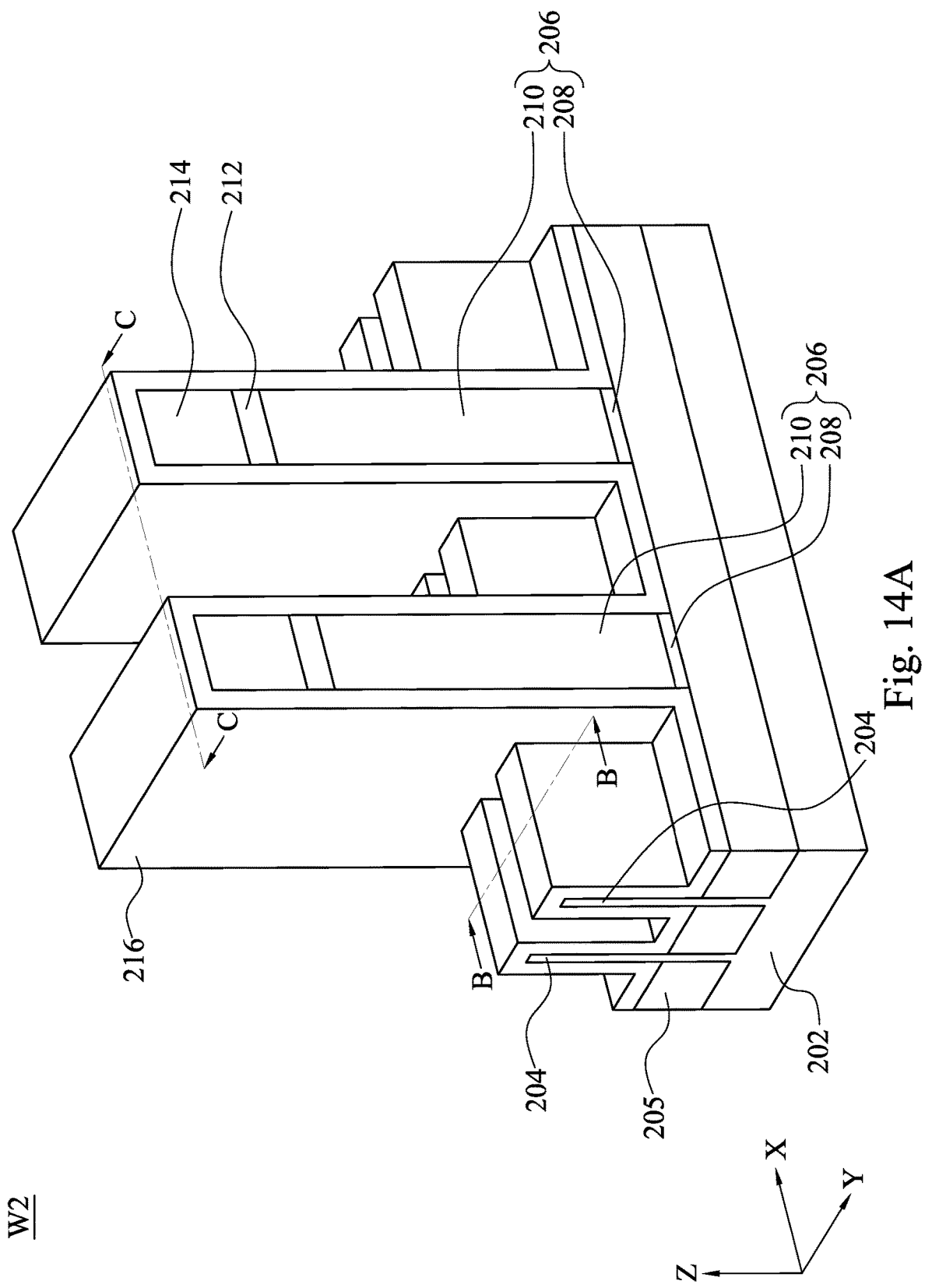
FIGS. 14A, 15A, 16A, 17A, 18A, 19A, 20A, 21A, and 22A illustrate a perspective view of a semiconductor device at various stages of the method of FIG. 13 in accordance with some embodiments of the present disclosure.
Figure 14C:
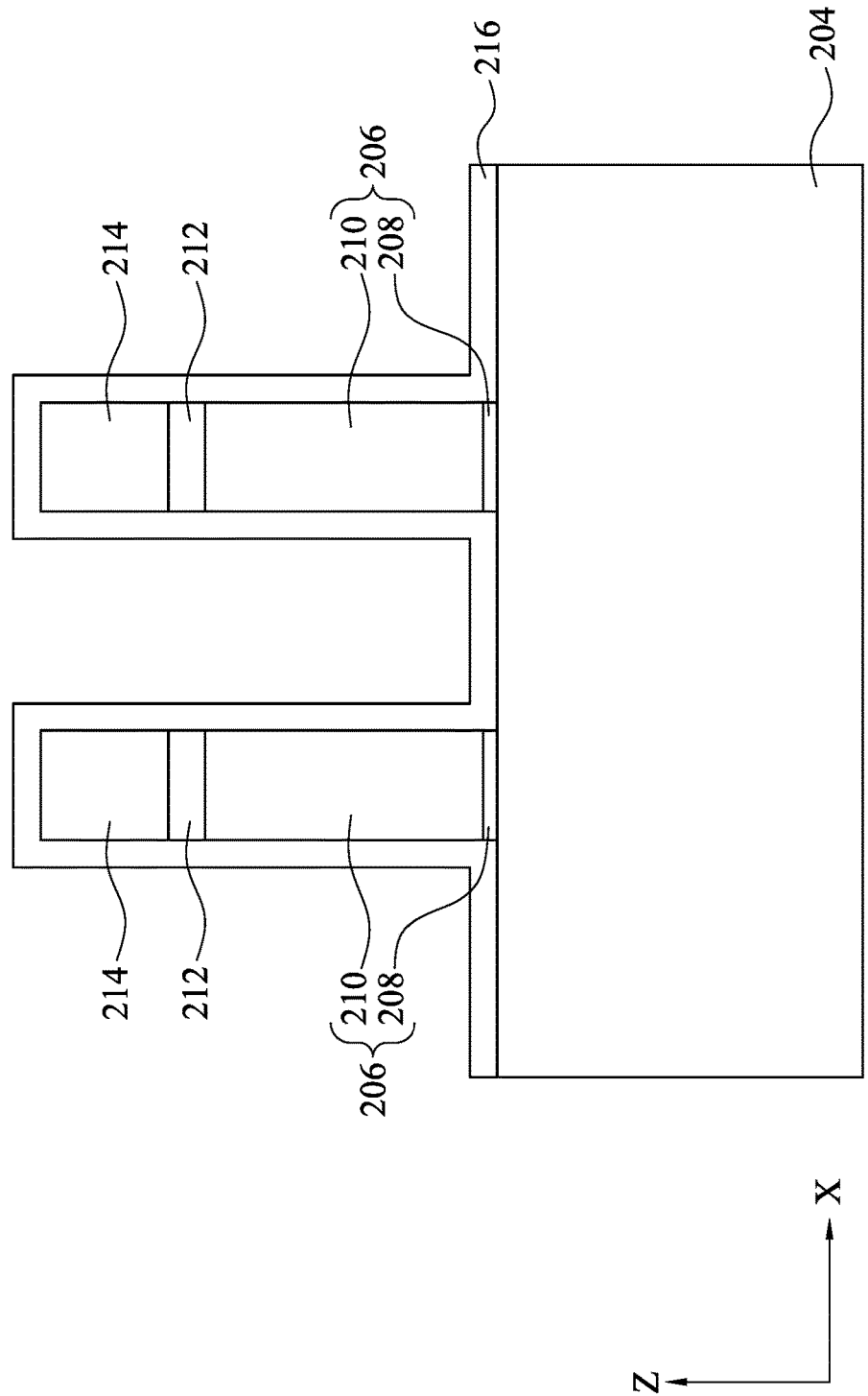

As illustrated in FIGS. 14A-14C, a semiconductor wafer W2 is substantially similar to the semiconductor wafer W1 in many respects, and includes a substrate 202, semiconductor fins 204, isolation regions 205, dummy gate structures 206, first and second mask layers 212 and 214, each substantially as described above with respect to the substrate 102, semiconductor fins 104, isolation regions 105, dummy gate structures 106, first and second mask layers 112 and 114. In operation S102, a spacer layer 216 is formed as a blanket layer to cover the dummy gate structures 206 and the semiconductor fins 204. The spacer layer 216 may be substantially the same as the spacer layer 116, as described above.

Figure 15A:
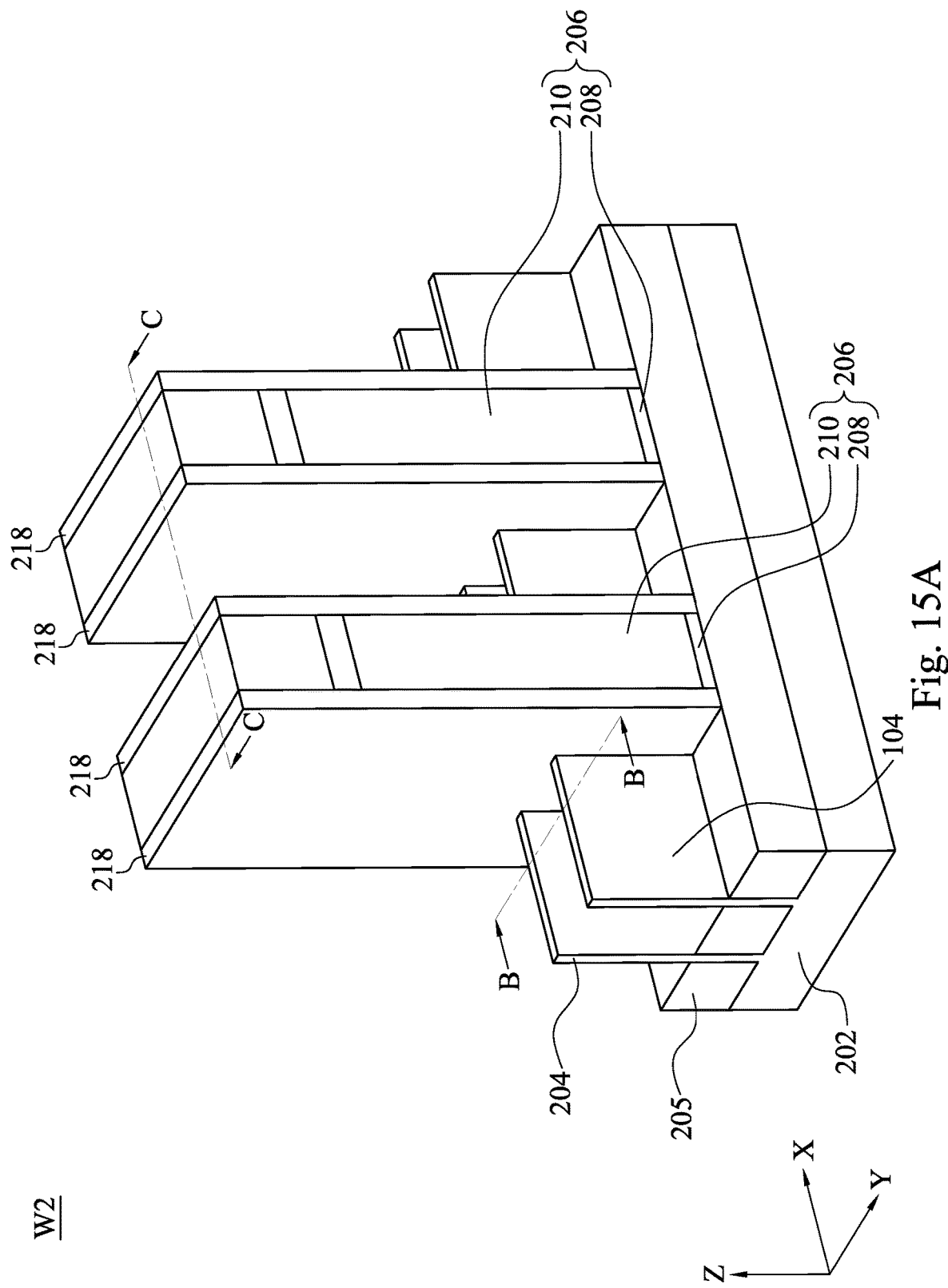
Figure 15B:
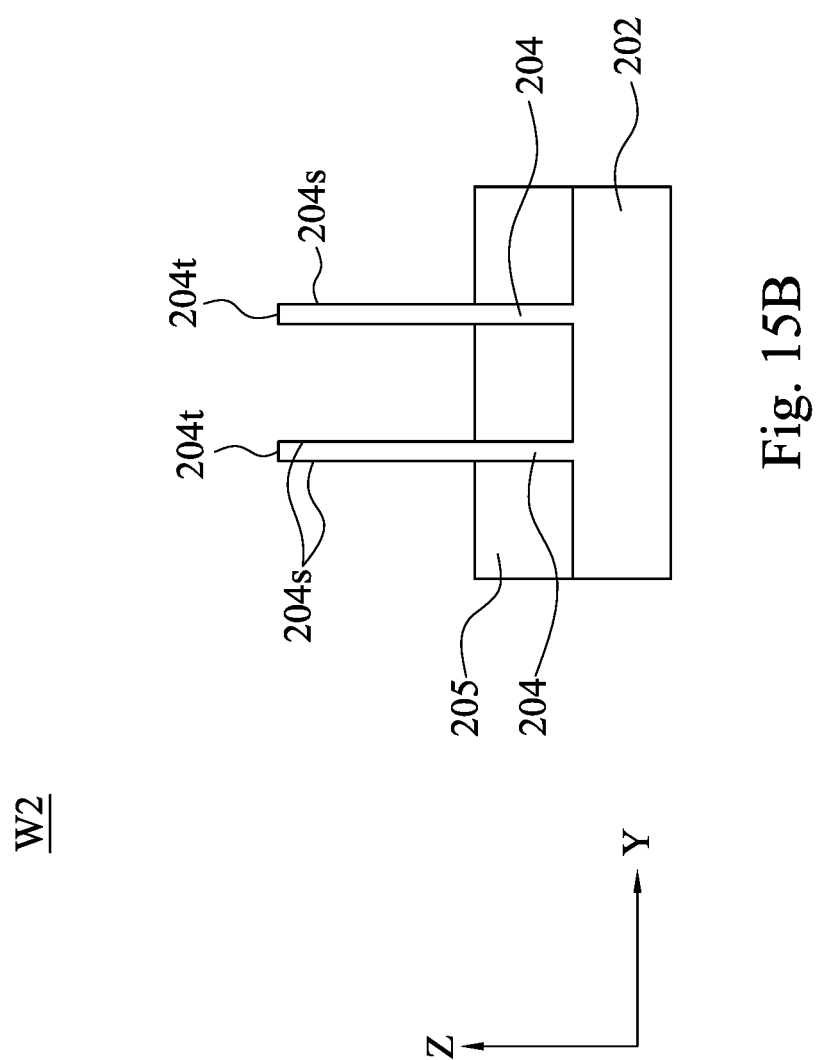
Figure 15C:
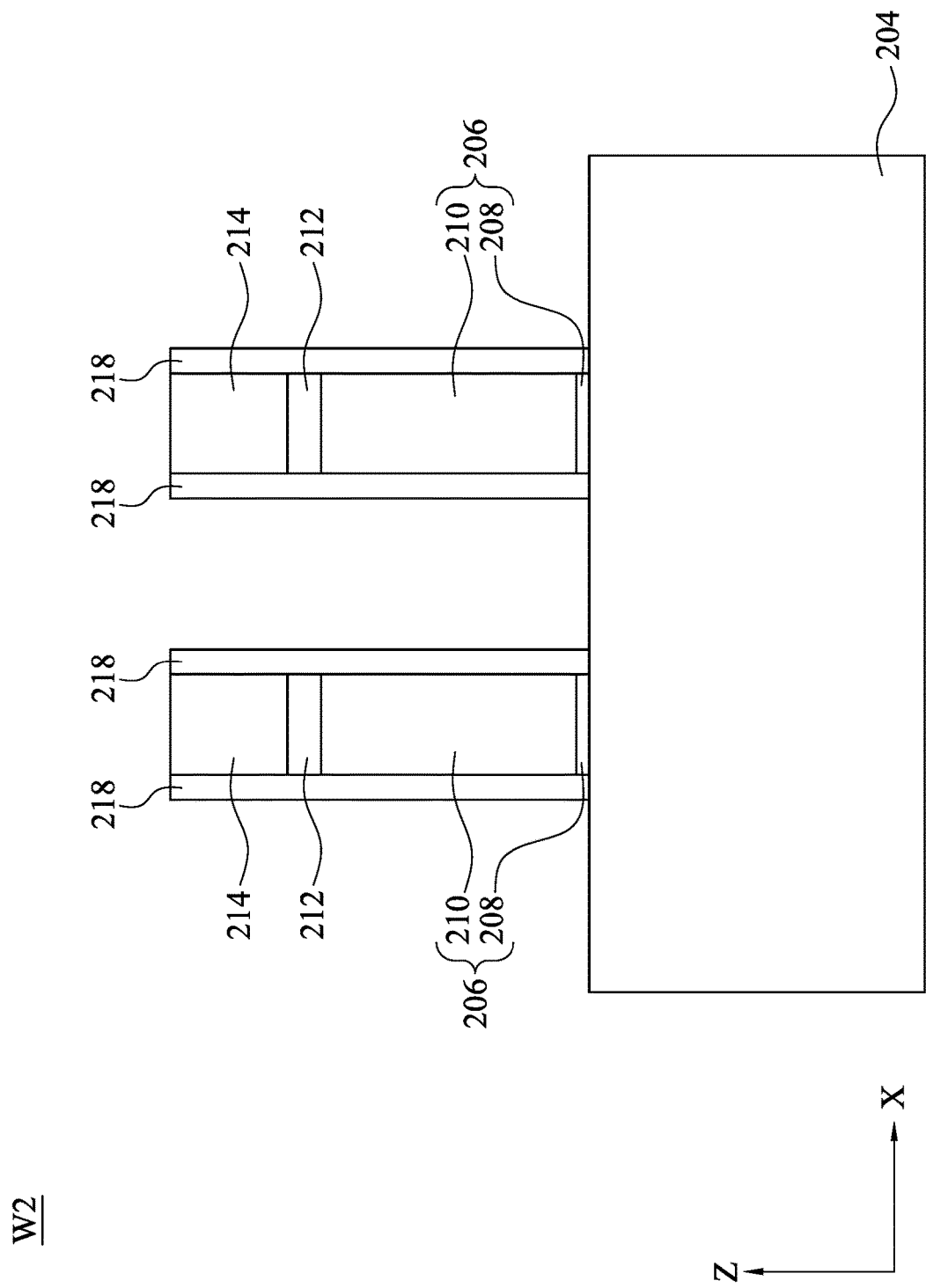

Next, in operation S202 of FIG. 1, the spacer layer 216 is patterned to form gate spacers 218, as shown in FIGS. 15A-15C. Patterning the spacer layer 216 may be an anisotropic etching that removes horizontal portions of the spacer layer 216, while remaining vertical portions on sidewalls of the dummy gate structures 206 to form gate spacers 218. In the illustrated embodiments, sidewalls 204s of the semiconductor fins 204 are free from coverage by the remaining spacer layer 216. In some alternative embodiments, vertical portions of the spacer layer 216 may remain on lower portions of the sidewalls 204s of the semiconductor fins 204, as illustrated in FIGS. 4A-4C.

Figure 16A:
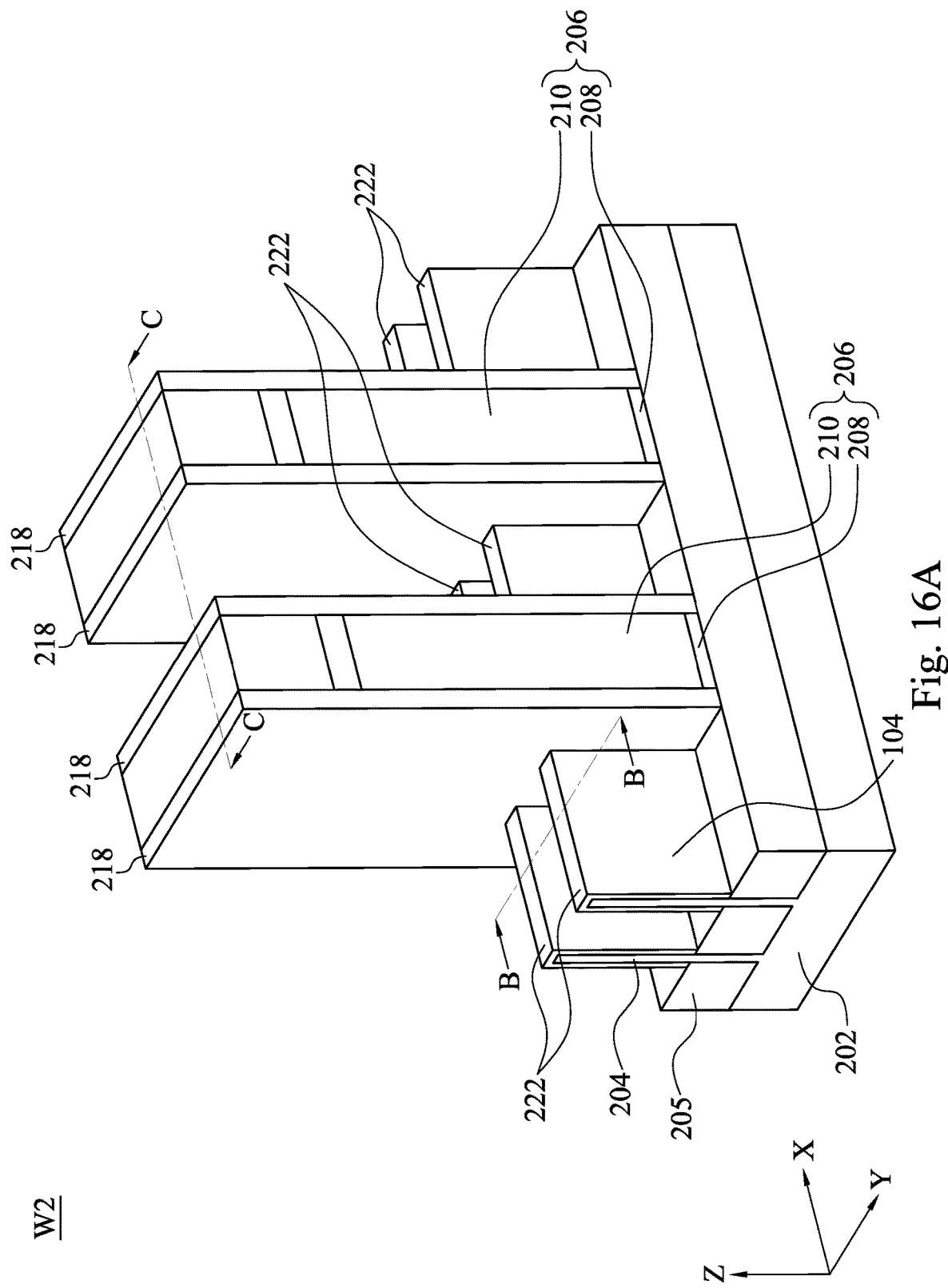
Figure 16B:
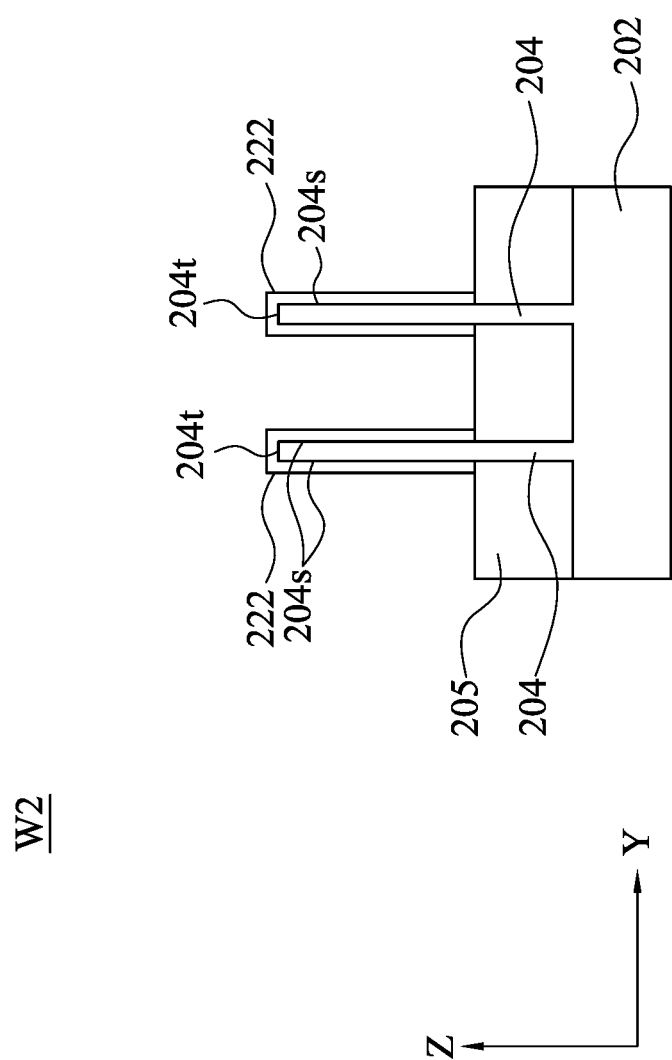
Figure 16C:
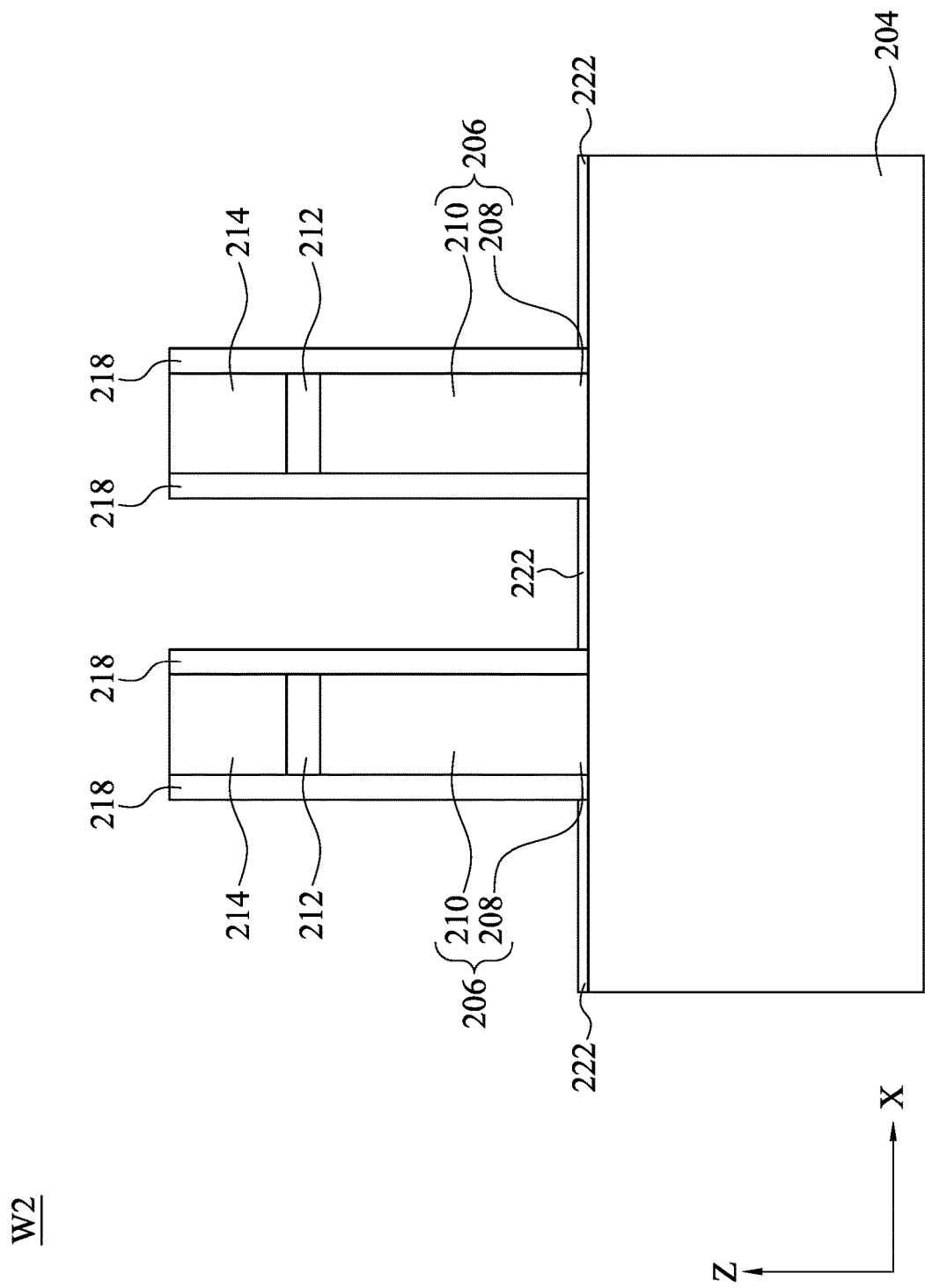
Figure 17A:
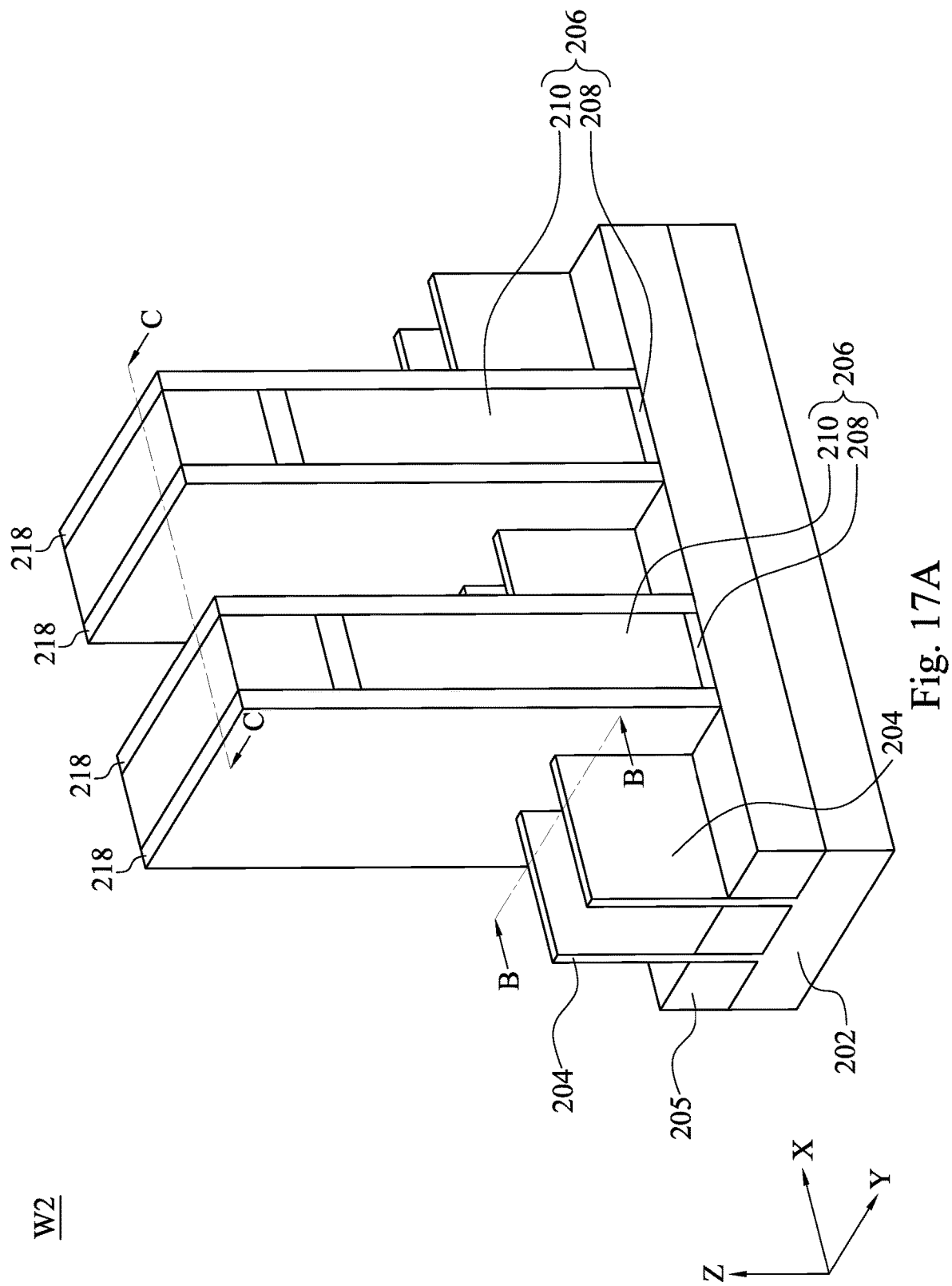
Figure 17B:
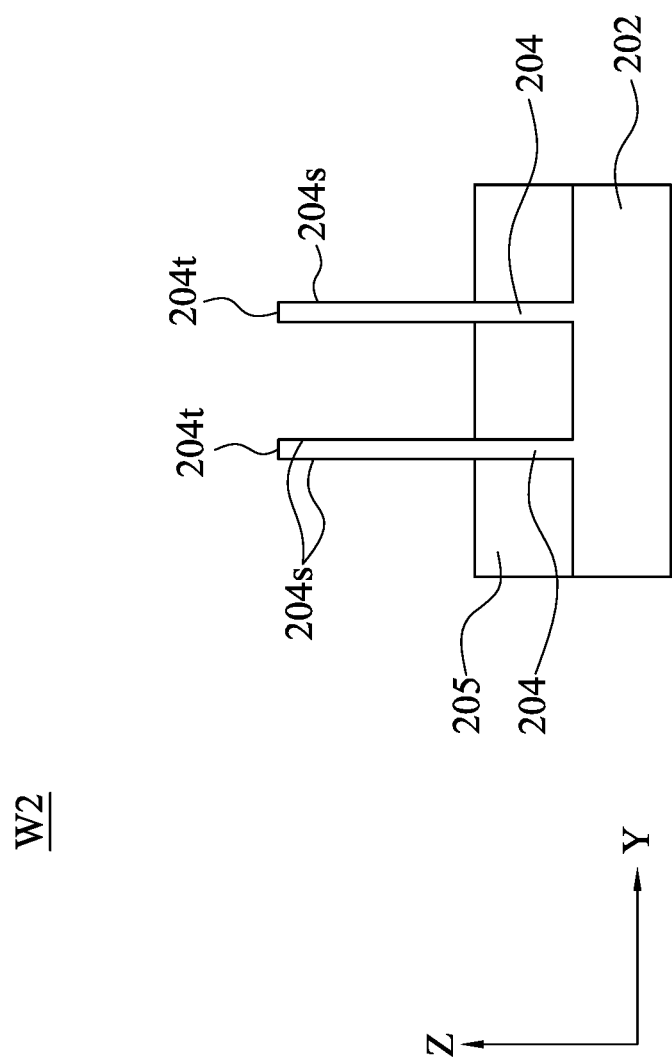
Figure 17C:
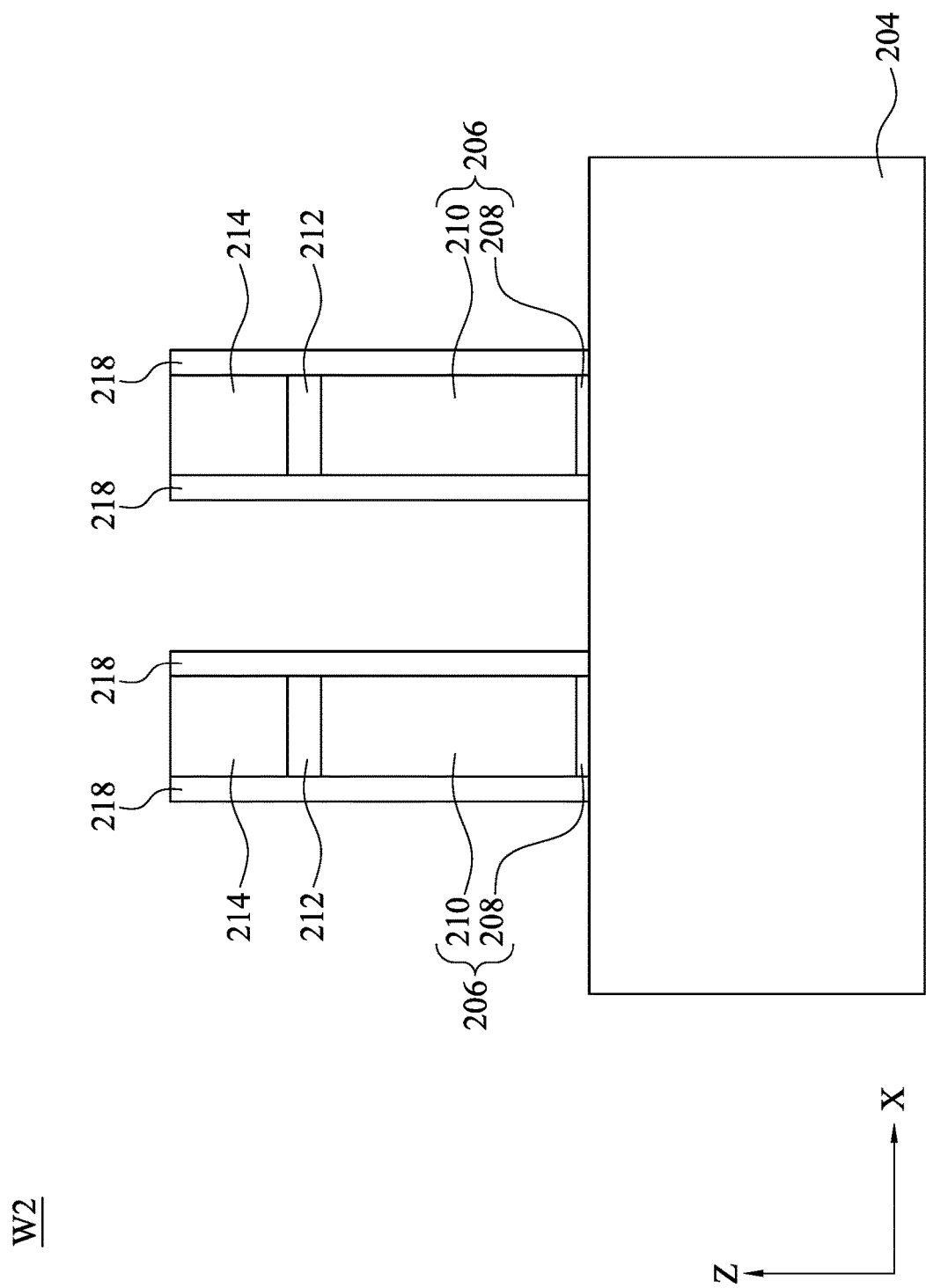

Due to the active nature of the semiconductor fins 204, oxide layers 222 may be naturally formed on the exposed top surfaces 204t and sidewalls 204s of the semiconductor fins 204, as illustrated in FIGS. 16A-16C. The native oxide layers 222 are amorphous, which may frustrate formation of crystalline source/drain layers. As a result, in operation S203 of FIG. 13, the oxide layers 222 are removed from the semiconductor fins 204, as illustrated in FIGS. 17A-17C. The removal of the oxide layers 222 is advantageous for subsequent formation of crystalline source/drain layers on the crystalline semiconductor fins 204. The oxide layers 222 may be removed using a suitable etching process substantially the same as that of removal of the oxide layers 122, as discussed previously with respect to FIGS. 6A-6C.

In certain embodiments, removal of the oxide layer 222 is performed in a furnace (e.g., the furnace 300 as shown in FIG. 12) that is used to form source/drain regions on the semiconductor fins 204 at a following step. In this way, removal of the oxide layer 222 and the following formation of source/drain regions are in-situ performed. Herein, the term "in-situ" means that the source/drain regions are formed in the furnace 300 where the oxide layer 222 is removed, without breaking vacuum. Moreover, the furnace 300 offers an advantage of improved throughput, as several semiconductor wafers W2 may be processed substantially simultaneous, as discussed previously.

Figure 18A:
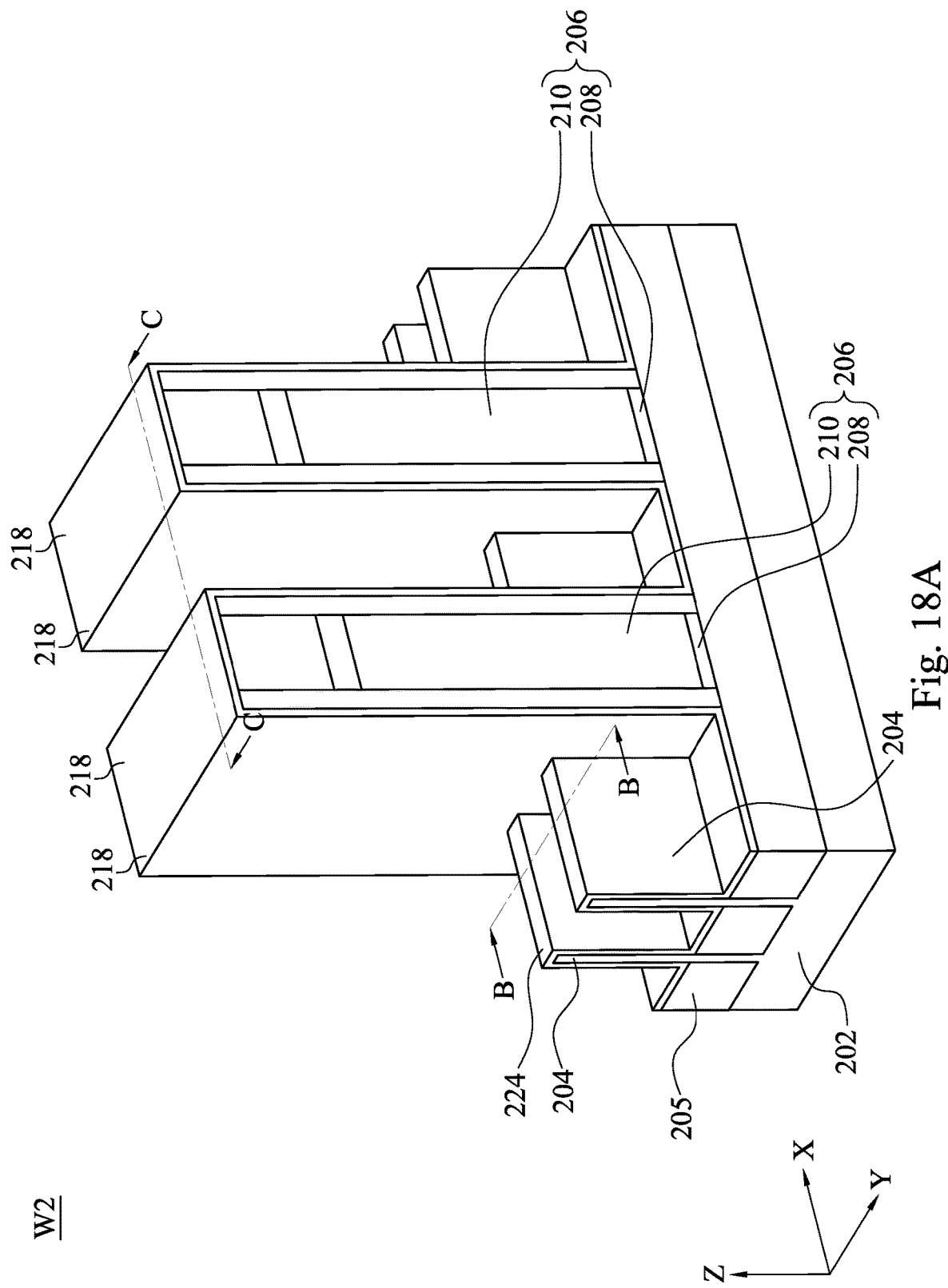
Figure 18B:
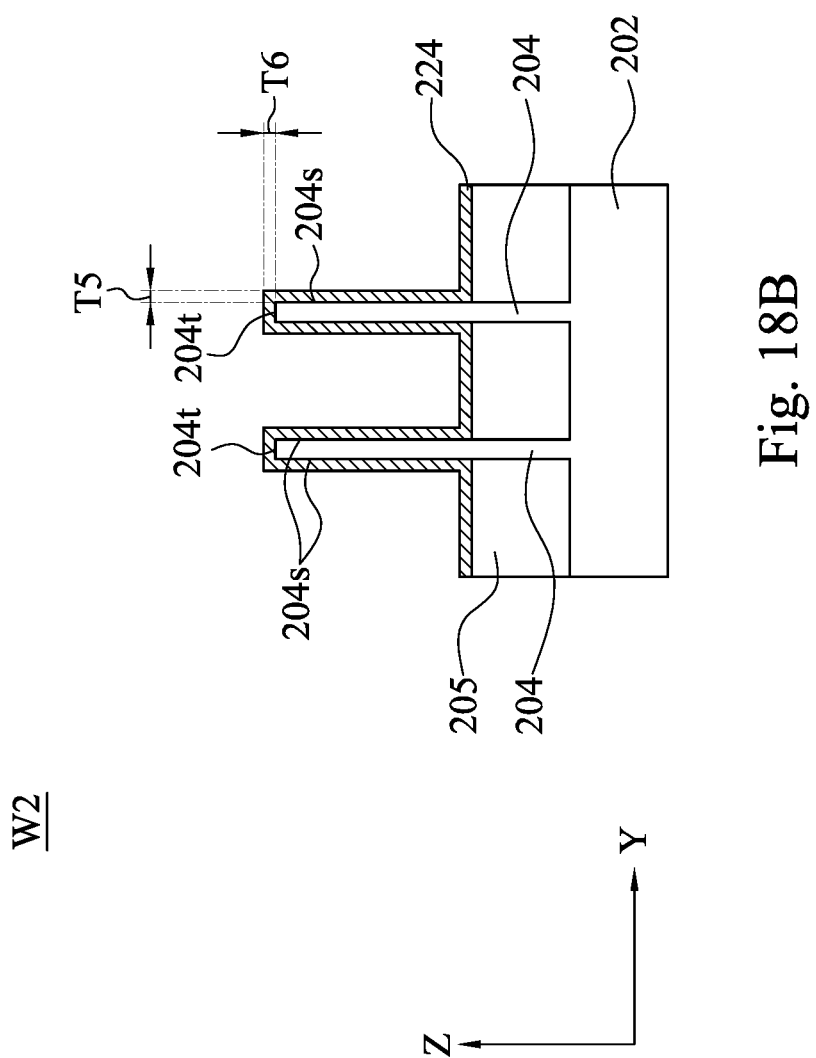
Figure 18C:
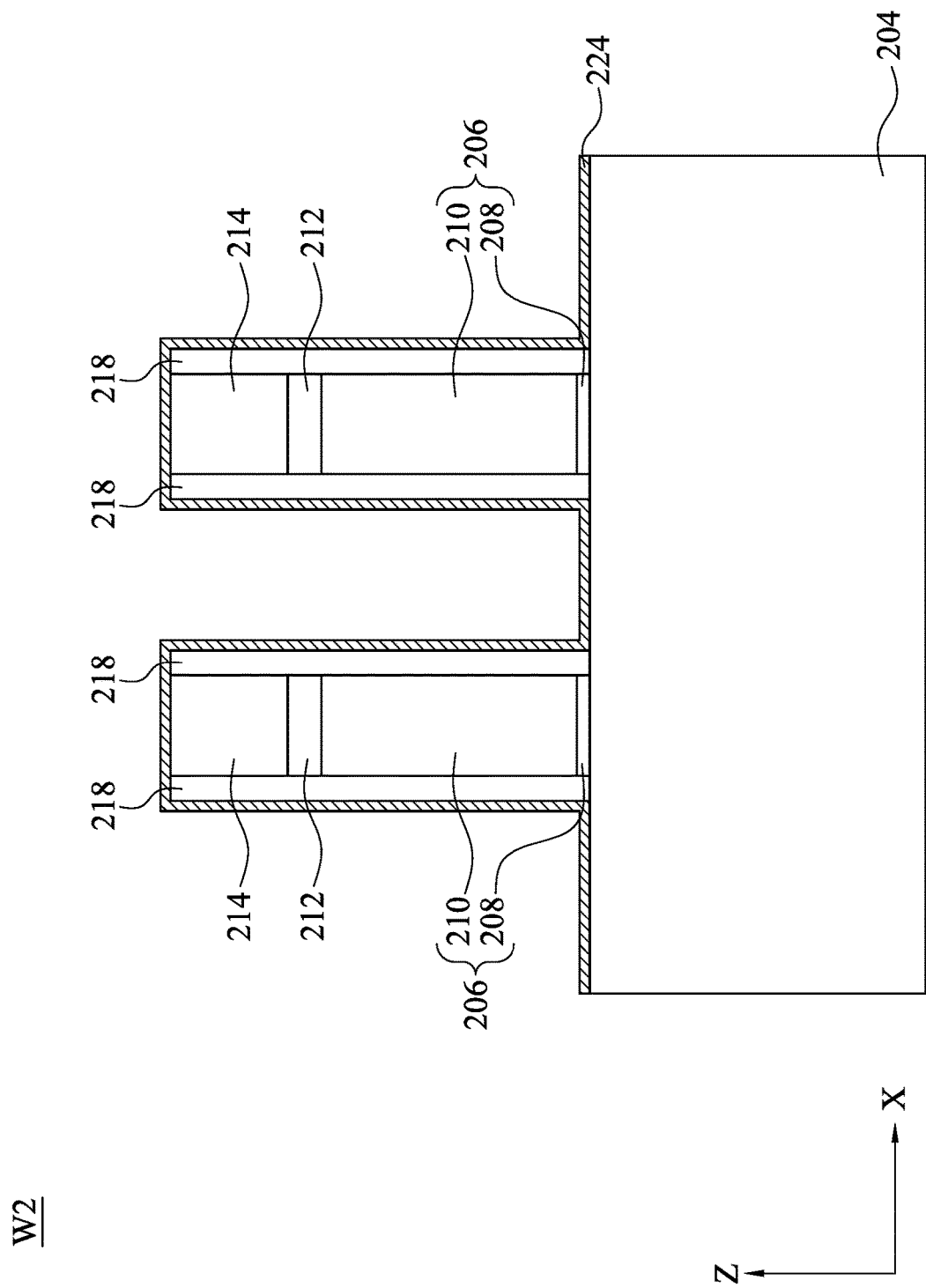

Afterwards, in operation S204 of FIG. 13, an amorphous silicon layer (also referred to as an amorphous silicon-containing layer in this context) 224 is formed as a blanket layer to conformally cover the structure shown in FIGS. 17A-17C. The resulting structure is shown in FIGS. 18A-18C. Formation of the a-Si layer includes, for example, CVD, atomic layer deposition (ALD), the like, or other suitable processes. Process conditions are controlled in such a way that amorphous silicon, rather than crystalline silicon, is formed on the exposed semiconductor fins 204. For example, the a-Si layer 224 is formed at a temperature lower than that of formation of the silicon layer 124, which is discussed previously with respect to FIGS. 7A-7C. Moreover, process conditions are controlled to result in a conformal a-Si layer 224, and hence a thickness T5 of vertical portions of the a-Si layer 224 on sidewalls 204s of the semiconductor fins 204 is close to a thickness T6 of horizontal portions of the a-Si layer 224 atop the semiconductor fins 204. For example, thicknesses T5 and T6 may have a difference smaller than about 20 percent of thickness T6.

In certain embodiments, the a-Si layer 224 may be formed by using a furnace (e.g., the furnace 300 as shown in FIG. 12) provided with a silicon-containing gas, such as $SiH_4$, $Si_2H_6$, $Si_3H_8$, the like, or combinations thereof. In some embodiments, the flow rate of the silicon-containing gas is in the range from about 1000 standard cubic centimeters per minute (sccm) to about 2000 sccm. A temperature for the formation of the a-Si layer 224 is in a rage from about 350 degrees Centigrade to about 600 degrees Centigrade, for example. A pressure range for the formation of the a-Si layer 224 is from about 400 mTorr to about 1 Torr, for example. The process conditions of the deposition process performed in the furnace may result in the conformal a-Si layer 224. Stated differently, if the process conditions are out of selected ranges, the resulting a-Si layer 224 might be not conformal to the semiconductor fins 204. In some embodiments where silicon-containing precursor gas is $SiH_4$, $SiH_4$ may be provided at a flow rate in a range afrom about 1000 sccm to about 2000 sccm and at a temperature in a range from about 500 degrees Centigrade to about 550 degrees Centigrade. In some embodiments where silicon-containing precursor gas is $Si_2H_6$, $Si_2H_6$, may be provided at a flow rate in a range of about 200 sccm to about 600 sccm and at a temperature in a range of about 380 degrees Centigrade to about 400 degrees Centigrade. If the process conditions are out of the above selected range, the a-Si layer 224 might be not conformal to the semiconductor fins 204.

The a-Si 224 is doped, such as in-situ doped. Herein, the term "in-situ" means that the precursor gases of the a-Si layer 224 and the dopant gases are introduced into the same process chamber (e.g., the furnace 300 as shown in FIG. 12), without breaking vacuum. The doping species may include p-type dopants, such as boron from boron-containing gas (e.g., $BF_3$, $B_2H_6$, $BCl_3$); n-type dopants, such as phosphorus from phosphorus-containing gas (e.g., $PH_3$, $PF_3$, $PF_5$); and/or other suitable dopants (e.g., $GeF_3$). Therefore, the resulting a-Si layer 224 may be phosphorus-doped amorphous silicon (a-SiP), boron-doped amorphous silicon (a-SiB), boron-doped amorphous silicon germanium (a-SiGeB), or the like.

Figure 19A:
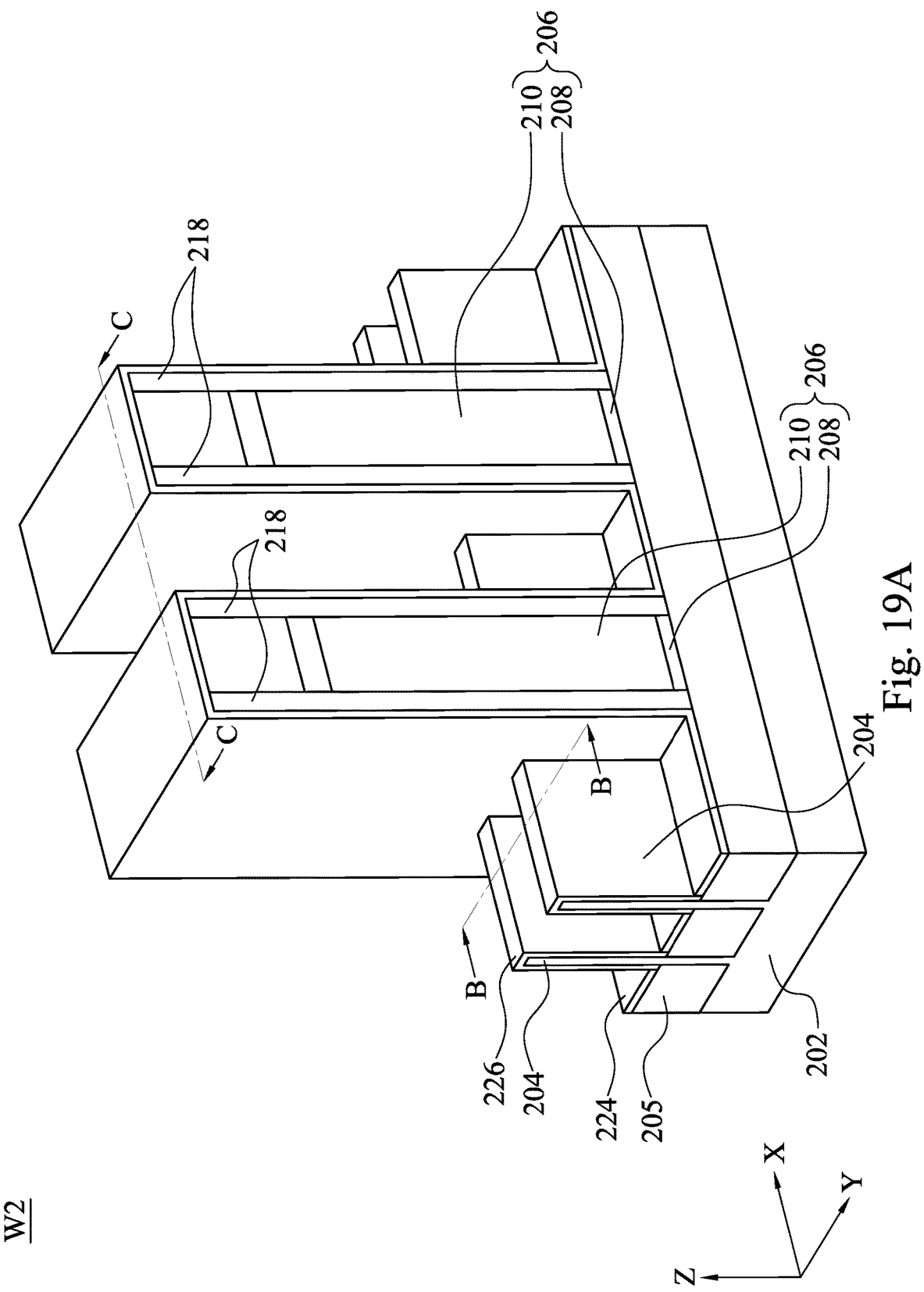
Figure 19B:
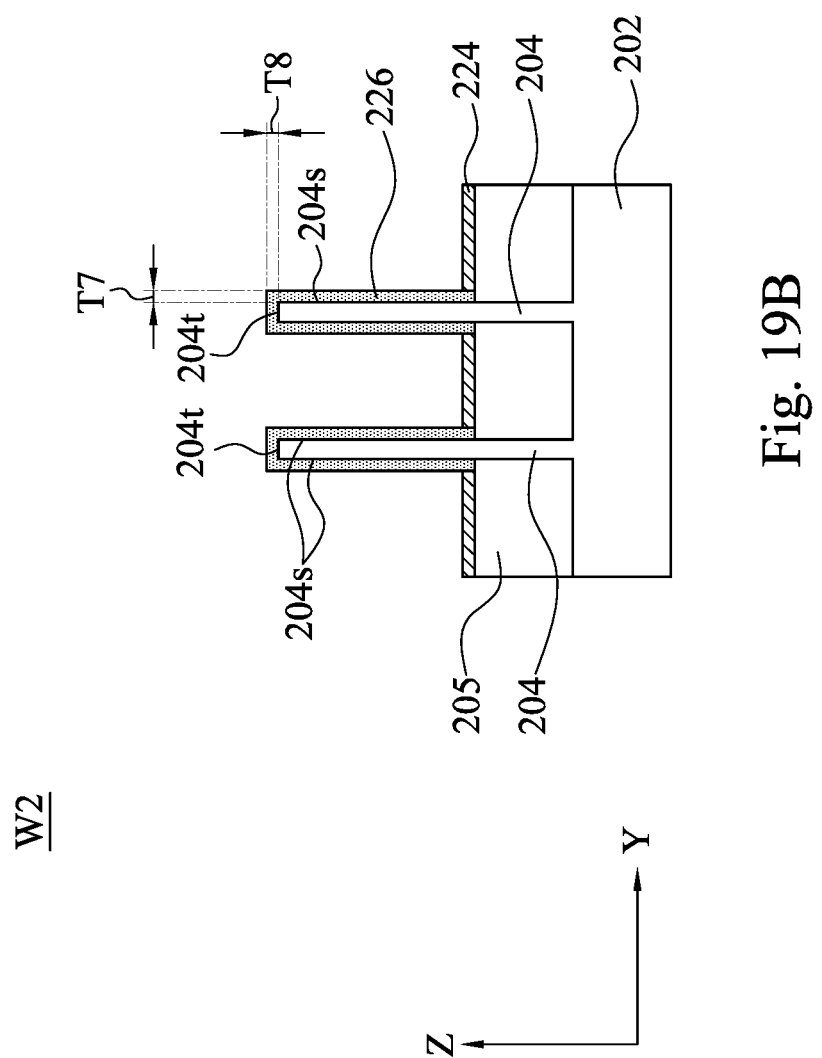
Figure 19C:
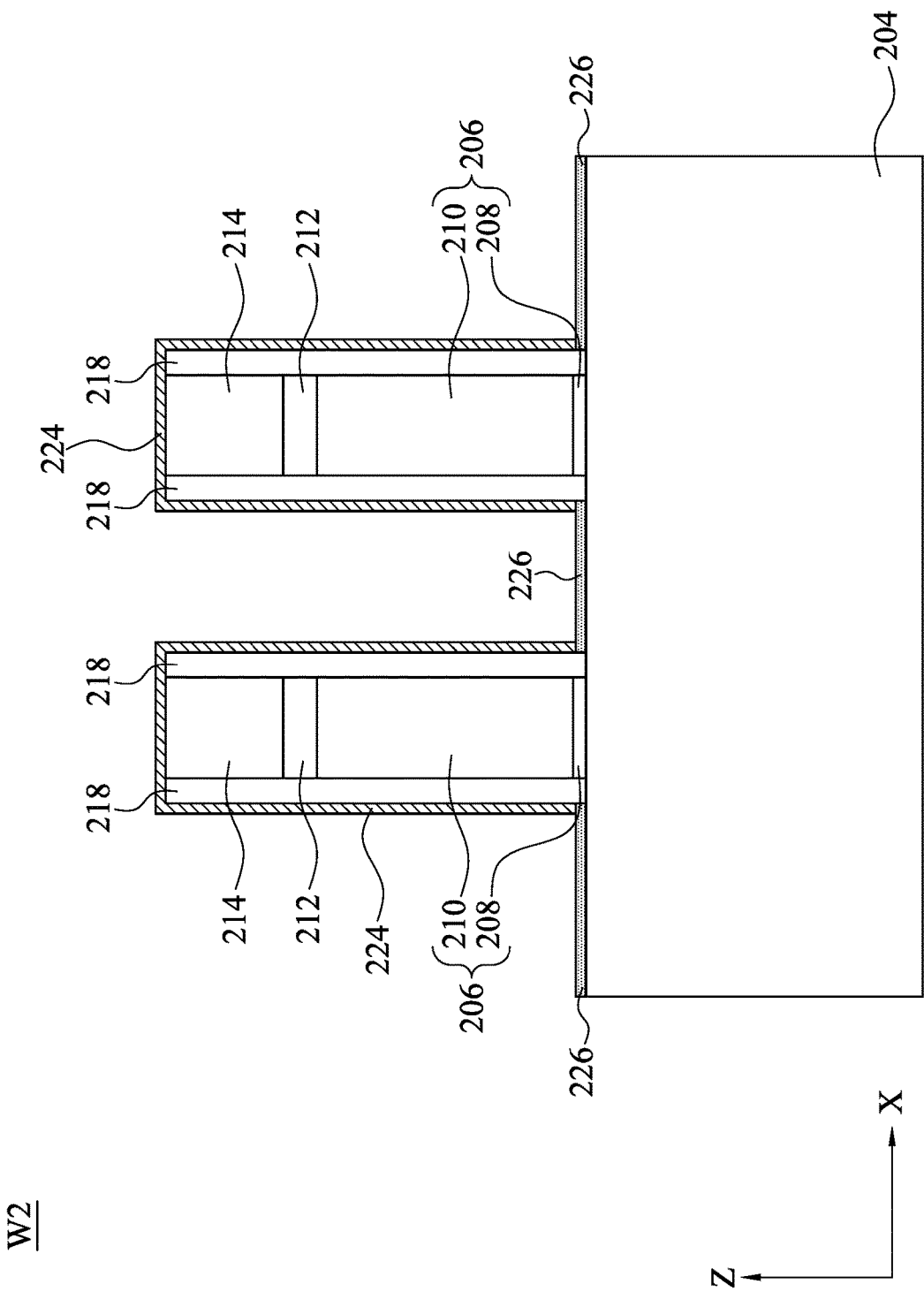

Thereafter, in operation S205, portions of the a-Si layer 224 in contact with the semiconductor fins 204 are crystallized into the c-Si layers 226, as illustrated in FIGS. 19A-19C. In some embodiments, crystallization of amorphous silicon is performed by an anneal process, such as a melting laser anneal (MLA) process. The MLA process can reach a temperature that is sufficiently high to melt the a-Si layer 224, so that the melted amorphous silicon on the semiconductor fins 204 will be crystallized into crystalline silicon. The laser power and anneal duration are controlled to achieve a silicon melting temperature of greater than about 1400 degrees Celsius in a desired region (e.g., in the a-Si layer 224 and not in the semiconductor fins 204). Stated differently, the laser power and the anneal duration are controlled such that the a-Si layer 224 is melted, while a major of semiconductor fins 204 remains unmelted. Melted portions of a-Si layer 224 then undergo liquid phase epitaxial regrowth to form c-Si layers 226, by using the semiconductor fins 204 (e.g., single crystalline silicon) as a seed layer. Other portions of the a-Si layer 224 in contact with amorphous materials (e.g. the isolation insulation layer 105, the gate spacers 218 and the second mask layer 214) are not crystallized and thus remain amorphous silicon.

In some embodiments where the a-Si layer 224 is doped with a p-type dopant, the c-Si layers 226 resulting from crystallization of the a-Si layer 224 include the p-type dopant, and can thus serve as source/drain layers or regions of a p-type FinFET. On the contrary, if the a-Si layer 224 is doped with an n-type dopant, the c-Si layers 226 resulting from crystallization of the a-Si layer 224 include the n-type dopant, and can thus serve as source/drain layers or regions of an n-type FinFET. Moreover, because the c-Si layers 226 is formed from crystallization of the a-Si layer 224 conformal to the semiconductor fins 204, the c-Si layers 226 are conformal to the respective semiconductor fins 204 as well. Therefore, the thickness T7 of vertical portions of the c-Si layers 226 on sidewalls 204s of the semiconductor fins 204 is close to the thickness T8 of horizontal portions of the c-Si layer 226 atop the semiconductor fins 204. For example, thicknesses T7 and T8 may have a difference smaller than about 20 percent of thickness T8.

If the source/drain regions are formed as diamond-like structures, the diamond-like structures would inevitably merge together when they are epitaxially grown on closely arranged semiconductor fins. Embodiments of the present disclosure, however, form source/drain regions conformal to semiconductor fins, rather than diamond-like structures. Therefore, unwanted merged source/drain regions can be prevented.

Figure 20A:
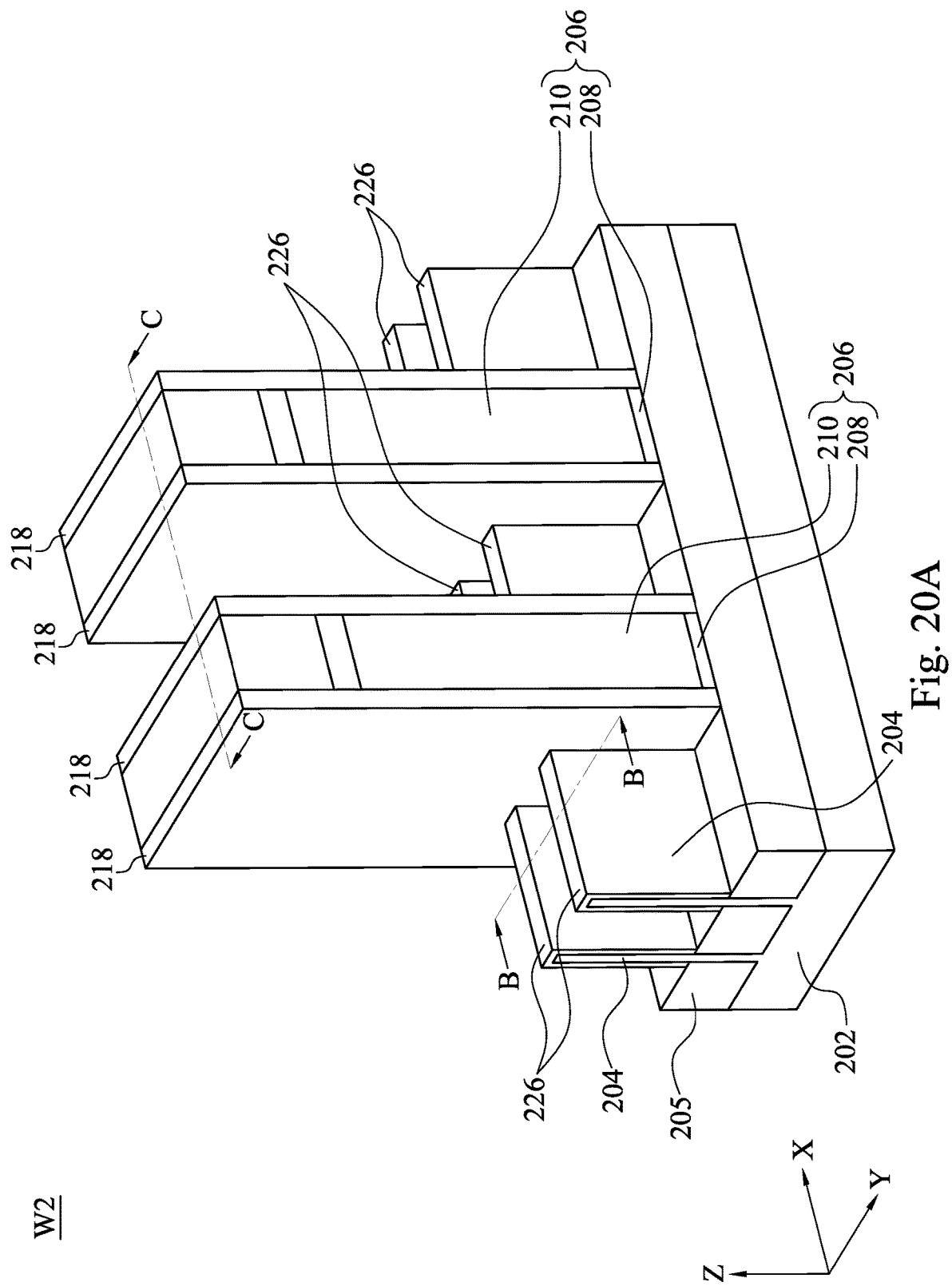
Figure 20B:
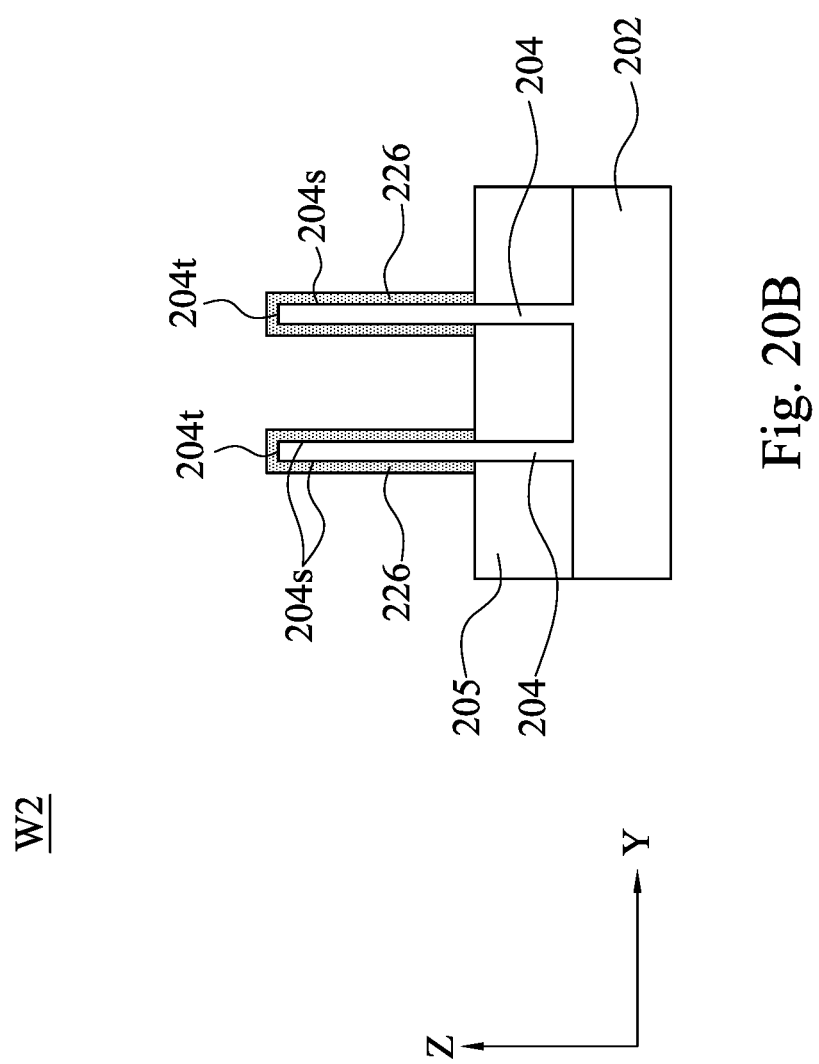
Figure 20C:
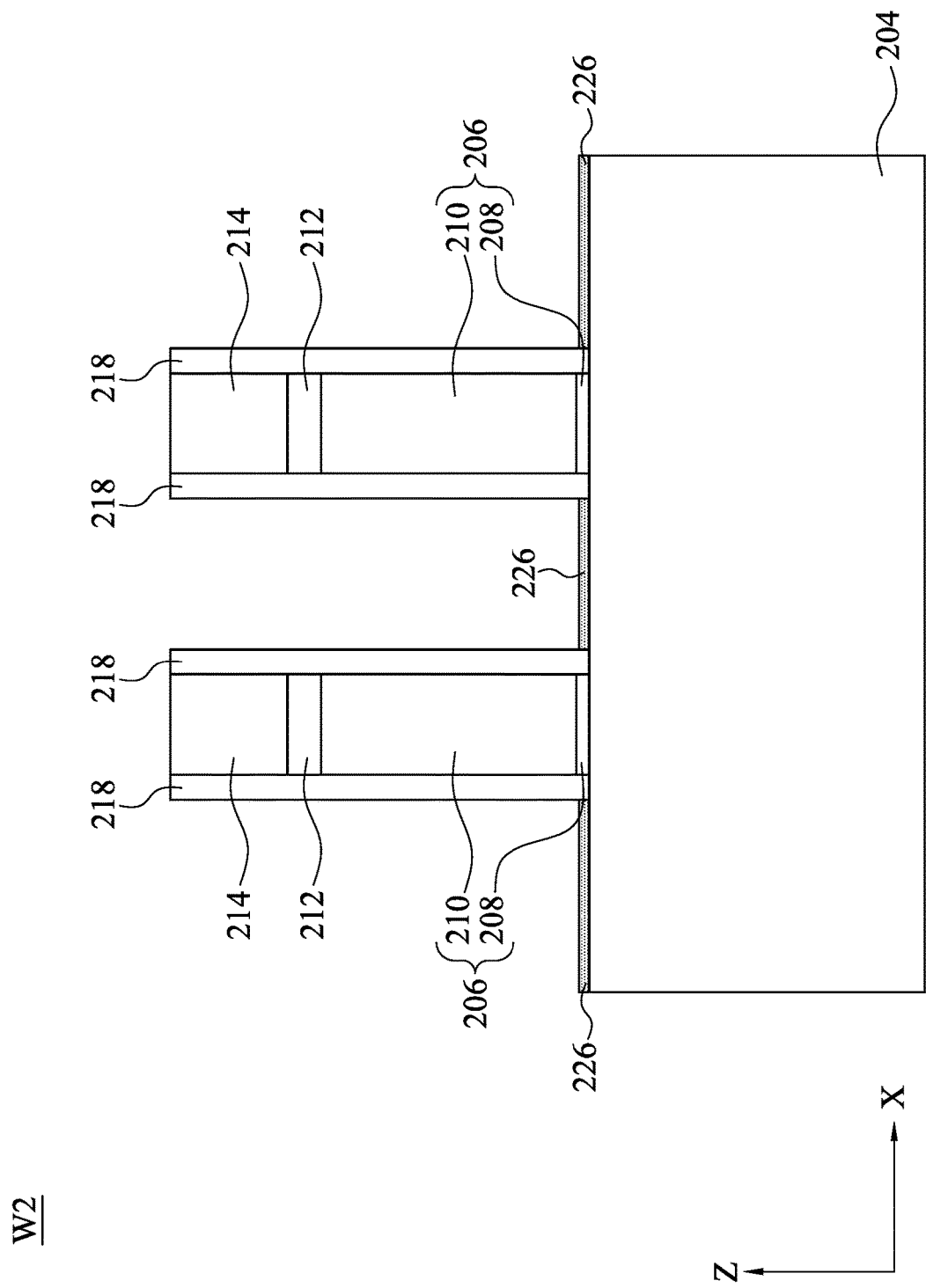

In operation S206, the a-Si layer 224 is removed, while remaining the c-Si layers 226 on the semiconductor fins 104. The resulting structure is illustrated in FIGS. 20A-20C. In some embodiments, removal of the a-Si layer 224 includes a selective etching process which etches amorphous silicon at a faster rate than it etches single crystalline silicon. Stated another way, the c-Si layers 226 have higher etch resistance to the etchant used in the etching process than that of the a-Si layer 224. In this way, the selective etching process can remove the a-Si layer 224, while remaining the c-Si layers 226 on the semiconductor fins 204. The selective etching process may be dry etching, wet etching, or combinations thereof.

Figure 21A:
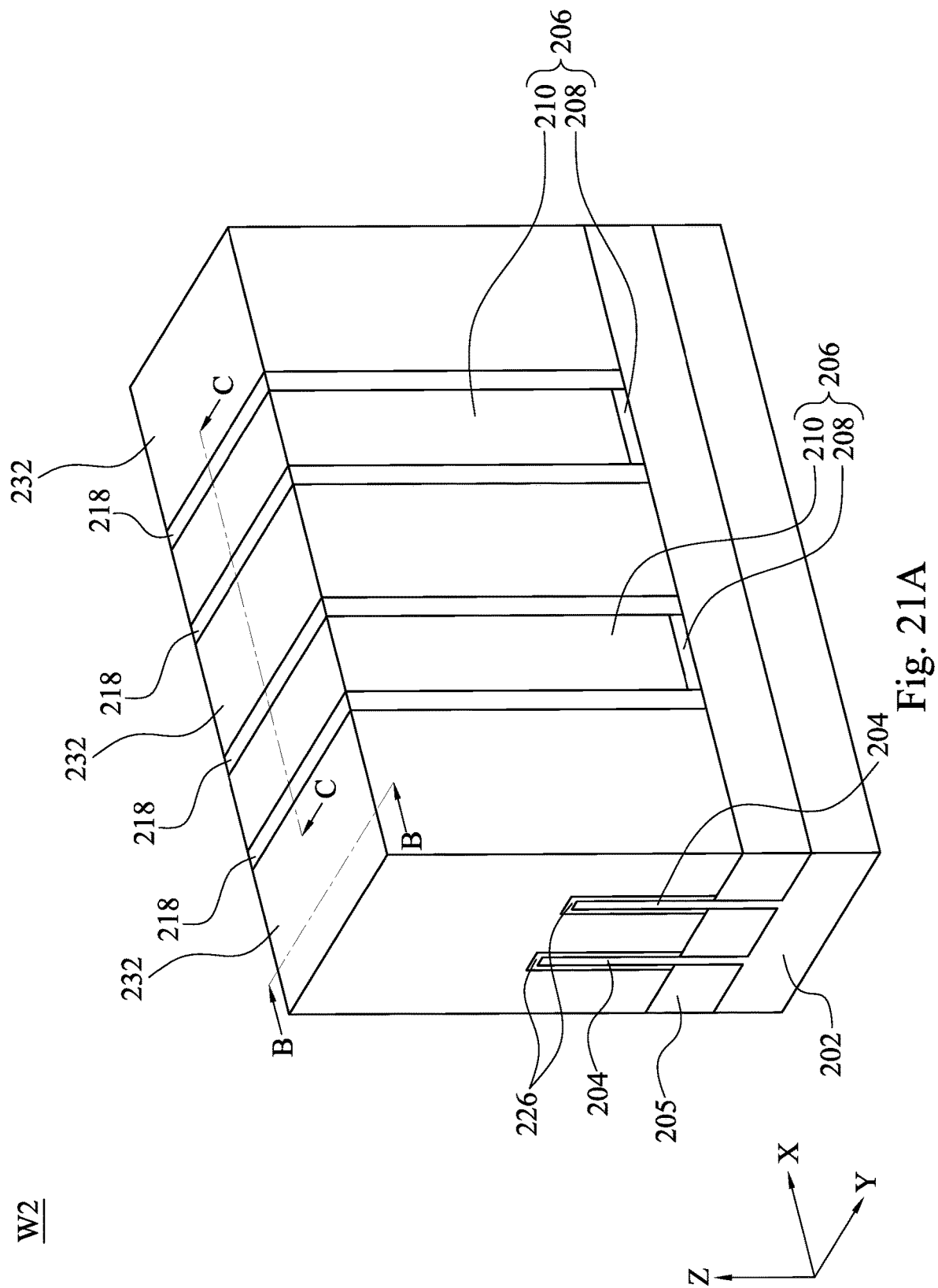
Figure 21B:
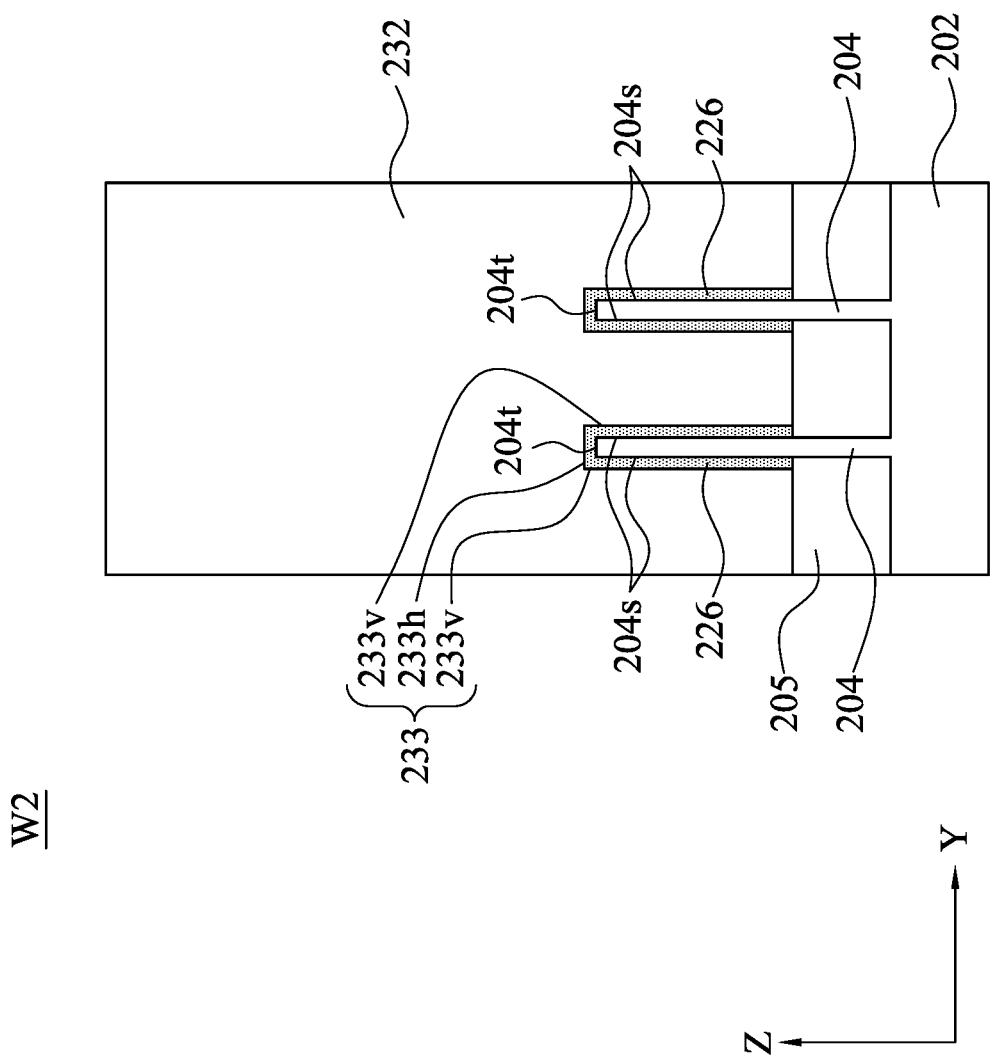
Figure 21C:
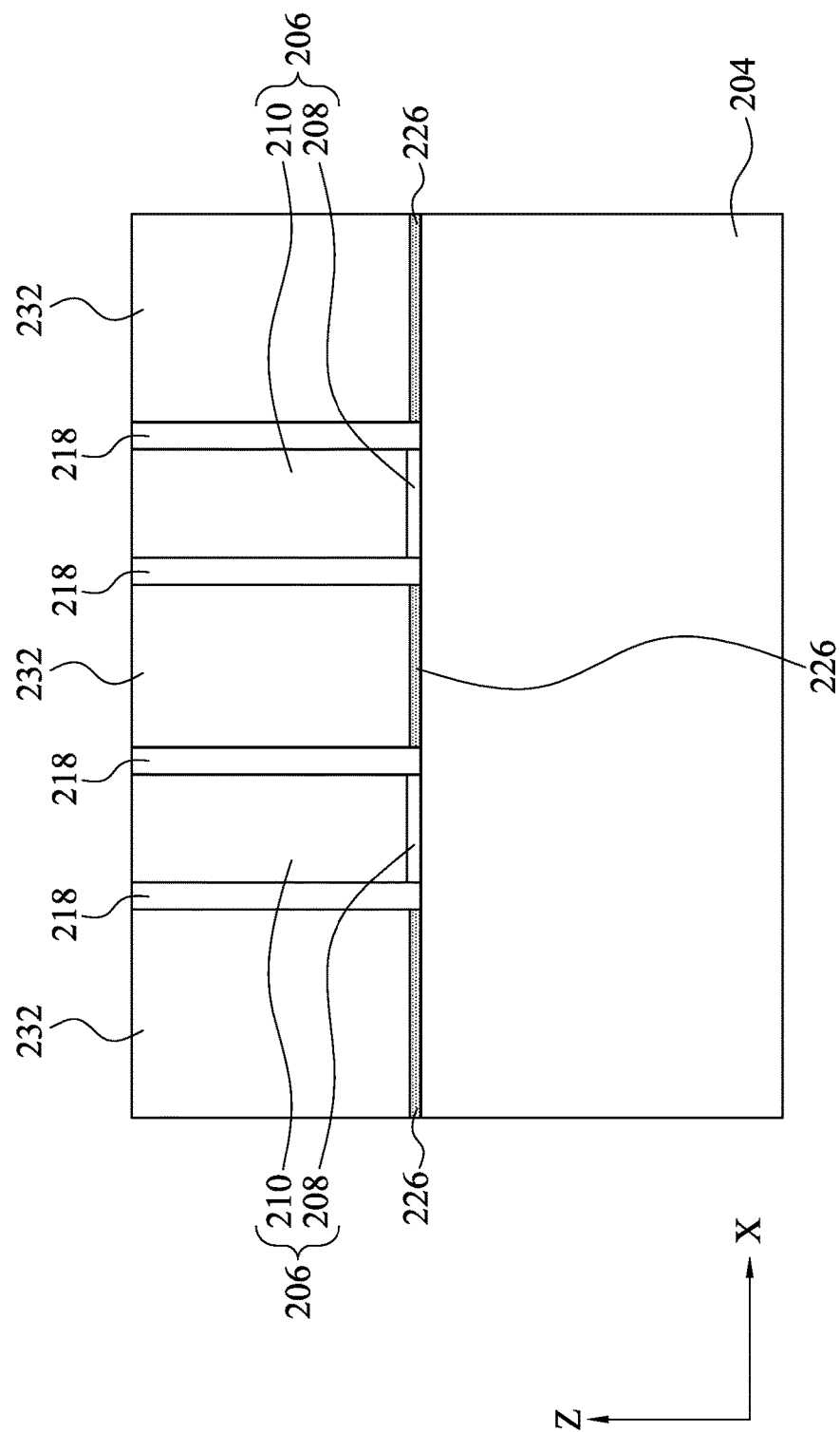

In operation S207, a dielectric layer 232 is formed over the c-Si layers 226, as illustrated in FIGS. 21A-21C. In some embodiments, the dielectric layer 232 is formed over the c-Si layers 226, the second mask layer 214, the gate spacers 218, followed by removing an excessive material of the dielectric layer 232 to expose the dummy gate structures 206 by using, for example, a CMP process. The CMP process may planarize a top surface of the dielectric layer 232 with top surfaces of the dummy gate structures 206 and gate spacers 218. The dielectric layer 232 is substantially the same as the dielectric layer 132, as discussed previously with respect to FIGS. 10A-10C. For example, the dielectric layer 232 includes a contact etch stop layer (CESL) and an interlayer dielectric (ILD) over the CESL, wherein the ILD has a different etch selectivity than the CESL.

As illustrated in FIG. 21B, the dielectric layer 232 and the c-Si layer 226 form an interface 233 conformal to the semiconductor fin 204, because the c-Si layer 226 is a conformal layer having a substantially uniform thickness. Stated differently, an outer profile of the c-Si layer 226 is substantially the same as an inner profile of the c-Si layer 226. Specifically, the interface 233 between the dielectric layer 232 and the c-Si layer 226 has substantially vertical portions 233v and a substantially horizontal portion 233h connecting the substantially vertical portions 233v. The substantially horizontal portion 233h is in parallel with the top surface 204t of the semiconductor fin 204, and the substantially vertical portions 233v are in parallel with the sidewalls 204s of the semiconductor fin 204. As a result, the interface 233 between the dielectric layer 232 and the c-Si layer 226 substantially conforms to a profile of a combination of the top surface 204t and the sidewalls 204s of the semiconductor fin 204.

Figure 22A:
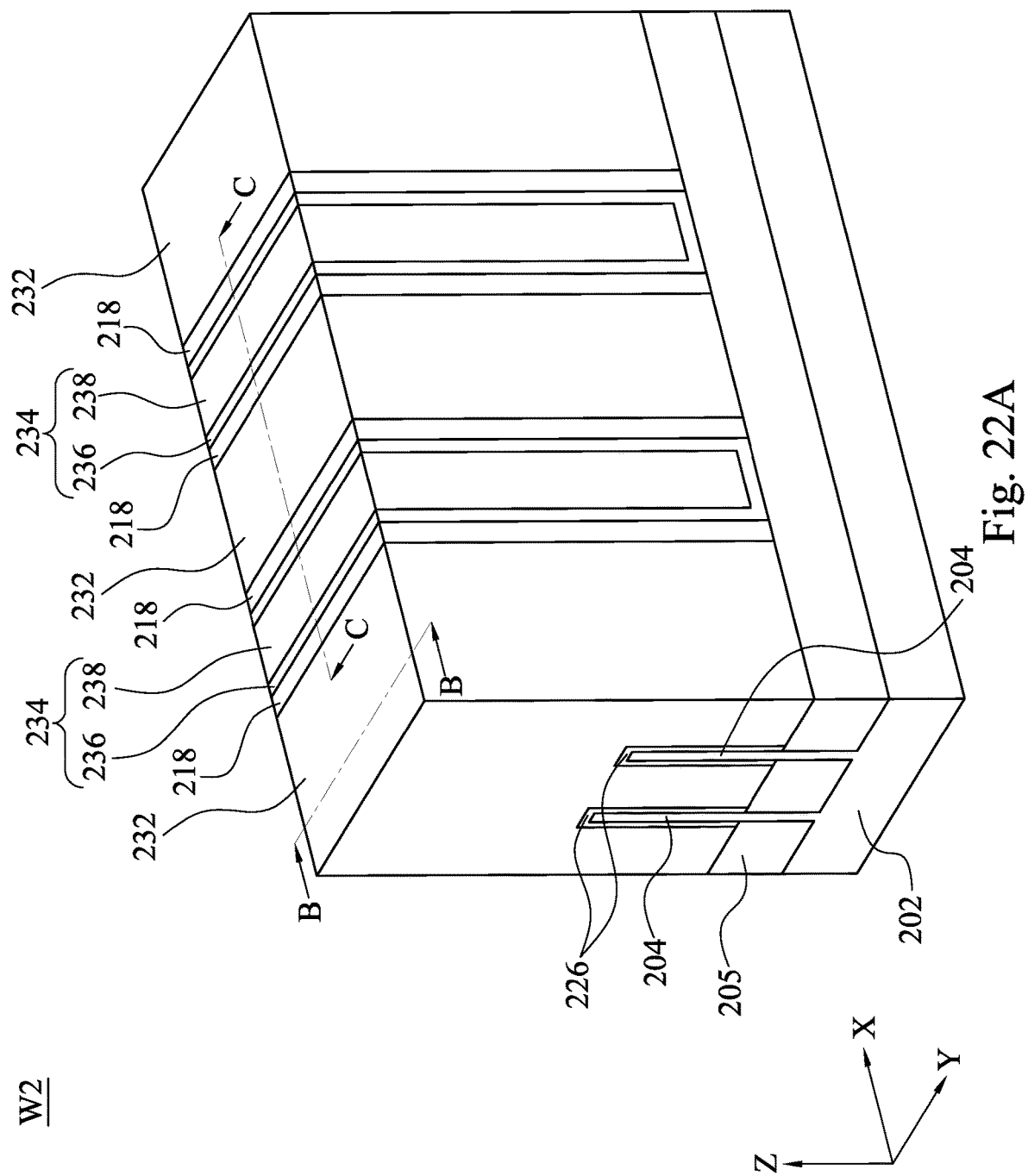
Figure 22B:
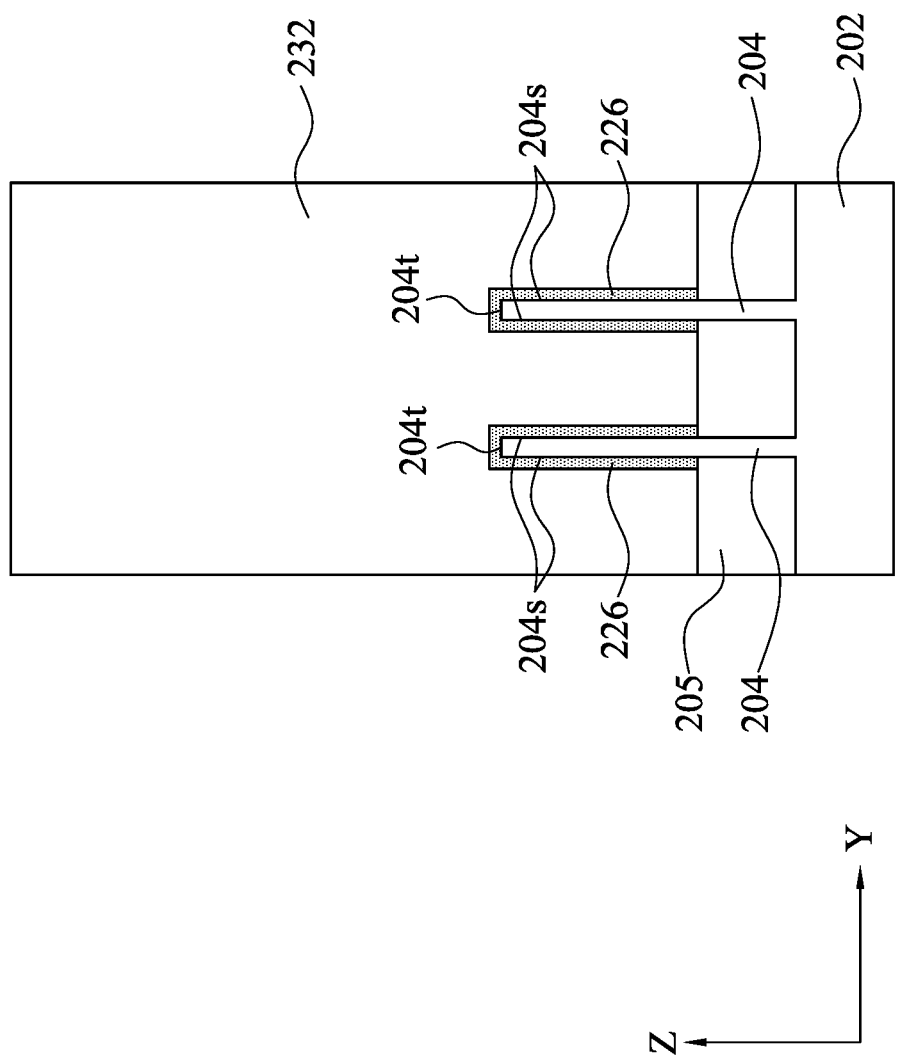

In operation S208, the dummy gate structures 208 are removed and replaced with replacement gate structures 234, as illustrated in FIGS. 22A-22C. The replacement gate structures 234 are substantially the same as the replacement gate structures 134, and can be formed using the method of forming the replacement gate structures 134, as discussed previously with respect to FIGS. 11A-11C. For example, the resulting replacement gate structures 234 each include a gate dielectric layer 236 and a metal structure 238 substantially the same as the gate dielectric layer 136 and the metal structure 138, respectively, which are discussed previously with respect to FIGS. 11A-11C.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that unwanted merged source/drain regions can be prevented because of improved conformity of the source/drain regions. Another advantage is that increased throughput and hence reduced fabrication cost can be provided, because multiple wafers can be substantially simultaneously processed in the same furnace to form source/drain regions. Yet another advantage is that increased source/drain area and hence improved device performance (e.g., reduced source/drain contact resistance) can be achieved, because the cleaned fin surfaces resulting from the COR process are substantially entirely covered by the doped c-Si layers. Still another advantage is that dopant concentration of the c-Si layers resulting from crystallization of the a-Si layer can be improved. Still another advantage is that the metal gate structures are fabricated after the furnace process, so that threshold voltage of the FinFET will not be degraded by the furnace process.

In some embodiments, a method includes following steps. A dummy gate structure is formed across a first portion of a semiconductor fin. A doped semiconductor layer is formed across a second portion of the semiconductor fin. A dielectric layer is formed across the doped semiconductor layer. An interface between the dielectric layer and the doped semiconductor layer substantially conforms to a profile of a combination of a top surface and sidewalls of the semiconductor fin. The dummy gate structure is replaced with a metal gate structure.

In some embodiments, a method includes following steps. A semiconductor fin is formed over a substrate. A dummy gate structure is formed across the semiconductor fin. A silicon layer is formed over the substrate. The silicon layer includes a crystalline silicon portion across the semiconductor fin and an amorphous silicon portion across the dummy gate structure. The amorphous silicon portion is removed from the dummy gate structure. The dummy gate structure is replaced with a metal gate structure.

In some embodiments, a semiconductor device includes a substrate, a semiconductor fin, a gate structure, a doped silicon layer and a dielectric layer. The semiconductor fin is over the substrate. The gate structure is across a first portion of the semiconductor fin. The doped silicon layer is across a second portion of the semiconductor fin. An outer profile of the doped silicon layer is substantially the same as an inner profile of the doped silicon layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dummy gate structure across a first portion of a semiconductor fin;
   forming a fin spacer on a sidewall of the semiconductor fin;
   after forming the fin spacer, forming a doped semiconductor layer across a second portion of the semiconductor fin, such that a bottom end of the doped semiconductor layer is in contact with a top end of the fin spacer;
   forming a dielectric layer across the doped semiconductor layer, wherein an interface between the dielectric layer and the doped semiconductor layer substantially conforms to a profile of a combination of a top surface and sidewalls of the semiconductor fin; and
   replacing the dummy gate structure with a metal gate structure.

2. The method of claim 1, wherein forming the doped semiconductor layer comprises:
   forming a silicon-containing layer having a crystalline portion in contact with the semiconductor fin and an amorphous portion separated from the semiconductor fin; and
   removing the amorphous portion of the silicon-containing layer.

3. The method of claim 2, wherein removing the amorphous portion of the silicon-containing layer comprises:
   crystallizing the amorphous portion into a polycrystalline layer; and
   removing the polycrystalline layer, wherein the crystalline portion of the silicon-containing layer remains in contact with the semiconductor fin after removing the polycrystalline layer.

4. The method of claim 2, wherein forming the doped semiconductor layer further comprises:
   doping the silicon-containing layer with an n-type dopant or a p-type dopant prior to removing the amorphous portion of the silicon-containing layer.

5. The method of claim 2, wherein forming the silicon-containing layer is performed in a furnace.

6. The method of claim 2, wherein forming the fin spacer comprises depositing a spacer layer over the second portion of the semiconductor fin, and etching the spacer layer to expose an upper part of the second portion of the semiconductor fin such that an oxide layer is formed on the exposed upper part of the second portion of the semiconductor fin, and the method further comprises:
   removing the oxide layer from the semiconductor fin prior to forming the silicon-containing layer.

7. The method of claim 6, wherein forming the silicon-containing layer and removing the oxide layer are performed in the same process chamber.

8. The method of claim 1, wherein forming the doped semiconductor layer comprises:
forming an amorphous silicon-containing layer to wrap the semiconductor fin; and
crystallizing the amorphous silicon-containing layer.

9. The method of claim 8, wherein crystallizing the amorphous silicon-containing layer is performed such that a first portion of the amorphous silicon-containing layer in contact with the semiconductor fin is crystallized, and a second portion of the amorphous silicon-containing layer separated from the semiconductor fin remains amorphous after crystallizing the first portion of the amorphous silicon-containing layer.

10. The method of claim 9, further comprising:
removing the second portion of the amorphous silicon-containing layer after crystallizing the first portion of the amorphous silicon-containing layer.

11. The method of claim 8, wherein forming the fin spacer comprises depositing a spacer layer over the second portion of the semiconductor fin, and etching the spacer layer to expose an upper part of the second portion of the semiconductor fin such that an oxide layer is formed on the upper part of the second portion of the semiconductor fin, and the method further comprises:
removing the oxide layer from the semiconductor fin prior to forming the amorphous silicon-containing layer.

12. The method of claim 11, wherein forming the amorphous silicon-containing layer and removing the oxide layer are performed in the same process chamber.

13. A method, comprising:
forming a semiconductor fin over a substrate;
forming a dummy gate structure across the semiconductor fin;
forming a silicon-containing layer over the substrate, wherein the silicon-containing layer comprises a crystalline portion across the semiconductor fin and an amorphous portion across the dummy gate structure;
removing the amorphous portion from the dummy gate structure; and
replacing the dummy gate structure with a metal gate structure.

14. The method of claim 13, further comprising:
forming a spacer layer over the dummy gate structure and the semiconductor fin prior to forming the silicon-containing layer;
etching the spacer layer to form a fin spacer on a lower portion of the semiconductor fin, while leaving an upper portion of the semiconductor fin exposed, such that an oxide layer is formed on the exposed upper portion of the semiconductor fin; and
removing the oxide layer from the semiconductor fin prior to forming the silicon-containing layer, wherein removing the oxide layer and forming the silicon-containing layer are performed in the same furnace.

15. The method of claim 13, wherein removing the amorphous portion comprises:
annealing the amorphous portion to form a polycrystalline layer; and
removing the polycrystalline layer.

16. The method of claim 13, wherein forming the silicon-containing layer comprises:
forming an amorphous silicon-containing layer across the semiconductor fin and the dummy gate structure; and
performing a melting laser anneal process to the amorphous silicon-containing layer.

17. A semiconductor device, comprising:
a substrate;
a semiconductor fin over the substrate;
a gate structure across a first portion of the semiconductor fin;
a doped silicon-containing layer across a second portion of the semiconductor fin, wherein an outer profile of the doped silicon-containing layer is substantially the same as an inner profile of the doped silicon-containing layer; and
a fin spacer alongside the semiconductor fin and under the doped silicon-containing layer, wherein a bottommost position of the fin spacer is lower than a bottommost position of the doped silicon-containing layer.

18. The semiconductor device of claim 17, wherein the doped silicon-containing layer is in contact with the semiconductor fin.

19. The semiconductor device of claim 17, wherein the fin spacer and the doped silicon-containing layer form an interface angled with respect to a sidewall of the semiconductor fin.

20. The semiconductor device of claim 17, wherein the doped silicon-containing layer has a tapered bottom end on a sidewall of the semiconductor fin.

* * * * *